United States Patent
Ueno et al.

(10) Patent No.: US 11,165,219 B2
(45) Date of Patent: Nov. 2, 2021

(54) SWEPT LIGHT SOURCE AND DRIVE DATA GENERATION METHOD AND OPTICAL DEFLECTOR FOR SWEPT LIGHT SOURCE

(71) Applicant: Nippon Telegraph and Telephone Corporation, Tokyo (JP)

(72) Inventors: Masahiro Ueno, Atsugi (JP); Meishin Chin, Atsugi (JP); Shoko Tatsumi, Atsugi (JP); Takashi Sakamoto, Atsugi (JP); Yuzo Sasaki, Atsugi (JP); Seiji Toyoda, Atsugi (JP); Yuichi Akage, Isehara (JP); Joji Yamaguchi, Atsugi (JP); Tadashi Sakamoto, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 100 days.

(21) Appl. No.: 16/466,608

(22) PCT Filed: Dec. 4, 2017

(86) PCT No.: PCT/JP2017/043446
§ 371 (c)(1),
(2) Date: Jun. 4, 2019

(87) PCT Pub. No.: WO2018/105549
PCT Pub. Date: Jun. 14, 2018

(65) Prior Publication Data
US 2020/0076154 A1 Mar. 5, 2020

(30) Foreign Application Priority Data
Dec. 9, 2016 (JP) .............................. JP2016-239354

(51) Int. Cl.
*H01S 3/131* (2006.01)
*H01S 3/08* (2006.01)
(Continued)

(52) U.S. Cl.
CPC .......... *H01S 3/131* (2013.01); *H01S 3/08009* (2013.01); *H01S 3/107* (2013.01);
(Continued)

(58) Field of Classification Search
CPC .. H01S 3/131; H01S 3/10069; H01S 3/08009; H01S 3/10007; H01S 3/107; H01S 3/136
See application file for complete search history.

(56) References Cited

U.S. PATENT DOCUMENTS

| 4,625,105 A | 11/1986 | Hentschel et al. |
| 2006/0193354 A1* | 8/2006 | Rosenblatt ............ H01S 3/1062 372/29.023 |

(Continued)

FOREIGN PATENT DOCUMENTS

| JP | S59-207756 A | 11/1984 |
| JP | 2003-23198 A | 1/2003 |

(Continued)

OTHER PUBLICATIONS

Yoshisada Hayamizu, *Optical Equipment Basic Design*, NTTH295139, Feb. 16, 2018.

(Continued)

*Primary Examiner* — Yuanda Zhang
(74) *Attorney, Agent, or Firm* — Workman Nydegger

(57) ABSTRACT

A swept light source of the present invention keeps a coherence length of an output beam long over an entire sweep wavelength range. A gain of a gain medium is changed with time in response to a wavelength sweep and the coherence length is kept maximum. The gain of the gain medium is kept close to a lasing threshold and an unsaturated gain range of the gain medium is narrowed over the entire sweep wavelength range. An SOA current waveform data acquiring method of driving while keeping the coherence length long, a novel coherence length measuring (Continued)

method, and an optical deflector suitable for the swept light source are also disclosed.

4 Claims, 33 Drawing Sheets

(51) Int. Cl.
    *H01S 3/136*     (2006.01)
    *H01S 3/107*     (2006.01)
    *H01S 5/06*     (2006.01)
    *H01S 3/10*     (2006.01)

(52) U.S. Cl.
    CPC ...... *H01S 3/10007* (2013.01); *H01S 3/10069* (2013.01); *H01S 3/136* (2013.01); *H01S 5/0617* (2013.01)

(56) References Cited

U.S. PATENT DOCUMENTS

| | | | |
|---|---|---|---|
| 2006/0203859 A1 | 9/2006 | Cable et al. | |
| 2008/0037608 A1 | 2/2008 | Zhou et al. | |
| 2011/0032957 A1 | 2/2011 | Cable et al. | |
| 2013/0286454 A1* | 10/2013 | Toyoda | H01S 3/107 |
| | | | 359/199.1 |
| 2014/0031678 A1 | 1/2014 | Yamada | |
| 2014/0185054 A1 | 7/2014 | Atia et al. | |
| 2015/0131105 A1 | 5/2015 | Kim et al. | |
| 2015/0373431 A1 | 12/2015 | Ota | |
| 2016/0029886 A1 | 2/2016 | Shiba et al. | |
| 2016/0124221 A1 | 5/2016 | Huang et al. | |

FOREIGN PATENT DOCUMENTS

| | | |
|---|---|---|
| JP | 2004-188828 A | 7/2004 |
| JP | 2005-347668 A | 12/2005 |
| JP | 2007-109923 A | 4/2007 |
| JP | 2007-115900 A | 5/2007 |
| JP | 2008-102191 A | 5/2008 |
| JP | 2008-529068 A | 7/2008 |
| JP | 2009-198593 A | 9/2009 |
| JP | 2010-62426 A | 3/2010 |
| JP | 2010-175271 A | 8/2010 |
| JP | 2011-186218 A | 9/2011 |
| JP | 2012-150409 A | 8/2012 |
| JP | 2012-151419 A | 8/2012 |
| JP | 2014-42010 A | 3/2014 |
| JP | 2014-126599 A | 7/2014 |
| JP | 2014-236795 A | 12/2014 |
| JP | 2015-031929 A | 2/2015 |
| JP | 2015-142111 A | 8/2015 |
| JP | 2016-32608 A | 3/2016 |

OTHER PUBLICATIONS

Japanese Office Action dated Jun. 30, 2020, issued in Japanese Application No. JP 2017-130502.
Extended European Search Report dated Jul. 10, 2020, issued in European Application No. EP 17878420.3.
International Search Report dated Mar. 6, 2018, issued in PCT Application No. PCT/JP2017/043446, filed Dec. 4, 2017.
International Preliminary Reporton Patentability dated Jun. 20, 2019, issued in PCT Application No. PCT/JP2017/043446, filed Dec. 4, 2017.
Yoshiaki Yasuno et al., *Three-Dimensional and High-Speed Swept-Source Optical Coherence Tomography for In Vivo Investigation of Human Anterior Eye Segments*, Optics Express, vol. 13, No. 26, pp. 10652-10664, 2005.

* cited by examiner

| CURRENT [mA] | $k(0\cdot\delta t)$ $\pm\Delta k/2$ | $k(1\cdot\delta t)$ $\pm\Delta k/2$ | $k(2\cdot\delta t)$ $\pm\Delta k/2$ | $k(3\cdot\delta t)$ $\pm\Delta k/2$ | $k(4\cdot\delta t)$ $\pm\Delta k/2$ | $k(5\cdot\delta t)$ $\pm\Delta k/2$ | $k(6\cdot\delta t)$ $\pm\Delta k/2$ | $k(7\cdot\delta t)$ $\pm\Delta k/2$ |
|---|---|---|---|---|---|---|---|---|
| 100 | 9.32 | 8.24 | 8.57 | 8.93 | 8.90 | 9.56 | 10.71 | 10.65 |
| 90 | 10.06 | 8.62 | 8.62 | 8.75 | 9.21 | 9.66 | 10.95 | 11.29 |
| 80 | 10.02 | 9.03 | 9.31 | 9.26 | 9.49 | 9.86 | 10.63 | 11.86 |
| 70 | 10.66 | 9.56 | 9.74 | 9.49 | 9.72 | 9.67 | 10.43 | 12.12 |
| 60 | 11.11 | 9.93 | 10.32 | 10.51 | 10.54 | 10.95 | 10.90 | 11.70 |
| 50 |  | 10.23 | 9.94 | 9.96 | 10.71 | 11.02 | 12.08 | 11.58 |
| 40 |  |  | 10.98 | 10.09 | 10.55 | 11.24 | 12.75 | 14.05 |
| 30 |  |  |  |  | 12.96 | 11.17 | 12.74 |  |

WAVENUMBER $\delta t$ : SAMPLING INTERVAL (ONE SWEEP TIME τ / SAMPLING NUMBER n)
$k(t)$ : WAVENUMBER OF BEAM AT TIME t
$\Delta k$ : WAVENUMBER RANGE OF LIGHT SOURCE IN PSF MEASUREMENT

FIG.5

| FIG.15A |
| FIG.15B |

SWEPT LIGHT SOURCE AND DRIVE DATA GENERATION METHOD AND OPTICAL DEFLECTOR FOR SWEPT LIGHT SOURCE

TECHNICAL FIELD

The present invention relates to a swept light source, and more specifically, a swept light source usable in an optical coherence tomography device.

BACKGROUND ART

A swept light source is widely used for optical devices and electronic devices utilizing an optical imaging technique. For example, it is most frequently used for electronic devices for consumers such as cameras, printers, and facsimiles. Its use is also spreading to the medical field. For noninvasive imaging of sections in the body, attention has been focused on optical coherence tomography (OCT), which enables acquisition of information in the depth direction with high resolution by using low-coherence light. Recently, OCT is used also in the field of molecular imaging for interpreting biological phenomena at the molecular level and cell level in the body. The swept light source is an important and basic element for supporting the OCT technique as will be described later and has a great influence over the performance of an OCT device.

The molecular imaging described above mainly uses a method of using optical information to detect target molecules with high sensitivity, in which the OCT device is used. The types of OCT devices for acquiring section images by using coherent interference include time domain optical coherence tomography (TD-OCT) and Fourier domain optical coherence tomography (FD-OCT). FD-OCT is further classified into spectral domain optical coherence tomography (SD-OCT) and swept-source optical coherence tomography (SS-OCT). SS-OCT using the swept light source is particularly excellent in terms of high-speed responsivity.

Since the speed of response of SS-OCT is largely limited according to the performance of a light source, various types of high-speed and wide-range light sources are increasingly developed. In addition, in terms of an aspect of a sweep, an operation according to an application field is required for the swept light source like a wavenumber-linear light source in which a swept wavenumber linearly varies with time.

PTL 1 discloses a configuration example of a swept light source using an optical fiber loop. With reference to FIG. 1 of PTL 1, the swept light source comprises a gain medium (12) and a circulator (13) in an optical fiber loop (11). A beam is extracted from the circulator (13) to a space through a collimating lens (22), and the beam reaches a mirror (25) through a band pass filter (24). A reflected beam from the mirror is incident on the collimating lens again through the band pass filter (24), thereby forming a round-trip optical path of a resonator. As the band pass filter (24), for example, an optical coherence dielectric multilayer filter can be used. A transmission wavelength can be changed by changing an angle of incidence of a beam on the filter. A light source capable of sweeping a wavelength at high speed can be implemented by changing an angle of the band pass filter with respect to the optical axis at high speed by means of a galvanometer (26).

CITATION LIST

Patent Literature

PTL 1: Japanese Patent Laid-Open No. 2005-347668
PTL 2: Japanese Patent Laid-Open No. 2011-186218
PTL 3: Japanese Patent Laid-Open No. 2015-142111

Non Patent Literature

NPL 1: Yoshiaki Yasuno et al., "Three-dimensional and high-speed swept-source optical coherence tomography for in vivo investigation of human anterior eye segments," OPTICS EXPRESS, Vol. 13, No. 26, pp. 10652-10664, 2005

SUMMARY OF INVENTION

Technical Problem

In the swept light source as disclosed in PTL 1, a loop gain and a lasing threshold generally differ according to wavelength. In the case of a laser, lasing occurs within such a wavelength range that a loop gain spectrum is larger than a lasing threshold (loop gain spectrum>lasing threshold). This wavelength range means a range of a loop gain larger than the lasing threshold (=loss). The wavelength range is hereinafter referred to as an unsaturated gain range.

In the swept light source for SS-OCT, it is preferable to keep a coherence length long at all swept wavelengths. To realize this, it is important that the unsaturated gain range (lasing possible wavelength width) is narrow at all swept wavelengths.

Since the unsaturated gain range is a wavelength width in which the loop gain spectrum exceeds the lasing threshold, it is only necessary to create such an operating state that the peak of the loop gain spectrum corresponds to the lasing spectrum for all swept wavelengths. However, it is difficult for a conventional swept light source to realize such an operating state because an injected current into a gain medium is temporally constant. In a laser oscillator, an injected current into a gain medium determines the shape and peak value of a loop gain spectrum. Accordingly, in the conventional swept light source in which the injected current is temporally constant, the loop gain peak value does not necessarily correspond to the lasing threshold at all swept wavelengths. This reason can be further explained as follows.

The loop gain and the lasing threshold are determined by a gain of a gain medium, various optical losses in a laser resonator, filtering characteristics of a band pass filter, a time spendable for lasing of each wavelength and the like. For example, in the swept light source disclosed in PTL 1, a time spendable for lasing of each wavelength and filtering characteristics of a band pass filter are constant irrespective of wavelength, whereas a gain of a gain medium decreases with distance from the center wavelength of the swept wavelengths. As a result, the lasing threshold is small near the center wavelength and increases with distance from the center wavelength.

In the conventional swept light source, since the injected current into the gain medium is constant for any swept wavelength, it is necessary to determine the injected current into the gain medium according to a wavelength with a large lasing threshold in order to secure a swept wavelength width necessary for a wide range (for example, about 100 nm in SS-OCT). When a constant current is thus injected into the gain medium, the wavelength width of the loop gain above the threshold (unsaturated gain range) is large at a wavelength with a small lasing threshold. In the swept light source disclosed in PTL 1, because of the injected current into the gain medium capable of lasing at the shortest swept wavelength and the longest swept wavelength, a coherence length is long near the shortest wavelength and the longest wavelength. However, the injected current becomes excessive with increasing proximity to the center wavelength and the peak value of the loop gain exceeds the lasing threshold to a considerable degree. Accordingly, roughly at the center of the sweep wavelength range, the unsaturated gain range is wide, the linewidth is wide, and the coherence length is short.

It is know that in the SS-OCT device, the strength of an interference signal increases as the coherence length of a beam from the swept light source becomes longer. The strength of one pixel of an OCT image obtained by frequency conversion of an interference signal, that is, a point spread function (PSF) is proportional to the energy of the interference signal (time integration value). Accordingly, in order to increase the strength of PSF, it is necessary to strengthen the entire interference signal and keep the coherence length long in the entire sweep wavelength range. In the conventional swept light source in which a temporally-constant current is injected into the gain medium, the coherence length cannot be kept long in the entire sweep wavelength range. This causes a problem that PSF strength that directly affects the quality of output images of the SS-OCT device declines.

If the PSF strength declines in the SS-OCT device, a difference between the PSF peak of a detected image and system noise becomes small, and accordingly, a weak detection signal from a target is buried into the system noise. This causes a problem that the image quality of the SS-OCT device deteriorates and the image detection sensitivity decreases.

The present invention has been accomplished in consideration of the above problems. An object of the present invention is to provide a light source capable of keeping a coherence length long over an entire wide sweep wavelength range. Description will also be provided of a method of generating semiconductor optical amplifier (SOA) current waveform data (optical gain control data) for optimally operating the swept light source of the present invention, a method of calculating the coherence length, and an optical deflector suitable for implementing the swept light source of the present invention.

Solution to Problem

An aspect of the present invention is a swept light source configured to output a beam having a continuously changing lasing wavelength, the swept light source comprising: a laser resonator including a gain medium configured to amplify a beam, means for changing a lasing wavelength, and means for changing an optical gain of the gain medium; wavelength control means configured to control the means for changing a lasing wavelength by using a wavelength control signal and sweep the lasing wavelength; and optical gain control means configured to control the means for changing an optical gain so that an optical gain in the laser resonator has an optical gain value slightly higher than an optical gain in a state of a lasing threshold over an entire wavelength range of a wavelength sweep.

According to another aspect, the optical gain control means can be configured to control the means for changing an optical gain by using an optical gain control signal based on optical gain control data obtained by combining a plurality of times from a start of a sweep obtained from the wavelength control means with an optical gain at which a coherence length of a wavelength swept beam becomes the longest at each of the times.

The means for changing a lasing wavelength can preferably include: a diffraction grating; a mirror on which a laser beam from the diffraction grating is incident and the incident laser beam is perpendicularly reflected; and an optical deflector configured to change an angle of incidence of the laser beam on the diffraction grating.

According to yet another aspect, the optical gain control means can be configured to detect an output light level from the laser resonator, generate an optical gain control signal based on the detected output light level so that the output light level has a predetermined output light level value, and control the means for changing an optical gain by using the optical gain control signal.

The means for changing a lasing wavelength can preferably include: a diffraction grating; and an optical deflector configured to change an angle of incident of a laser beam on the diffraction grating.

Another aspect of the present invention is a swept light source configured to output a beam having a continuously changing lasing wavelength, the swept light source comprising: a laser resonator including a gain medium configured to amplify a beam, means for changing a lasing wavelength, and means for changing an optical gain of the gain medium; wavelength control means configured to control the means for changing a lasing wavelength by using a wavelength control signal and sweep the lasing wavelength; and means for changing the optical gain by using an optical gain control signal based on optical gain control data obtained by combining a plurality of times from a start of a sweep obtained from the wavelength control means with an optical gain at which a coherence length of the wavelength swept beam becomes the longest at each of the times.

According to yet another aspect of the present invention, the optical deflector can comprise: an optical deflector with at least two electrodes formed on opposing surfaces of an electro-optical crystal, wherein in a case where a voltage is applied to the at least two electrodes, a non-uniform refractive index distribution occurs in the electro-optical crystal due to an electro-optic effect, thereby bending an optical path perpendicular to an electric field formed by the voltage; and an optical element arranged on at least one of an incident side and an outgoing side of the electro-optical crystal, the optical element having light condensing characteristics spatially distributed over a range of deflection of the beam.

Light condensing characteristics of the optical deflector can preferably change according to an angle of deflection and optical characteristics of the optical element can preferably be spatially distributed so as to compensate for a change in at least one of a beam waist position and a beam waist diameter of the outgoing side over the range of deflection of the beam.

Advantageous Effects of Invention

As described above, the swept light source, the method of generating drive data for the swept light source, and the optical deflector of the present invention can constantly keep a coherence length of an output beam long during a wavelength sweep period.

BRIEF DESCRIPTION OF DRAWINGS

FIG. 5 is a table showing entire coherence length data acquired in the present invention.

DESCRIPTION OF EMBODIMENTS

Figure 1:
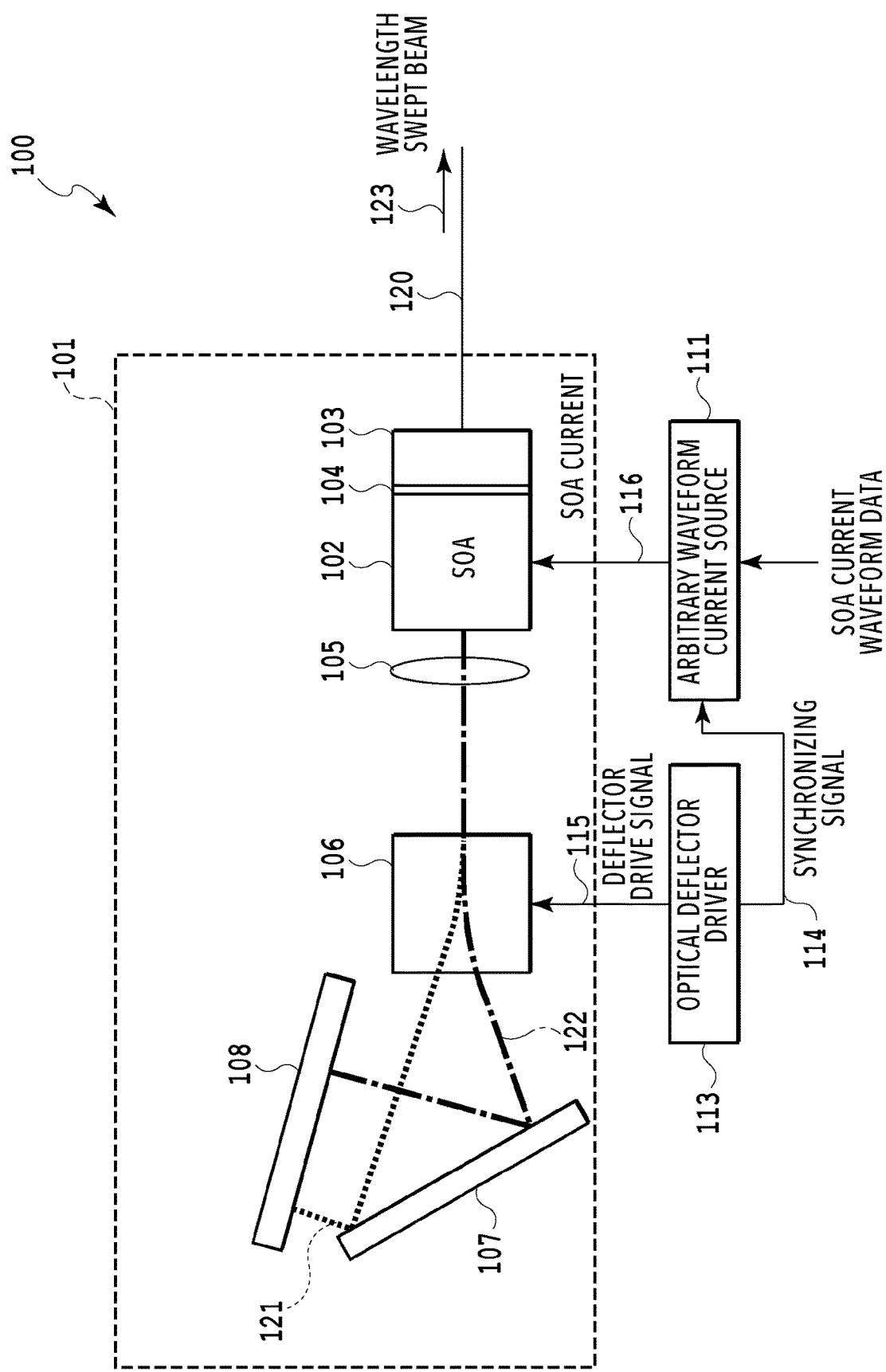
FIG. 1 is a diagram showing a configuration of a swept light source of a first embodiment of the present invention.

An aspect of the present invention is a swept light source configured to output a beam having a continuously changing lasing wavelength, the swept light source comprising: a laser resonator including a gain medium configured to amplify a beam, means for changing a lasing wavelength, and means for changing an optical gain of the gain medium; wavelength control means configured to control the means for changing a lasing wavelength by using a wavelength control signal and sweep the lasing wavelength; and optical gain control means configured to control the means for changing an optical gain so that an optical gain in the laser resonator has an optical gain value slightly higher than an optical gain in a state of a lasing threshold over an entire wavelength range of a wavelength sweep.

For the optical gain control means, configuration examples according to different methods (first and second embodiments) are described. One is an example of calculating an SOA current for keeping a coherence length maximum in advance and operating the light source based on SOA current waveform data. The other is an example of detecting an output light level from the laser resonator and controlling an optical gain (SOA current) based on the detected output light level so that the output light level is a predetermined output light level.

In addition, various configuration examples of an optical deflector suitable for implementing the swept light source of the invention are described.

First Embodiment

A swept light source of a first embodiment of the present invention can keep a coherence length of an output beam long over an entire sweep wavelength range. A gain of a gain medium is changed with time in response to a wavelength sweep, whereby the coherence length is kept maximum. That is, it operates so that the gain of the gain medium is kept close to an lasing threshold at each wavelength over the entire sweep wavelength range and an unsaturated gain range of the gain medium is narrowed. In other words, the optical gain is controlled so that a gain (optical gain) in the laser resonator has a gain value slightly higher than a gain in a state of the lasing threshold (lasing threshold gain or lasing gain). A linewidth of an output laser beam is constantly kept narrow by controlling the laser gain control means so as to further reduce a loop gain roughly at the center of the sweep wavelength range, which has an excessive gain in a conventional swept light source.

Although not limited to this, for example, the loop gain of the gain medium can be changed by an SOA current injected into the gain medium in the laser resonator to flow through a semiconductor optical amplifier (SOA). An SOA current for keeping a coherence length maximum in the swept light source of the present invention is generated based on SOA current waveform data. The SOA current waveform data is obtained by calculating a coherence length corresponding to each wavelength from a coherent beam of a light source output beam while associating different SOA currents with sweep time information in a state of sweeping the swept light source. At each wavelength, an SOA current for providing the maximum coherence length is selected from different SOA currents. A coherence length is calculated based on a plurality of coherent beams obtained from a wavelength swept beam while the swept light source is kept in a normal sweep operating state, and then an SOA current for keeping the coherence length maximum is calculated. The SOA current for keeping the coherence length maximum is supplied from a current source capable of outputting an arbitrary current waveform. The swept light source operates based on SOA current waveform data for implementing the SOA current waveform stored in storage means (memory). The gain of the gain medium of the laser resonator can be changed also by gain changeable means other than the SOA drive current.

The present invention can also be implemented as a method of obtaining SOA current waveform data for driving the swept light source while keeping a coherence length of an output laser beam long over an entire sweep wavelength range. Description is also provided of a novel method of measuring a coherence length for determining the SOA current waveform data suitable for the swept light source of the present invention and unique to the present invention. The swept light source of the present invention, the method of generating drive data for the swept light source, and the method of measuring the coherence length will be described below along with each example. First, the configuration and operation of the swept light source of the present invention are described as Example 1 of the swept light source of the first embodiment.

Example 1

FIG. 1 is a diagram showing a configuration example of the swept light source of the present invention. The swept light source 100 of the present invention is described as one having a Littman laser resonator 101 for example. It should be noted that the present invention is applicable to any type of laser resonator as long as it is a laser oscillator having a gain medium with a wavelength-dependent loop gain in a resonator, as will be described later. A beam output from an SOA 102 is collimated into a parallel beam by a lens 105 and deflected through an optical deflector 106. The optical deflector 106 deflects an optical path in the vertical direction of the drawing, for example, as shown in FIG. 1, by using a drive signal 115 from an optical deflector driver to be described later. FIG. 1 shows two cases: an optical path 121 deflected at the maximum to the upper side of the drawing; and an optical path 122 deflected at the maximum to the lower side of the drawing. In the configuration of FIG. 1, the state of the optical path 121 and the state of the optical path 122 correspond to a state of the longest wavelength and a state of the shortest wavelength, respectively.

The beam deflected by the optical deflector 106 is diffracted by a diffraction grating 107 and reaches a mirror 108. Only a beam of a wavelength perpendicularly incident on the mirror 108 follows an optical path opposite to the optical path described above and returns to the SOA 102. The beam returning from the mirror 108 to the SOA 102 is reflected on a half mirror 104 between the SOA 102 and a coupler 103. A round-trip optical path is formed between the mirror 108 and the half mirror 104 and lasing occurs. Part of the laser beam passes from the SOA 102 through the half mirror 104 and is output as an output beam to the outside of the laser resonator 101 through the coupler 103 and an optical fiber 120.

As described above, since the round-trip optical path is formed only from wavelength components perpendicularly incident on and reflected on the mirror 108 and the lasing state arises, a lasing wavelength can be changed by an angle of incidence of a beam on the diffraction grating 107. For example, a configuration between the SOA 102 and the mirror 108 forms a band pass filter substantially in the form of a quadratic function and determines an unsaturated gain range of a loop gain.

The optical deflector driver 113 controls a direction of deflection (angle of deflection) of an outgoing beam from the optical deflector 106 by using the drive signal 115. As the drive signal 115 changes with time, the direction of deflection also gradually changes. In the swept light source, the drive signal changes periodically and repeatedly so as to smoothly increase or decrease a wavelength of a laser beam in only one direction and sweep the wavelength. In general, a predetermined interval is placed between a wavelength sweep and the next wavelength sweep. That is, part of a repeating period is used for an actual wavelength sweep. As described above, in the laser resonator 101, the lasing wavelength is changed temporally continuously by the drive signal 115 to implement a wavelength sweep operation.

The optical deflector driver 113 outputs a synchronizing signal 114 synchronized with a wavelength sweep together with the drive signal. For example, in the case of a wavelength sweep from a short wavelength to a long wavelength, the synchronizing signal 114 is output to an arbitrary waveform current source 111 at a time when an angle of deflection corresponds to the shortest wavelength.

The arbitrary waveform current source 111 has SOA current waveform data for generating an SOA current 116 to be used during a wavelength sweep operation and applied to the SOA 102 in an associated memory (storage means) not shown in FIG. 1. The memory may be either one that reads current waveform data from another memory and temporarily stores it, or one that semipermanently stores it. Although the details of the contents of the current waveform data will be described in Example 2 and Example 3, information for generating the SOA current waveform data is stored in the memory.

The memory may be provided in the arbitrary waveform current source 111, or in any place in the swept light source 100 outside the arbitrary waveform current source 111. The arbitrary waveform current source 111 generates an SOA current waveform from the current waveform data or information stored in the memory in synchronization with the synchronizing signal 114 from the optical deflector driver 113, and allows an SOA current according to the SOA current waveform to flow through the SOA 102. Incidentally, the SOA 102 is generally connected to a temperature controller configured to control the temperature of the SOA, but it is omitted here. The same applies to SOAs described hereinafter. In general, the swept light source further comprises a control unit including a CPU for control of the entire light source including control of a wavelength sweep operation. The control unit generally includes a memory, and an electronically controlled device that operates by using data stored in or read from a memory generally comprises a control unit. Accordingly, it should be noted that the control unit is not shown in FIG. 1.

As the information stored in the memory associated with the arbitrary waveform current source 111, time-waveform per se may be stored, or data in an arbitrary form for generating time-wavelength may be stored. That is, time-waveform data per se, time-waveform data and a coefficient combined therewith, time-waveform data and a bias combined therewith, or a combination of time-waveform data, a coefficient, and a bias may be output.

In addition, as the information stored in the memory associated with the arbitrary waveform current source 111, data obtained by the Fourier transform of a current waveform may be stored. Also in this case, data obtained by the inverse Fourier transform of the data obtained by the Fourier transform per se, data obtained by the inverse Fourier transform and a coefficient combined therewith, data obtained by the inverse Fourier transform and a bias combined therewith, or a combination of data obtained by the inverse Fourier transform, a coefficient, and a bias may be output.

When the swept light source of the present invention is operated, the optical deflector driver 113 first causes the optical deflector 106 to perform a deflection operation. Upon the start of the deflection operation, the arbitrary waveform current source 111 loads current waveform data to be applied to the SOA 102 into the memory associated with the arbitrary waveform current source 111. The optical deflector driver 113 causes the optical deflector 106 to perform the deflection operation. The arbitrary waveform current source 111 applies an SOA current 116 corresponding to the current waveform data to the SOA 102 in synchronization with the synchronizing signal 114 from the optical deflector driver 111 based on the current waveform data stored in the memory. The operation principle in the present invention will be described in more detail.

As described above, in the swept light source used for the SS-OCT device, it is necessary that a coherence length of a laser beam from the laser resonator be kept long and a linewidth be as narrow as possible in the entire sweep wavelength range. In the configuration of the swept light source of the present invention shown in FIG. 1, a basic narrowing operation of the linewidth is performed by a wavelength filter including the diffraction grating 107 and the mirror 108 like a conventional one. In addition to this, in the swept light source of the present invention, the loop gain is synchronized with a sweep and dynamically adjusted and the operation of the SOA 102 is controlled so that the unsaturated gain range is as narrow as possible at any time during a wavelength sweep. That is, in the lasing wavelength varying every moment, the SOA 102 sets the SOA current 116 so that the loop gain is slightly larger than the lasing threshold and the unsaturated gain range is as narrow as possible. This makes it possible to keep the coherence length of the laser beam long at any time during one wavelength sweep period. The size of the loop gain differs depending on a wavelength. Accordingly, if the optical gain of the SOA is changed with a wavelength during a wavelength sweep, the coherence length can be kept long at any time during one wavelength sweep period. In the swept light source, a wavelength at each moment during a wavelength sweep period corresponds to a time from the start of a sweep, that is, a sweep time one by one. As a result, setting the loop gain by using the SOA current 116 according to a wavelength comes down to a matter of how to associate the SOA current 116 with the time from the start of a wavelength sweep and determine time-SOA current waveform. The swept light source of the present invention operates the SOA by using the current waveform data of time-SOA current waveform obtained by Example 2 stated below.

Figure 2:
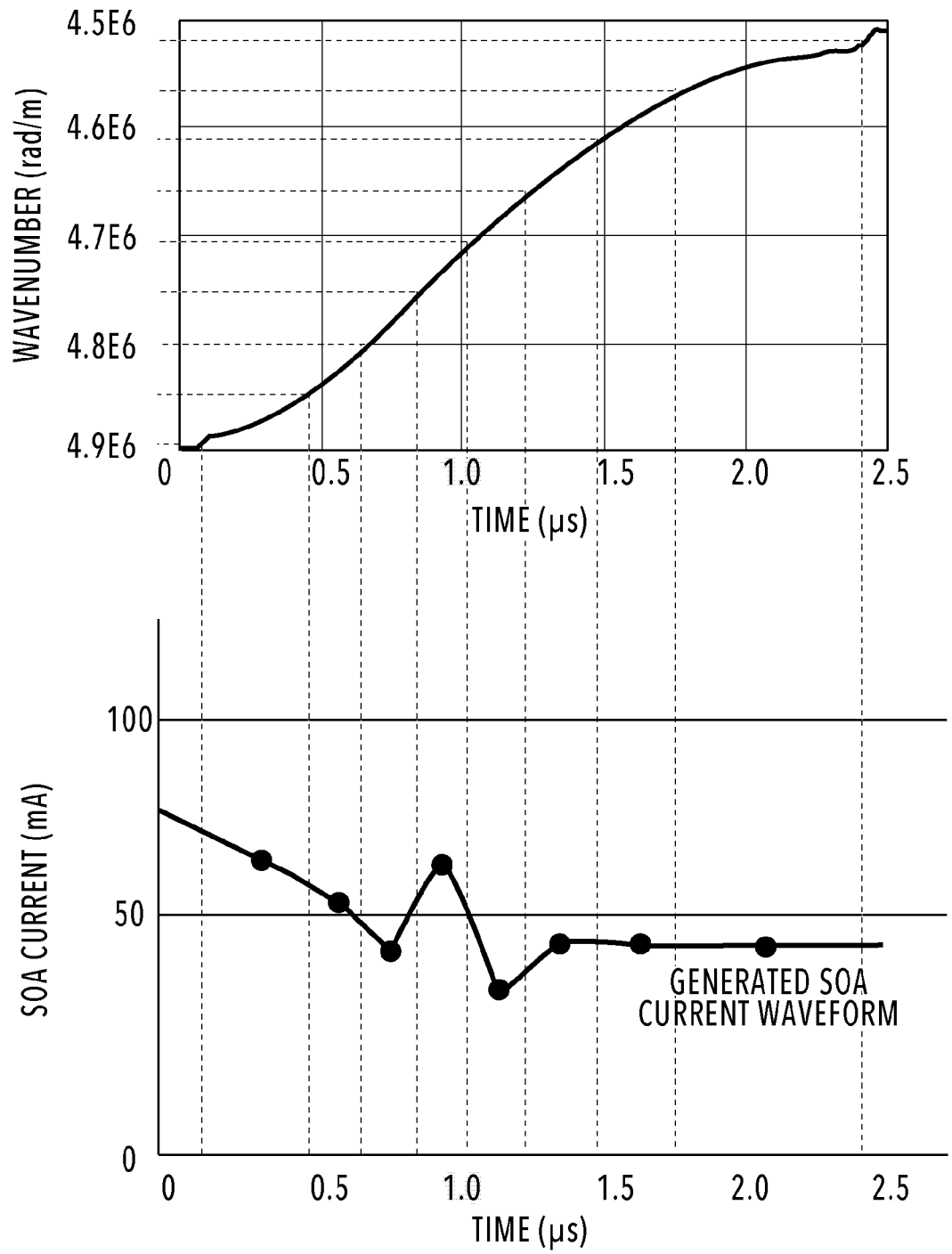
FIG. 2 is a diagram showing motion of an SOA current in the swept light source.

FIG. 2 is a diagram showing motion of an SOA current in the swept light source of the present invention. In both the upper and lower graphs in FIG. 2, the horizontal axis represents a time from the start of a sweep. The time is synchronized between the upper and lower graphs. The upper graph in FIG. 2 shows a temporal change in the lasing wavelength in one wavelength sweep period. At the start of a wavelength sweep, the lasing wavelength is about 1280 nm (about 4.9E6 rad/m in terms of wavenumber). At the end of a wavelength sweep, the lasing wavelength is about 1400 nm (about 4.5E6 rad/m in terms of wavenumber) and the sweep wavelength range reaches 120 nm. The lower graph in FIG. 2 shows time-SOA current waveform in the case of changing the SOA current 116 according to the present invention in one wavelength sweep period. The graph shows that the SOA current 116 is changed according to the wavelength. To be more specific, the SOA current at the center of the sweep wavelength range is lower than an SOA current value of at least one of both ends of the sweep wavelength range (corresponding to the times of start and end of a sweep). This controls the SOA 102 so that the loop gain of the gain medium at the center of the sweep wavelength range is dynamically reduced and the unsaturated gain range is as narrow as possible at any time during a wavelength sweep. As is clear from the upper graph in FIG. 2, sweep times correspond to wavelengths one by one and an instantaneous lasing wavelength can be specified by a time from the start of a sweep.

The swept light source 100 of this example shown in FIG. 1 operates in a state where there is already the time-SOA current waveform data for driving the SOA while dynamically changing the SOA current with time. A method and apparatus for generating the SOA current waveform data will be described in more detail in Example 2 and Example 3.

In the swept light source 100 of FIG. 1 described above, the configuration of the Littman external resonator has been explained as an example of the laser resonator 101. However, the present invention is applicable to a swept light source with any type of laser resonator as long as means for changing the loop gain can be comprised. That is, the present invention is also applicable to a swept light source comprising a Littrow external resonator, a fiber laser, a vertical cavity surface emitting laser (VCSEL)-MEMS laser or the like. The present invention is applicable to any swept light source wherein a laser resonator comprises means for changing a wavelength (the optical deflector 106, the diffraction grating 107, and the mirror 108 in FIG. 1) and means for changing an optical gain (the SOA 102 in FIG. 1). As a consequence, the present invention can be generalized as follows.

For example, the means for changing a wavelength receives a wavelength control signal (deflector drive signal 115) output from wavelength control means corresponding to the optical deflector driver 113 in FIG. 1 and controls the lasing wavelength. If the wavelength control means controls the wavelength to be continuously changed with time, a wavelength sweep is enabled. As described above, in the configuration example of the swept light source in the example shown in FIG. 1, a sweep operation of the lasing wavelength is caused by continuously changing the angle of optical deflection of the optical deflector 106.

As the optical deflector, for example, a KTN deflector using a potassium tantalate niobate (KTN) crystal as an electrooptic material can be used. Besides KTN, the following electrooptic materials can also be used: KLTN ($K_{1-y}Li_yTa_{1-x}Nb_xO_3$ [$0<x<1$, $0<y<1$]), $LiNbO_3$ (hereinafter referred to as LN), $LiTaO_3$, $LiIO_3$, $KNbO_3$, $KTiOPO_4$, $BaTiO_3$, $SrTiO_3$, $Ba_{1-x}SrxTiO_3$ ($0<x<1$), $Ba_{1-x}Sr_xNb_2O_6$ ($0<x<1$), $Sr_{0.75}Ba_{0.25}Nb_2O_6$, $Pb_{1-y}La_yTi_{1-x}Zr_xO_3$ ($0<x<1$, $0<y<1$), $Pb(Mg_{1/3}Nb_{2/3})O_3$—$PbTiO_3$, $KH_2PO_4$, $KD_2PO_4$ (D is deuterium), $(NH_4)H_2PO_4$, $BaB_2O_4$, $LiB_3O_5$, $CsLiB_6O_{10}$, GaAs, CdTe, GaP, ZnS, ZnSe, ZnTe, CdS, CdSe, and ZnO.

The means for changing an optical gain is controlled in response to an optical gain control signal (SOA current 116) output from the optical gain control means corresponding to the arbitrary waveform current source 111 in FIG. 1, whereby the optical gain is controlled. If the optical gain control means changes the optical gain control signal with time, the optical gain also changes with time along with that. In the example of FIG. 1, the SOA current 116 varies with time, whereby the optical gain (loop gain of the gain medium) of the SOA 102 changes with time along with the SOA current 116.

The SOA current waveform data in the swept light source 100 shown in FIG. 1 is temporal transition data on the SOA current 116 during one sweep (data obtained by combining the time with the SOA current). To further generalize as the swept light source comprising the means for changing a wavelength and the means for changing an optical gain, the SOA current waveform data can be said to be an example of temporal transition data on the optical gain control signal during one wavelength sweep (data obtained by combining the time with the optical gain control signal; optical gain control data). In FIG. 2, if the vertical axis in the lower graph is read as an optical gain control signal value, the optical gain control data in which the optical gain control signal value is dynamically controlled with the wavelength can be obtained.

Accordingly, the swept light source of the present invention can be implemented as a swept light source configured to output a wavelength swept beam having a continuously changing lasing wavelength, the swept light source comprising: a laser resonator comprising a gain medium configured to amplify a beam, means for changing a lasing wavelength (106, 107, and 108), and means for changing an optical gain of the gain medium (102); wavelength control means (113) configured to control the means for changing a lasing wavelength and sweep the lasing wavelength by using a wavelength control signal (115); and optical gain control means (111) configured to control the means for changing an optical gain by using an optical gain control signal (116) based on optical gain control data obtained by combining a plurality of times from the start of a sweep obtained from the wavelength control means with an optical gain in which a coherence length of the wavelength swept beam becomes the longest at each of the times.

The means for changing a lasing wavelength can preferably include a diffraction grating (107), a mirror (108) on which a laser beam from the diffraction grating is incident and the incident laser beam is vertically reflected, and an optical deflector (106) configured to change the angle of incidence of the laser beam on the diffraction grating. In addition, the means for changing an optical gain of the gain medium can be a semiconductor optical amplifier (SOA), the optical gain control signal can be an SOA current for driving the SOA, and the optical gain control data can be SOA current waveform data indicating an SOA current selected for each of the times.

As described above, the present invention is applicable to a swept light source configured to operate based on optical gain control data as long as the laser resonator 101 comprises means for changing a wavelength and means for changing an optical gain and there are wavelength control means and optical gain control means for controlling them. The same also applies to the examples of the present invention described below. The above example has been described based on the premise that there is already SOA current waveform data for operating the swept light source 100 of the present invention. In the next example, an apparatus and procedure for generating the SOA current waveform data will be described.

Example 2

Figure 3:
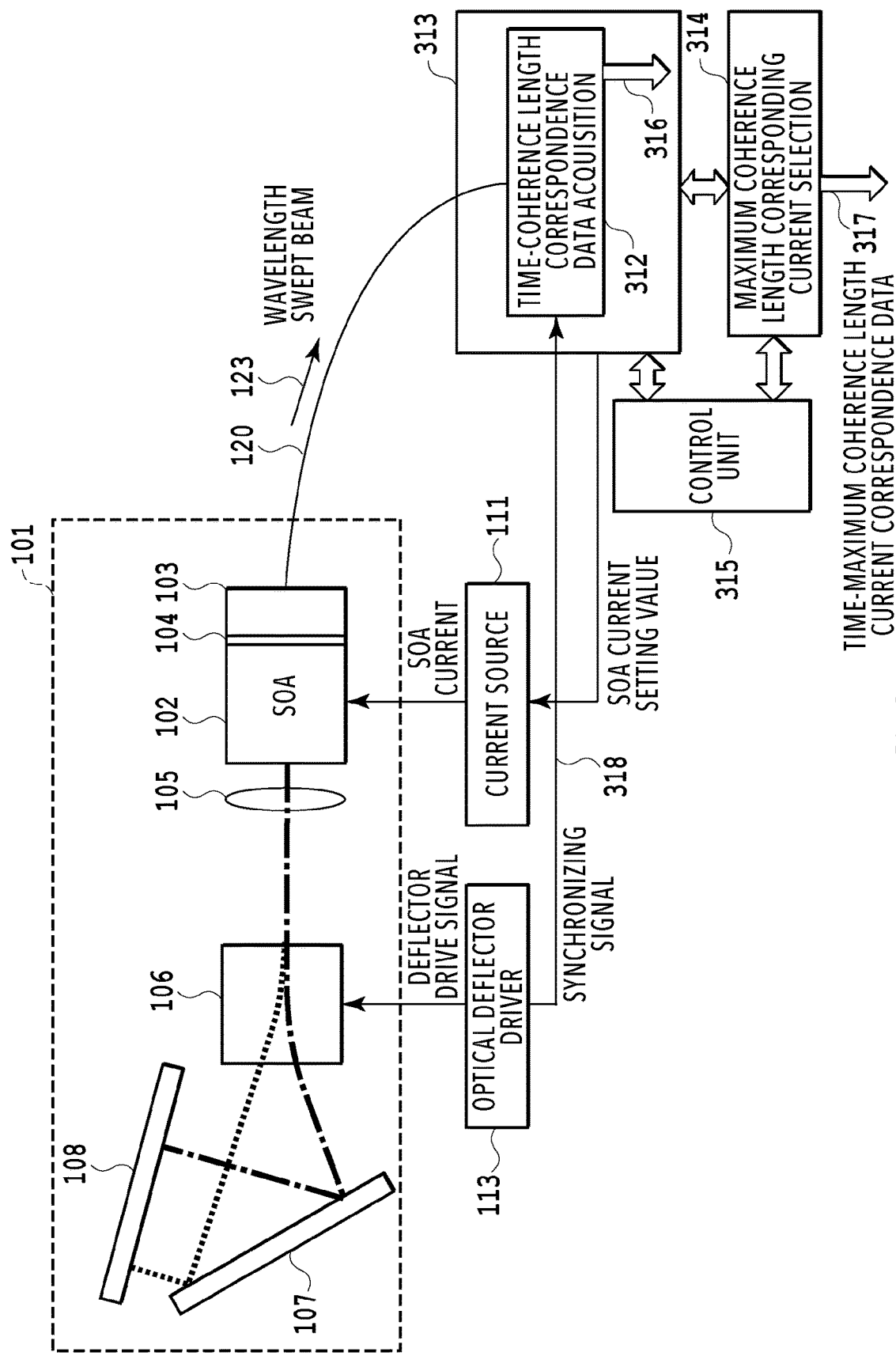
FIG. 3 is a diagram showing a generation apparatus of SOA current waveform data in the present invention.
Figure 4:
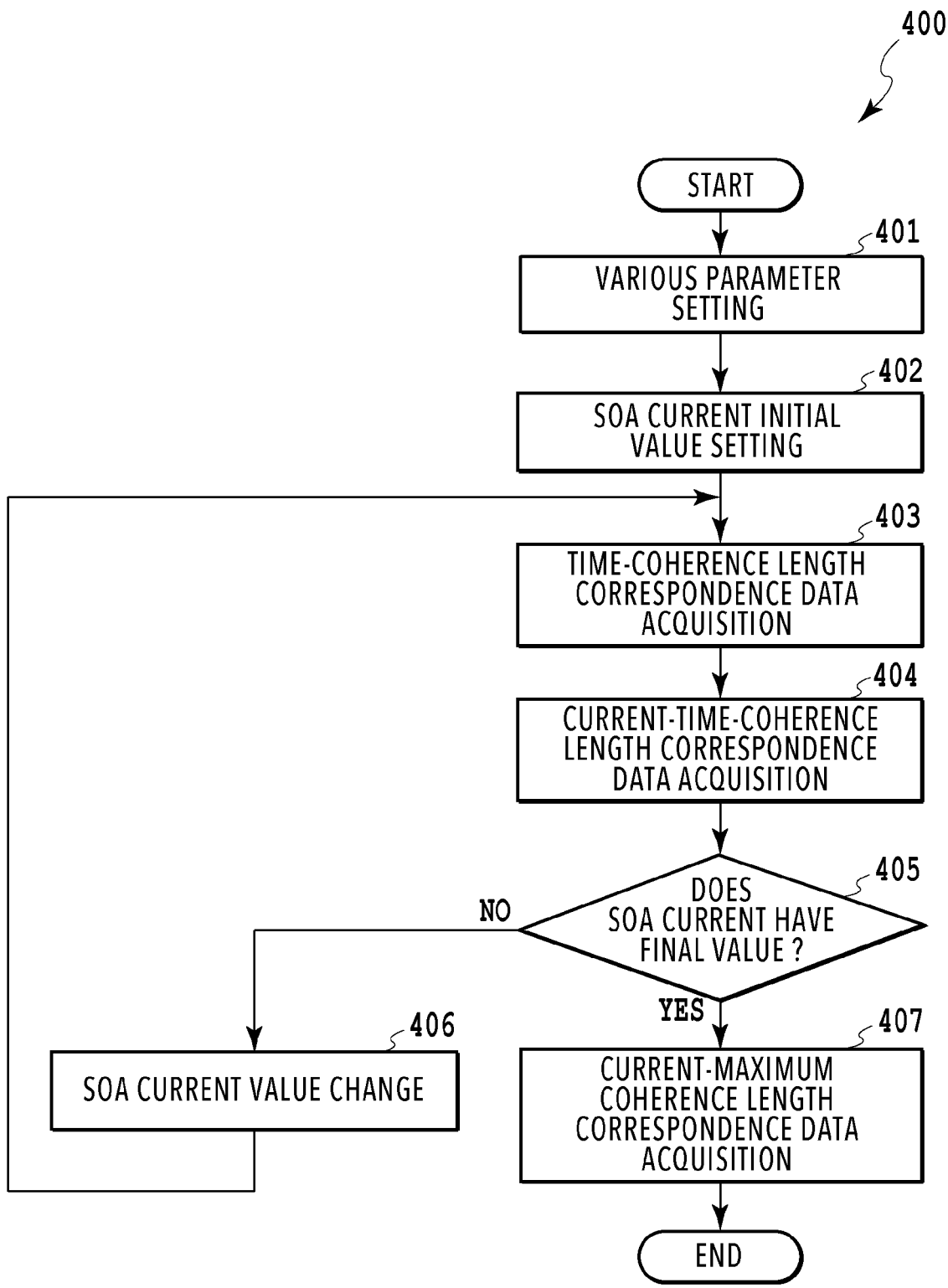
FIG. 4 is a diagram showing a flow of a generation procedure of the SOA current waveform data in the present invention.

FIG. 3 is a diagram showing a configuration of an apparatus for generating SOA current waveform data stored in the memory associated with the swept light source of the present invention. The apparatus for generating SOA current waveform data shown in FIG. 3 includes all the elements of the swept light source 101 in Example 1 and additionally includes elements for acquiring the SOA current waveform data. However, many of the additional elements in FIG. 3 except for an interferometer represent functional blocks indicating processes that can be implemented by software operational processing by a CPU or the like as will be described later in Example 3. Accordingly, it should be noted that the additional elements in FIG. 3 except for the interferometer can be implemented as software operational processing without any special hardware element other than a processor. More specifically, a control unit 315 in FIG. 3 includes a processor such as a CPU and a hardware element such as an associated memory. In contrast, it is understandable that elements of a procedure for acquiring the SOA current waveform data to be described later with reference to a flowchart of FIG. 4 are shown as current-time-coherence length correspondence data acquisition means 313, maximum coherence length corresponding current selection means 314 and the like for the sake of convenience. Accordingly, although the current-time-coherence length correspondence data acquisition means 313 and the maximum coherence length corresponding current selection means 314 are shown as separate elements for the sake of convenience, note that they execute the SOA current waveform data acquiring procedure (FIG. 4) to be described later under the control of the control unit 315. It should therefore be noted that a connection relationship, an inclusion relationship, arrows and the like among the control unit 315, the current-time-coherence length correspondence data acquisition means 313, and the maximum coherence length corresponding current selection means 314 roughly and conceptually show exchanges of control signals, control data, operation result data and the like.

Time-coherence length correspondence data acquisition means 312 included in the current-time-coherence length correspondence data acquisition means 313 shows a step of acquiring a coherence length of a laser output beam particularly as an explicit functional block. In the swept light source of the present invention, it is necessary to acquire a coherence length of a laser output beam in order to determine an SOA current value at each wavelength when dynamically changing an SOA current. In the swept light source of the present invention, a unique and novel aspect is included also in a method and configuration for calculating the coherence length as a precondition to SOA current waveform data acquisition, which will be described as Example 3. Accordingly, the configuration of the time-coherence length correspondence data acquisition means 312 and the operation/procedure of calculating the coherence length will be described in detail in Example 3.

This example provides an overview of the procedure of obtaining the SOA current waveform data in the apparatus for generating the SOA current waveform data shown in FIG. 3. The laser resonator 101, the current source 111, and the optical deflector driver 113 shown in FIG. 3 are identical to those used in the swept light source of Example 1 and their configurations are as described above. However, a method of using the arbitrary waveform current source 111 is different from that in the case of the swept light source of Example 1.

In Example 1, when the swept light source of the present invention is actually used as a light source, the arbitrary waveform current source 111 operates as one generating the SOA current dynamically changing with time in synchronization with a wavelength sweep based on already-acquired SOA current waveform data. In this example, the arbitrary waveform current source 111 operates as a current source that causes a current of a constant value to flow through the SOA 102 without any temporal change. It is hereinafter referred to as a current source 111 for simplification. The SOA current value in the current source 111 can be externally set based on SOA current setting value data. FIG. 3 shows that the SOA current setting value data is set by the current-time-coherence length correspondence data acquisition means 313, but this is just an example and the SOA current setting value data may be set by the control unit 315.

The current-time-coherence length correspondence data acquisition means 313 inputs SOA current value data to the current source 111, sets a predetermined SOA current value to the SOA 102, and acquires time-coherence length correspondence data for each set SOA current value. That is, a data set of "time" and "coherence length" (time and coherence length) is obtained for each set SOA current value. The term "time" used here indicates a time from the start of a sweep in one wavelength sweep period. A coherence length is acquired under a condition of a set particular SOA current value and particular time by the time-coherence length correspondence data acquisition means 312. In short, the time-coherence length correspondence data acquisition means 312 shows a functional block that measures the coherence length under a particular condition. The time-coherence length correspondence data acquisition means 312 outputs time-coherence length correspondence data 316, that is, a data set (time and coherence length) 316. The current-time-coherence length correspondence data acquisition means 313 acquires the data set (time and coherence length) 316 for each set SOA current value and finally calculates a data set (SOA current value, time, and coherence length) including three types of data, "SOA current value," "time," and "coherence length." The details of the data set will be easily understood from a flowchart of FIG. 4 and an example of acquired data in FIG. 5 to be described later.

As described above, the time-coherence length correspondence data acquisition means 312 obtains a wavelength swept beam from the laser resonator 101 in synchronization with the synchronizing signal 318 from the optical deflector driver 113 and measures a coherence length for each "time" with respect to the wavelength swept beam from the laser resonator 101. At this time, the time-coherence length correspondence data acquisition means 312 generates different coherent beams on different interference conditions from the wavelength swept beam while the SOA 102 is set at one SOA current value, and calculates a coherence length for each "time" from a plurality of items of coherent beam data corresponding to one SOA set current value. It should be noted that the SOA current waveform data for the wavelength swept light source of the present invention is obtained from a "wavelength swept beam" subjected to a wavelength sweep operation. That is, the coherence length is not calculated by setting the wavelength swept light source at a particular lasing wavelength and statically operating it, but the coherence length corresponding to each "time" of the wavelength sweep period is calculated based on the wavelength swept beam obtained under a condition of an actual wavelength sweep operation. Each "time" in the wavelength sweep period corresponds to each wavelength in the sweep wavelength range one by one as shown in the upper graph in FIG. 2. As a result, the time-coherence length correspondence data acquisition means 312 comes to calculate the coherence length for each wavelength from the wavelength swept beam in "an actual wavelength sweep operation state," in which the lasing wavelength dynamically changes at each moment in the swept light source.

The maximum coherence length corresponding current selection means 314 acquires current-time-coherence length correspondence data 316 obtained by the current-time-coherence length correspondence data acquisition means 313 and selects/determines an SOA current value at which the coherence length becomes maximum for each "time" in the wavelength sweep period. In other words, the maximum coherence length corresponding current selection means 314 selects an SOA current value with the maximum coherence length from data sets having the same "time" among data sets (SOA current value, time, and coherence length) including three types, namely "SOA current value," "time," and "coherence length." Finally, data on an SOA current value selected for each "time" (time-maximum coherence length current correspondence data), that is, current waveform data 317 is output. Next, the procedure of obtaining the SOA current waveform data will be described in detail with reference to a flowchart.

FIG. 4 shows a flowchart of a procedure of generating SOA current waveform data to be stored in the memory associated with the swept light source of the present invention. In the following description, numerals assigned to elements (boxes) of the flowchart of FIG. 4 correspond to step numbers.

Procedure 400 of generating SOA current waveform data first sets various parameters in step 401. An initial value, final value, and current varying step of SOA current value data to be set to the current source 111 are set from the control unit 315 to the current-time-coherence length correspondence data acquisition means 313. Although what is set to the current source 111 is not a current but setting data corresponding to a set SOA current value, it is referred to as an SOA current value or the like for simplification in the description below.

Procedure 400 sets an SOA current initial value in step 402. The current-time-coherence length correspondence data acquisition means 313 sets an initial value of an SOA current value to the current source 111. The SOA current value is varied from the initial value by the current varying step and a coherence length at each time in one wavelength sweep is measured for each SOA current value in step 403 to be described later. The SOA current value may be first set to a small value and then gradually increased, or vice versa.

Procedure 400 acquires time-coherence length correspondence data in step 403. The procedure of calculating the coherence length will be described later in detail as Example 3, and accordingly a summary of the procedure is provided here. The time-coherence length correspondence data acquisition means 312 acquires a wavelength swept beam corresponding to one wavelength sweep from the laser resonator 101 in synchronization with the synchronizing signal 318 from the optical deflector driver 113. After the acquisition of the wavelength swept beam corresponding to one wavelength sweep, an interference condition is changed by varying a difference between optical path lengths of two arms (a sample arm and a reference arm) of the interferometer to be described later in Example 3 and a plurality of interference signals corresponding to different interference conditions are acquired. After each of the acquired coherent beams is rescaled, PSF for each optical path length difference is calculated for each time during the wavelength sweep. After that, a calculation is performed to obtain a differential value between two optical path length differences $2z_{PSFHALF1}$ and $2z_{PSFHALF2}$ having such a PSF peak value that the PSF peak value (strength) is ½ of the maximum value $PSF_{MAX}$ for each time. The absolute value of the differential value $2|z_{PSFHALF1}-z_{PSFHALF2}|$ is defined as a coherence length Lc. Here, the positive and negative signs of the optical path length differences $2z_{PSFHALF1}$ and $2z_{PSFHALF2}$ are opposite to each other. The positive and negative of the optical path length differences and a mechanism of measurement will be described below.

On the assumption that a difference between an optical path length of the reference arm and an optical path length of the sample arm is an optical path length difference, the optical path length difference becomes negative when the optical path length of the sample arm is short and becomes positive in the opposite case. PSF is calculated for each optical path length difference. As the optical path length difference becomes closer to zero, interference becomes stronger and the PSF peak value increases. As the optical path length difference becomes longer, interference becomes weaker and the PSF peak value decreases. In the above measurement, both of the positive and negative optical path length differences are measured. Accordingly, the PSF peak value becomes maximum when the optical path length difference is close to zero and decreases as the optical path length difference becomes distant from zero. Since the coherence length is defined as a coherent distance until the interference strength is reduced by half from the maximum value, it is calculated as such an optical path length difference that the PSF peak value is reduced by half from its maximum value as described above.

If the PSF peak value decreases symmetrically with respect to the optical path length difference 0 in both the positive and negative optical path length differences, measurement may be taken only for either of the positive and negative optical path length differences. In this case, a PSF peak value (strength) when the optical path length difference 2z is close to zero may be defined as $PSF_{MAX}$, a maximum value of PSF, an optical path length difference $2z_{PSFHALF}$ when the PSF peak value is $PSF_{MAX}/2$ may be doubled, and the length $4z_{PSFHALF}$ may be defined as a coherence length at each time.

The PSF peak value when the optical path length difference 2z is close to zero is defined as $PSF_{MAX}$, the maximum value of PSF, because it is impossible to calculate PSF when the optical path length difference 2z is zero. PSF is calculated from the interference signal. A result of the Fourier transform of an envelope of the interference signal after rescaling is substantially in the form of PSF. When the optical path length difference 2z is zero, a frequency corresponding to a carrier wave of the interference signal is zero and it is difficult to stably output the envelope of the interference signal. In coherence length measurement, PSF is generally acquired when the optical path length difference 2z is close to zero instead of acquiring PSF when the optical path length difference 2z is zero. Finally, correspondence data between each time and coherence length during a wavelength sweep (time-coherence length correspondence data 316) is output.

Procedure 400 acquires current-time-coherence length correspondence data in step 404. The current-time-coherence length correspondence data acquisition means 313 associates the time-coherence length correspondence data 316 output in step 402 with the SOA current value presently set to the current source 111. If there is already current-time-coherence length correspondence data, time-coherence length correspondence data newly associated with the SOA current in this step is added to the current-time-coherence length correspondence data. If there is no current-time-coherence length correspondence data, time-coherence length correspondence data newly associated with the SOA current in this step is used as current-time-coherence length correspondence data. As described above, the current-time-coherence length correspondence data is data sets (SOA current value, time, and coherence length) each including three types of data, "SOA current value," "time," and "coherence length."

Procedure 400 determines whether the SOA current has the final value in step 405. The current-time-coherence length correspondence data acquisition means 313 determines whether the SOA current value presently set to the current source 111 is the final value. The procedure advances to step 407 if Yes and to step 406 if No.

Procedure 400 changes the SOA current value in step 406. The current-time-coherence length correspondence data acquisition means 313 changes the SOA current value set to the current source 111 from the present SOA current value to a new SOA current value according to the current varying step. Then, the procedure returns to step 403 and acquires the time-coherence length correspondence data 316 at the new SOA current value. That is, the data set (time and coherence length) 316 is obtained.

Procedure 400 acquires time-maximum coherence length correspondence current data (current waveform data) in step 407. The maximum coherence length corresponding current selection means 314 selects an SOA current value at which the coherence length becomes maximum for each time of the wavelength sweep for the current-time-coherence length correspondence data acquired in step 404. Then, data on the SOA current value (time-maximum coherence length current correspondence data 317), that is, SOA current waveform data is output at each time.

FIG. 5 is a table simply showing the entire coherence length data acquired in each step shown in the flowchart of FIG. 4. In the table of FIG. 5, the leftmost column shows set SOA current values. That is, the minimum SOA current value is 30 mA, the maximum SOA current value is 100 mA, and the current varying step is 10 mA. Further, the uppermost row in the table of FIG. 5 shows wavenumbers k at which the coherence length has been calculated. The wavenumbers correspond to times or wavelengths of a wavelength sweep one by one. As will be described in detail in Example 3, the coherence length is calculated at center wavenumbers k(0·δt) to k(7·δt) in regular time intervals.

The coherence length is shown in each cell of Table 5 for each combination of the SOA current value (mA) and wavenumber k in Table 5. The coherence length is calculated for one SOA current value for each wavenumber of the center wavenumbers k(0·δt) to k(7·δt). For example, in the data in the uppermost row of the table where the SOA current is 100 mA, eight items of coherence length data 9.32 to 10.65 are calculated from left to right for center wavenumbers k(0·δt) to k(7·δt). These eight items of coherence length data correspond to the time-coherence length correspondence data 316 obtained in step 404 in the flowchart of FIG. 4. As can be understood from FIG. 8 to be described later, it should be noted that wavenumbers k correspond to times in a wavelength sweep period one by one.

The coherence lengths in all the cells in Table 5 can be calculated by sequentially calculating the above eight items of coherence length data for different SOA current values. This corresponds to repeated execution of determining whether the SOA current value is the final value in step 405, changing the SOA current value to a new value in step 406, and sequentially acquiring the coherence lengths for different SOA current values in step 404 in the flowchart of FIG. 4.

Further, in relation to step 407 in the flowchart of FIG. 4, one SOA current value with the maximum coherence length is selected among eight items of coherence length data in a column corresponding to one wavenumber in Table 5. For example, in the case of the center wavenumber k(0·δt) in the leftmost column, the maximum coherence length 11.11 corresponds to a hatched cell and is acquired when the SOA current is 60 mA. Accordingly, when the wavenumber is k(0·δt), 60 mA is selected as an SOA current value with the maximum coherence length. In each center wavenumber out of the center wavenumbers k(0·δt) to k(7·δt), an SOA current value with the maximum coherence length is selected. That is, the SOA current values shown in hatched cells are selected. Incidentally, in the table of FIG. 5, cells without coherence lengths represent conditions of SOA current values and center wavenumbers in which the coherent beam is unstable and accordingly a calculation of the coherence length becomes abnormal or lasing per se becomes absent.

Accordingly, the swept light source of the present invention may be implemented as one further comprising a memory associated with the optical gain control means (111) and storing the optical gain control data, wherein the optical gain control data is generated by controlling the means for changing an optical gain at a set optical gain value by using the optical gain control signal of a constant value over the wavelength sweep period, measuring the coherence length at each of the times from the start of a sweep for each of the different optical gain values, generates a data set including the set optical gain value, one of the times, and the corresponding measured coherence length, selecting the set optical gain value providing the maximum coherence length among the measured coherence lengths in one of the times, and generating the optical gain control data from the one of the times and the selected set optical gain value.

The procedure of obtaining the SOA current waveform data has been described with reference to FIG. 3 to FIG. 5. This can also be further generalized like Example 1. The idea of the procedure of acquiring the SOA current waveform data described with reference to FIG. 3 to FIG. 5 is directly applicable even if the optical deflector 106 in FIG. 3 is replaced with "means for changing a wavelength," the optical deflector driver 113 with wavelength control means, the deflector drive signal with a wavelength control signal, the SOA 102 with "means for changing an optical gain," and the SOA current with an optical gain control signal or an optical gain.

The current source 111 in FIG. 3 acquires the SOA current value and operates so that an SOA current of a temporally constant value flows. It may comprise means (constant optical gain control means) for controlling the optical gain changing means so that the optical gain is temporally at a constant value when the SOA 102 is the means for changing an optical gain.

The current-time-coherence length correspondence data acquisition means 313 in FIG. 3 operates so that an applied current value for setting the SOA current of the SOA 102 is transferred to the current source 111, but when the constant optical gain control means controls the means for changing an optical gain instead of the current source 111, the optical gain value is input to the constant optical gain control means to change the optical gain of the optical gain changing means, and the time-coherence length correspondence data for each optical gain value is acquired from the time-coherence length correspondence data acquisition means 312. Then, the time-coherence length correspondence data for each optical gain, that is, optical gain-time-coherence length correspondence data is output. In this case, the current-time-coherence length correspondence data acquisition means 313 can be referred to as optical gain-time-coherence length correspondence data acquisition means.

Similarly, the maximum coherence length corresponding current selection means 314 obtains optical gain-time-coherence length correspondence data from the optical gain-time-coherence length correspondence data acquisition means 313 and selects an optical gain with the maximum coherence length for each time in one wavelength sweep. Then, data on the optical gain selected for each time (time-maximum coherence length gain correspondence data), that is, optical gain control data is output.

When a time interval δt of data acquisition of current-time-coherence length correspondence data acquired by the maximum coherence length corresponding current selection means 314 is different from a time interval δt' of a current controlled by the current source 111, these time intervals are made temporally consistent with each other. For example, although a time interval of time-maximum coherence length current correspondence data generated in the maximum coherence length corresponding current selection means 314 is δt, the time interval can be changed to δt' by linear or nonlinear interpolation.

For example, if δt>δt', current-coherence length correspondence data is acquired with temporal roughness and at low frequency. As a result, the current-time-coherence length correspondence data is also acquired with temporal roughness, which has the effect of reducing a processing time. When the highest frequency of the waveform of the time-maximum coherence length current correspondence data is f, all frequency components can be normally acquired without any aliasing distortion or the like if δt≤1/(2f).

Next, the procedure of acquiring the coherence length Lc in the time-coherence length correspondence data acquisition means 312 of FIG. 3 will be described in detail as Example 3. Accordingly, the swept light source of the present invention shown in Example 1 uses the SOA current waveform data obtained through the procedure shown in Example 2. Further, the SOA current waveform data obtained in Example 2 is obtained by using the apparatus and procedure for calculating the coherence length in Example 3 to be described next.

As described first, in the configuration shown in FIG. 3, the control unit 315 including, for example, a CPU (not limited to this) is provided in the swept light source shown in FIG. 1 in the first place. Further, both of the optical gain-time-coherence length correspondence data acquisition means 313 and the maximum coherence length corresponding current selection means 314 can be implemented by software operational processing using, for example, a CPU. Accordingly, the swept light source of the present invention can also be implemented as one comprising all the constituent elements in FIG. 3. Since the procedure in the flowchart of FIG. 4 of Example 2 is performed by using a wavelength swept beam, the SOA current waveform data can be acquired and updated even while the swept light source is used as an actual light source. Accordingly, the swept light source can be always optimally operated by updating the SOA current waveform data in an environment in which the swept light source operates according to variations in environmental conditions such as a temperature when using the swept light source.

Example 3

Figure 6:
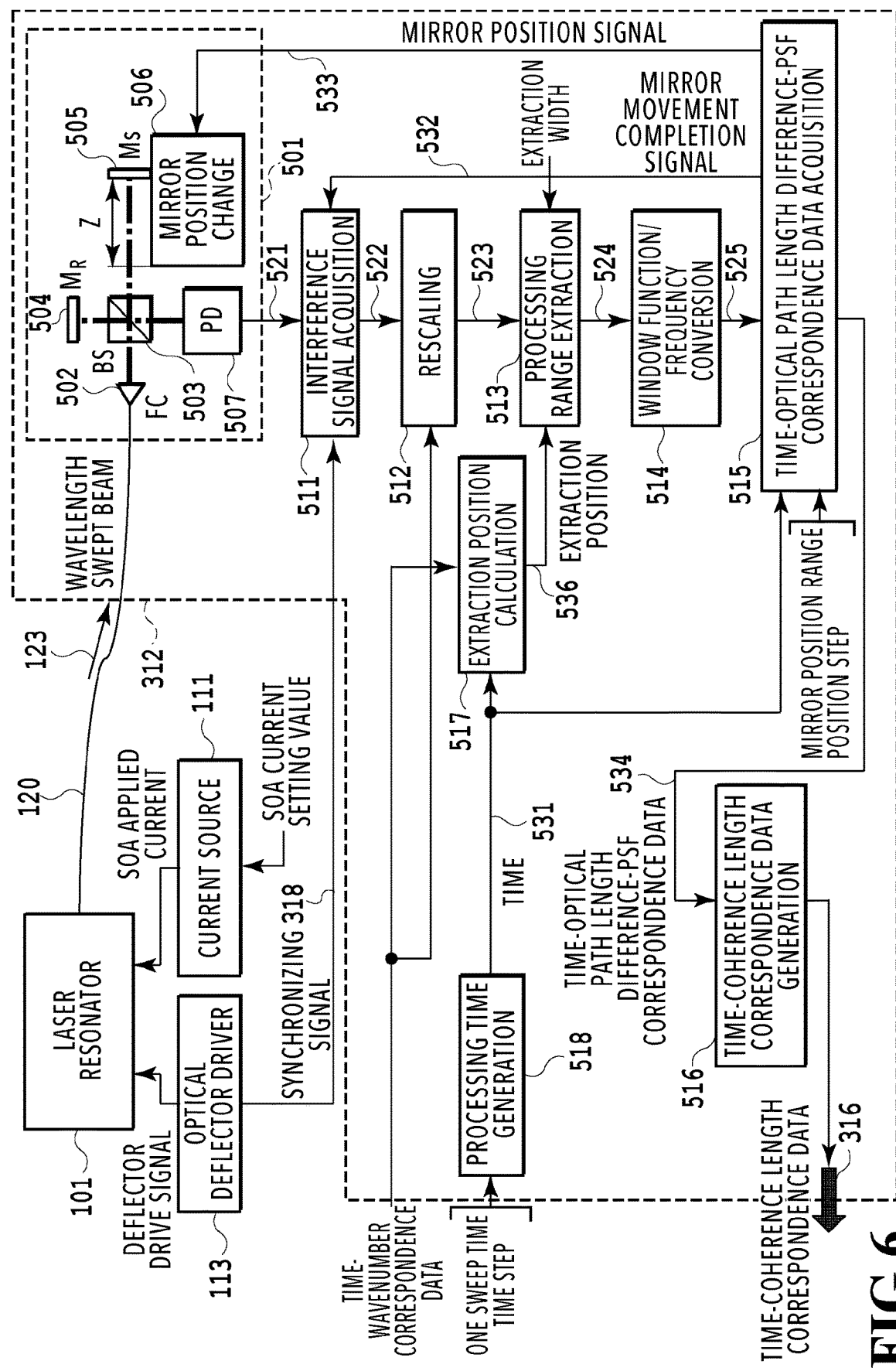
FIG. 6 is a diagram showing a configuration of a measuring apparatus of a coherence length in the present invention.

FIG. 6 is a diagram showing a configuration of an apparatus for measuring the coherence length for obtaining the SOA current waveform data used in the swept light source of the present invention. In FIG. 6, a detailed configuration of the time-coherence length correspondence data acquisition means 312 of FIG. 3 is shown in a dotted area. The laser resonator 101, the current source 111, and the optical deflector driver 113 in FIG. 6 are the same as those in the case of FIG. 3 of Example 2. A summary of the procedure of calculating the coherence length is as follows.

The time-coherence length correspondence data acquisition means 312 acquires a wavelength swept beam 123 corresponding to one wavelength sweep from the laser resonator 101 in synchronization with the synchronizing signal 318 from the optical deflector driver 113. After the acquisition of the wavelength swept beam corresponding to one wavelength sweep, an interference condition is changed by varying a difference between optical path lengths of two arms (a sample arm and a reference arm) of an interferometer 501 and a plurality of corresponding interference signals are acquired under different interference conditions. After rescaling of each of the acquired coherent beams 521, time-optical path length difference-PSF correspondence data acquisition means 515 calculates PSF for each optical path length difference for each time during the wavelength sweep. After that, a calculation is performed to obtain a differential value between two optical path length differences $2z_{PSFHALF1}=2q_{PSFHALF1}\delta z$ and $2z_{PSFHALF2}=2q_{PSFHALF2}\delta z$ having such a PSF peak value that the PSF peak value (strength) is ½ of the maximum value $PSF_{MAX}$ for each time. The absolute value of the differential value $2|z_{PSFHALF1}-z_{PSFHALF2}|=2\delta z|q_{PSFHALF1}-q_{PSFHALF2}|$ is defined as a coherence length Lc. Here, the positive and negative signs of the optical path length differences $2z_{PSFHALF1}$ and $2z_{PSFHALF2}$ are opposite to each other. The positive and negative of the optical path length differences and a mechanism of measurement will be described below.

On the assumption that a difference between an optical path length of the reference arm and an optical path length of the sample arm is an optical path length difference, the optical path length difference becomes negative when the optical path length of the sample arm is short and becomes positive in the opposite case. PSF is calculated for each optical path length difference. As the optical path length difference becomes closer to zero, interference becomes stronger and the PSF peak value increases. As the optical path length difference becomes longer, interference becomes weaker and the PSF peak value decreases. In the above measurement, both of the positive and negative optical path length differences are measured. Accordingly, the PSF peak value becomes maximum when the optical path length difference is close to zero and decreases as the optical path length difference becomes distant from zero. Since the coherence length is defined as a coherent distance until the interference strength is reduced by half from the maximum value, it is calculated as such an optical path length difference that the PSF peak value is reduced by half from its maximum value as described above.

If the PSF peak value decreases symmetrically with respect to the optical path length difference 2z=0 in both the positive and negative optical path length differences, measurement may be taken only for either of the positive and negative optical path length differences. In this case, a PSF peak value (strength) when the optical path length difference 2z is close to zero may be defined as $PSF_{MAX}$, a maximum value of PSF, an optical path length difference $2z_{PSFHALF}$ having a PSF peak value of $PSF_{MAX}/2$ may be doubled, and the length $4z_{PSFHALF}$ may be defined as a coherence length Lc at each time.

The PSF peak value when the optical path length difference 2z is close to zero is defined as $PSF_{MAX}$, the maximum value of PSF, because it is impossible to calculate PSF when the optical path length difference 2z is zero. PSF is calculated from the interference signal. A result of the Fourier transform of an envelope of the interference signal after resealing is substantially in the form of PSF. When the optical path length difference 2z is zero, a frequency corresponding to a carrier wave of the interference signal is zero and it is difficult to stably output the envelope of the interference signal. In coherence length measurement, PSF is generally acquired when the optical path length difference 2z is close to zero instead of acquiring PSF when the optical path length difference 2z is zero. It is also possible to perform function f(2z) fitting of PSF in a position where the optical path length difference 2z is zero by using a plurality of PSF peak points (2zq, $PSF_{peak\_q}$, where q is an integer for distinguishing the PSF peak points) of different optical path length differences instead of using $PSF_{peak\_MAX}$, the maximum value of PSF, and define a value f(0) of the function at which the optical path length difference 2z is zero as $PSF_{peak\_MAX}$, the maximum value of PSF. As the function f(x), for example, it is preferable to use a Gaussian function, a Lorentzian function, a polynomial of a function using x as an argument and the like.

Finally, correspondence data between each time and coherence length Lc during a wavelength sweep (time-coherence length correspondence data 316) is output.

Elements in the time-coherence length correspondence data acquisition means 312 in FIG. 6 are step elements of the procedure of calculating the coherence length Lc shown as functional blocks. That is, the elements other than the interferometer 501 represent functional blocks indicating processes that can be implemented by software operational processing by a CPU or the like. Accordingly, it should be noted that these elements except for the interferometer 501 can be implemented as software operational processing without any special hardware element other than a processor. A specific configuration example of the interferometer 501 will be described finally with reference to FIG. 9A to FIG. 9D. The function and operation of each functional block in FIG. 6 will be described below in detail.

The wavelength swept beam 123 from the laser resonator 101 is supplied to the interferometer 501. The interferometer 501 makes the wavelength swept beam 123 outgoing from the laser resonator 101 to a space by using a fiber collimator (FC) 502. The outgoing beam is split by a beam splitter (BS) 503 into two paths on the reference arm side and the sample arm side. The reference arm and the sample arm are equipped with a mirror 504 and a mirror 505, respectively. The beams incident on the respective arms are reflected, returned to the BS 503, and combined in the BS 503, and interferes. The coherent beam is incident on the photodetector (PD) 507 and is output as an electric signal (interference signal) 521 from the PD 507 to the outside of the interferometer 501.

The mirror 505 on the sample arm side is disposed on mirror position movable means 506 so as to externally control a distance between the BS 503 and the sample arm side mirror 505. That is, a difference z between the reference arm length and the sample arm length can be controlled from the outside of the interferometer 501.

After receiving a mirror movement completion signal 532 from the time-optical path length difference-PSF correspondence data acquisition means 515 to be described later, the interference signal acquisition means 511 acquires and outputs an interference signal 123 corresponding to one wavelength sweep in synchronization with the synchronizing signal obtained from the optical deflector driver 113. The mirror movement completion signal 532 is a signal indicating that the mirror position movable means 506 inside the interferometer 501 finishes one movement of the sample arm side mirror for changing the optical path length difference.

Rescaling means 512 rescales the interference signal 522 obtained from the interference signal acquisition means by using time-wavenumber correspondence data and outputs the rescaled interference signal 523, that is, i(k) (k is a wavenumber). Rescaling is described in detail in NPL 1. Operation is performed so as to resample the interference signal 522 and expand and contract the time axis. This converts the interference signal 522 into a signal having a temporally constant frequency.

Processing time generation means 518 generates time information 531 for performing processing in subsequent processes from a time T required for one wavelength sweep and a time step $\delta t$. More specifically, the processing time generation means 518 sequentially generates 0, $\delta t$, $2\delta t$, ..., $(n-1)\delta t$, where $n=T/\delta t$.

Extraction position calculation means 517 calculates a wavenumber corresponding to a time 531 obtained from the processing time generation means 518, namely $p\delta t$ (p is from 0 to n−1), that is, an extraction position 536 from the time-wavenumber correspondence data, and outputs the extraction position 536. More specifically, the extraction position calculation means 517 outputs an extraction position (wavenumber) $k(p\delta t)$.

Processing range extraction means 513 extracts the rescaled interference signal 523 obtained from a rescaling means 512, that is, i(k), in a range of $\pm\Delta k/2$ having its center at $k(p\delta t)$ by using an extraction width $\Delta k$ and the extraction position $k(p\delta t)$ obtained from the extraction position calculation means 518, and outputs the interference signal 523. At this time, for example, a window function having a center $k(p\delta t)$ and a half width $\pm\Delta k/2$ (such as a rectangular window, Gaussian window, Hanning window, Hamming window, or Blackman window) may be used for extraction.

Window function/frequency conversion means 514 applies a window function to the interference signal 524 obtained from the processing range extraction means 513, calculates a power spectrum (or a frequency distribution excluding phase, that is, the square root of a power spectrum) by using the Fourier transform, and outputs only a positive side. The output signal 525 is referred to as a point spread function (PSF).

It is not necessary to use the window function when a window in which the strength decreases with distance from the center such as a Gaussian window, Hanning window, Hamming window, or Blackman window is used as the processing range extraction means 513. Whether to use the window and the specification and type of window may be determined according to discontinuous points of the interference signal.

The time-optical path length difference-PSF correspondence data acquisition means 515 obtains PSF data from the window function/frequency conversion means 514 and stores the PSF data in association with a time $p\delta t$ (p is from 0 to n−1, where $n=T/\delta t$) output from the processing time generation means 518 and a double of the arm length difference z of the interferometer 150 ($2z=2q\delta z$; optical path length difference). An optical path length difference between the reference arm and the sample arm from the FC 502 to the PD 507 is 2z.

Following that, the mirror position signal 533 is transmitted to the mirror position movable means 506 incorporated into the interferometer 501 to change the position of the sample arm side mirror 505. After the completion of the position movement, the mirror movement completion signal 532 is output to the interference signal acquisition means 511. The position of the sample arm side mirror changed by the mirror position signal 533 is determined by using a mirror position range $\pm\Delta z$ ($\Delta z$ is a maximum distance from $z=0$) and a position step $\delta z$ preset to the time-optical path length difference-PSF correspondence data acquisition means 515. For example, $z=q\delta z$, where $m=\Delta z/\delta z$ and q is an integer from −m to m.

As the way the time-optical path length difference-PSF correspondence data acquisition means 515 detects whether the position movement of the sample arm side mirror 505 has been completed, it may be determined that the movement has been completed upon the acquisition of a movement completion signal 532 from the mirror position movable means 506. Alternatively, the position of the sample arm side mirror of the mirror position movable means 506 may be constantly monitored so that it is determined that the movement has been completed when the position corresponds to a mirror position signal or falls within a preset margin of error. Alternatively, it may be determined that the movement of the mirror has been completed after a lapse of time sufficient for the movement of the mirror.

The time-optical path length difference-PSF correspondence data acquisition means 515 outputs time-optical path length difference-PSF correspondence data 534 when p at the time $p\delta t$ obtained from the processing time generation means 518 reaches n−1. In the output time-optical path length difference-PSF correspondence data 534, PSF data in a range of time from 0 to $(n-1)\delta t$ and in a range of optical path length difference from $-m\delta z$ to $m\delta z$ is accumulated.

The time-coherence length correspondence data generation means 516 calculates a coherence length Lc of each time $p\delta t$ (p is from 0 to n−1) from the time-optical path length difference-PSF correspondence data 534 obtained from the time-optical path length difference-PSF correspondence data acquisition means 515, associates $p\delta t$ with Lc, and stores them. After all items of data corresponding to one wavelength sweep from time 0 to time $(n-1)\delta t$ are acquired and stored as single time-coherence length correspondence data, the time-coherence length correspondence data 316 is output.

As an example of the way to acquire the coherence length Lc, a PSF peak value corresponding to each optical path length difference is calculated for each time $p\delta t$ and a calculation is first performed to obtain a differential value between two optical path length differences $2z_{PSFHALF1}=2q_{PSFHALF1}\delta z$ and $2z_{PSFHALF2}=2q_{PSFHALF2}\delta z$ having a PSF peak value equal to ½ of $PSF_{MAX}$, the maximum value of the PSF peak value. The absolute value of the differential value $2|z_{PSFHALF1}-z_{PSFHALF2}|=2\delta z|q_{PSFHALF1}-q_{PSFHALF2}|$ is defined as a coherence length Lc. If the PSF peak value is not just equal to $PSF_{MAX}/2$ when $2z=2q\delta z$, it is also possible to perform linear or nonlinear interpolation by using several PSF peak positions and peak values from both sides of a position of 2z where the PSF peak value is equal to $PSF_{MAX}/2$ and calculate the position of 2z where the PSF peak value is equal to $PSF_{MAX}/2$. Here, the positive and negative signs of the optical path length differences $2z_{PSFHALF1}$ and $2z_{PSFHALF2}$ are opposite to each other. The positive and negative of the optical path length differences and a mechanism of measurement of the coherence length Lc will be further described below.

On the assumption that a difference between an optical path length of the reference arm and an optical path length of the sample arm is an optical path length difference, the optical path length difference becomes negative when the optical path length of the sample arm is short and becomes positive in the opposite case. PSF is calculated for each optical path length difference. As the optical path length difference becomes closer to zero, interference becomes stronger and the PSF peak value increases. As the optical path length difference becomes longer, interference becomes weaker and the PSF peak value decreases. In the above measurement, both of the positive and negative optical path length differences are measured. Accordingly, the PSF peak value becomes maximum when the optical path length difference is close to zero and decreases as the optical path length difference becomes distant from zero. Since the coherence length is defined as a coherent distance until the interference strength is reduced by half from the maximum value, it is calculated as such an optical path length difference that the PSF peak value is reduced by half from its maximum value as described above.

If the PSF peak value decreases symmetrically with respect to the optical path length difference 2z=0 in both the positive and negative optical path length differences, measurement may be taken only for either of the positive and negative optical path length differences. In this case, a PSF peak value (strength) when the optical path length difference 2z is close to zero may be defined as $PSF_{MAX}$, a maximum value of PSF, an optical path length difference $2z_{PSFHALF}$ having a PSF peak value of $PSF_{MAX}/2$ may be doubled, and the length $4z_{PSFHALF}$ may be defined as a coherence length Lc. If the PSF peak value is not just equal to $PSF_{MAX}/2$ when $2z=2q\delta z$, it is also possible to perform linear or nonlinear interpolation by using several PSF peak positions and peak values from both sides of a position of 2z where the PSF peak value is equal to $PSF_{MAX}/2$ and calculate the position of 2z where the PSF peak value is equal to $PSF_{MAX}/2$. At this time, the coherence length Lc is 4z, which is a double of 2z.

As another way to measure the coherence length Lc, it is also possible to perform Gaussian fitting of PSF peak positions and peak values of different optical path length differences and define the full width at half maximum of the Gaussian function as the coherence length Lc. Besides the Gaussian function, a Lorentzian function, a polynomial of a function and the like are preferable.

If the PSF peak value decreases symmetrically with respect to the optical path length difference 2z=0 in both the positive and negative optical path length differences, measurement may be taken only for either of the positive and negative optical path length differences. In this case, a PSF peak value (strength) when the optical path length difference 2z is close to zero may be defined as $PSF_{MAX}$, a maximum value of PSF, an optical path length difference $2z_{PSFHALF}$ having a PSF peak value of $PSF_{MAX}/2$ may be doubled, and the length $4z_{PSFHALF}$ may be defined as a coherence length Lc at each time. The PSF peak value when the optical path length difference 2z is close to zero is defined as $PSF_{peak\_MAX}$, the maximum value of PSF, because it is impossible to calculate PSF when the optical path length difference 2z is zero.

PSF is calculated from the interference signal. A result of the Fourier transform of an envelope of the interference signal after resealing is substantially in the form of PSF. When the optical path length difference 2z is zero, a frequency corresponding to a carrier wave of the interference signal is zero and it is difficult to stably output the envelope of the interference signal. For this reason, in coherence length measurement, PSF is generally acquired when the optical path length difference is close to zero instead of acquiring PSF when the optical path length difference 2z is zero. It is also possible to perform function f(2z) fitting of PSF in a position where the optical path length difference 2z is zero by using a plurality of PSF peak points (2zq, $PSF_{peak\_q}$, where q is an integer for distinguishing the PSF peak points) of different optical path length differences instead of using $PSF_{peak\_MAX}$, the maximum value of PSF, and define a value f(0) of the function at which the optical path length difference 2z is zero as $PSF_{peak\_MAX}$, the maximum value of PSF. As the function f(x), for example, it is preferable to use a Gaussian function, a Lorentzian function, a polynomial of a function using x as an argument and the like.

Next, the procedure of calculating the coherence length Lc by using the time-coherence length correspondence data acquisition means 312 will be described with reference to a flowchart of FIG. 7.

Figure 7:
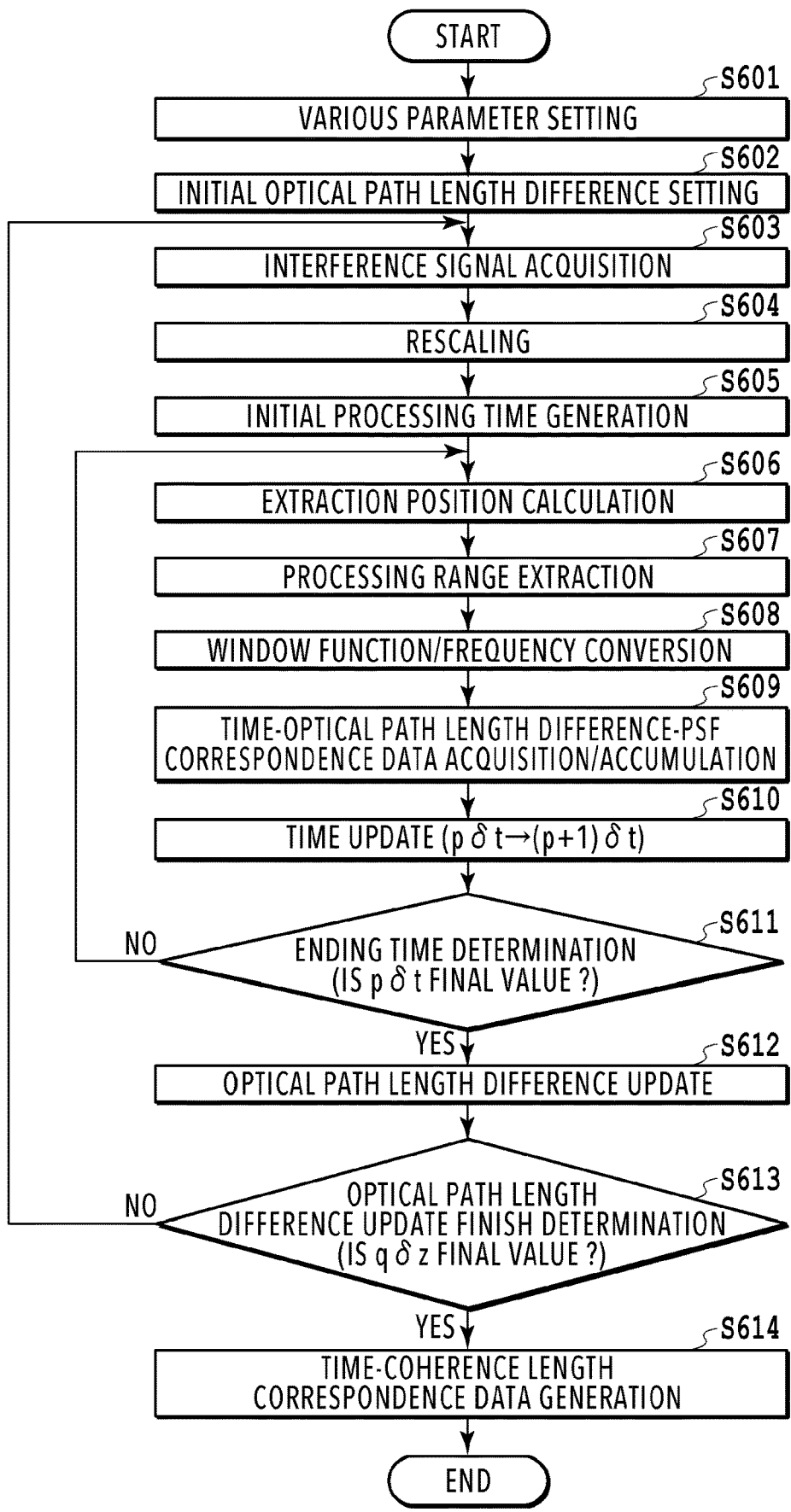
FIG. 7 is a flowchart of a coherence length measurement procedure in the present invention.

FIG. 7 is a flowchart showing a procedure of measuring the coherence length for obtaining the SOA current waveform data used in the swept light source of the present invention. In the following description, numerals assigned to elements (boxes) of the flowchart of FIG. 7 correspond to step numbers.

Procedure 600 of calculating the coherence length Lc is started by setting various parameters in step 601. In step 601, the parameters are set as follows.

A range $\pm\Delta z$ of a mirror position and a step $\delta z$ of the mirror position are set to the time-optical path length difference-PSF correspondence data acquisition means 515.

A single sweep time T and a time step $\delta t$ are set to the processing time generation means 518.

Time-wavenumber correspondence data k(t) is set to the rescaling means 512 and the extraction position calculation means 517.

Procedure 600 sets an initial optical path length difference in step 602. The time-optical path length difference-PSF correspondence data acquisition means 515 outputs an initial mirror position signal 533 to the mirror movable means 506. The mirror position movable means 506 moves the sample arm side mirror 505 to a position (initial position) according to the mirror position signal 533.

Here, the mirror position signal 533 is a signal of some kind representing a position z of the mirror. The mirror position signal can use an electric signal of some kind. z may be indicated as a voltage value, and positional information about z may be transmitted by a command in an RS-232C or USB interface. That is, an electric signal of some kind corresponding to $z=q\delta z$ is referred to as a mirror position signal. As described above, the mirror position signal 533 indicates $z=q\delta z$, where $m=\Delta z/\delta z$ and q is an integer from −m to m. The sample arm is moved to a position of $-m\delta z$ in the case of ascending order and moved to a position of $m\delta z$ in the case of descending order. After moving the mirror, the time-optical path length difference-PSF correspondence data acquisition means 515 outputs the mirror movement completion signal 532 to the interference signal acquisition means 511.

Procedure 600 acquires the interference signal in step 603. Upon the receipt of the mirror movement completion signal 532 from the time-optical path length difference-PSF correspondence data acquisition means 515, the interference signal acquisition means 511 acquires an interference signal 521 corresponding to one wavelength sweep from the interferometer 501 in synchronization with the synchronizing signal 318 obtained from the optical deflector driver 113 and outputs the acquired interference signal 521.

Procedure 600 carries out rescaling in step 604. The rescaling means 512 rescales the interference signal 521 corresponding to one wavelength sweep obtained from the interference signal acquisition means 511 by using time-wavenumber correspondence data.

Procedure 600 generates an initial processing time in step 605. The processing time generation means 518 generates an initial time 531 from a time T required for one wavelength sweep and a time step $\delta t$ and outputs the initial time 531. More specifically, the processing time generation means 518 outputs zero as an initial time when time information is generated in ascending order such as 0, $\delta t$, $2\delta t$, ..., $(n-1)\delta t$ (where $n=T/\delta t$) as time information.

Procedure 600 calculates an extraction position in step 606. The extraction position calculation means 517 calculates a wavenumber 536 corresponding to the time $p\delta t$ (p is from 0 to n-1) obtained from the processing time generation means 518, that is, $k(p\delta t)$, based on the time-wavenumber correspondence data, and outputs the wavenumber 536. Here, it should be noted that the extraction position indicates a time for extracting the interference signal in the subsequent steps. It should be remembered that in a wavelength sweep period of the swept light source, a time from the start of a wavelength sweep corresponds to a wavelength or wavenumber of a laser output beam one by one.

Procedure 600 extracts a processing range in step 607. The processing range extraction means 513 extracts the rescaled interference signal 523 obtained from the rescaling means 512, that is, i(k), in a range of $\pm\Delta k/2$ having its center at $k(p\delta t)$ by using an extraction width $\Delta k$ and the extraction position 536 obtained from the extraction position calculation means 517, that is, $k(p\delta t)$, and outputs the extracted interference signal 524. At this time, for example, a window function having a center $k(p\delta t)$ and a half width $\pm\Delta k/2$ such as a rectangular window, Gaussian window, Hanning window, Hamming window, or Blackman window may be used.

Procedure 600 applies a window function to the extracted interference beam and carries out frequency conversion in step 608. The window function/frequency conversion means 514 applies a window function to the interference signal 524 obtained from the processing range extraction means 513, calculates a power spectrum (or a frequency distribution excluding phase, that is, the square root of a power spectrum) by using the Fourier transform, and outputs only a positive side of frequency. The output signal 525 is a point spread function (PSF). The use of the window function in this step is not essential and may be omitted. In particular, in the case of using a window function other than a rectangular window in step 607, it is not necessary to use the window function in this step.

Procedure 600 acquires and accumulates time-optical path length difference-PSF correspondence data in step 609. The time-optical path length difference-PSF correspondence data acquisition means 515 accumulates PSF data 534 obtained from the window function/frequency conversion means 514 in storage means in association with a time $p\delta t$ and an optical path length difference $2z=2q\delta z$. As the storage means, a memory associated with the swept light source can be used as described in Example 1.

Procedure 600 performs time update in step 610. The processing time generation means 518 updates a variable p at the time $p\delta t$. More specifically, p+1 is set as updated p. That is, $(p+1)\delta t$ is set as an updated time.

Procedure 600 determines an ending time in step 611. The time-optical path length difference-PSF correspondence data acquisition means 515 determines whether the time $p\delta t$ updated by the processing time generation means 518 is an ending time. If p is not n-1, the procedure returns to step 606. If p=n-1, the procedure advances to step 612.

Procedure 600 updates the optical path length difference in step 612. The time-optical path length difference-PSF correspondence data acquisition means 515 updates a variable q of $z=q\delta z$ to update the optical path length difference $2z$. The time-optical path length difference-PSF correspondence data acquisition means 515 performs update so that a value obtained by adding one to q is new q in the case of ascending order and performs update so that a value obtained by subtracting one from q is new q in the case of descending order.

Procedure 600 determines whether the optical path length difference update has been finished in step 613. The time-optical path length difference-PSF correspondence data acquisition means 515 determines whether $z=q\delta z$ is a final value. If $z=q\delta z$ is not the final value, a mirror position signal 533 indicating $z=q\delta z$ is transmitted to the mirror position movable means 506. At this time, the mirror position movable means 506 moves the sample arm side mirror 505 to a position according to the mirror position signal 533. After the movement of the mirror, the time-optical path length difference-PSF correspondence data acquisition means 515 outputs the mirror movement completion signal 532 and returns to step 603. If $z=q\delta z$ is the final value, the accumulated time-optical path length difference-PSF correspondence data is output. It should be noted that the final value of $z=q\delta z$ is $m\delta z$ in the case of updating z in ascending order and is $-m\delta z$ in the case of updating z in descending order, where $m=\Delta z/\delta z$.

Procedure 600 generates time-coherence length correspondence data in step 614. The time-coherence length correspondence data generation means 516 calculates a coherence length Lc at each time $p\delta t$ (p is from 0 to n-1) from the time-optical path length difference-PSF correspondence data acquired from the time-optical path length difference-PSF correspondence data acquisition means 515, associates $p\delta t$ with Lc, and stores them. After all items of data corresponding to one wavelength sweep from time 0 to time $(n-1)\delta t$ are acquired and stored as single time-coherence length correspondence data 316, the time-coherence length correspondence data 316 is output. Upon the completion of step 614, a coherence length corresponding to each wavenumber is calculated for one SOA current. That is, referring again to FIG. 5, a coherence length corresponding to each wavenumber with a center wavenumber of from $k(0\cdot\delta t)$ to $k(7\cdot\delta t)$ is calculated for one SOA current value.

Accordingly, in the swept light source of the present invention, the optical gain control data can also be implemented as one including a coherence length (316) calculated from a plurality of interference signals (521) based on the interference signals corresponding to respective different interference conditions generated by the interferometer configured to cause the wavelength swept beam (123) to interfere under different interference conditions, the swept beam (123) being output from the laser resonator set at the set optical gain value and obtained from one wavelength sweep of the wavelength sweep period.

Figure 8:
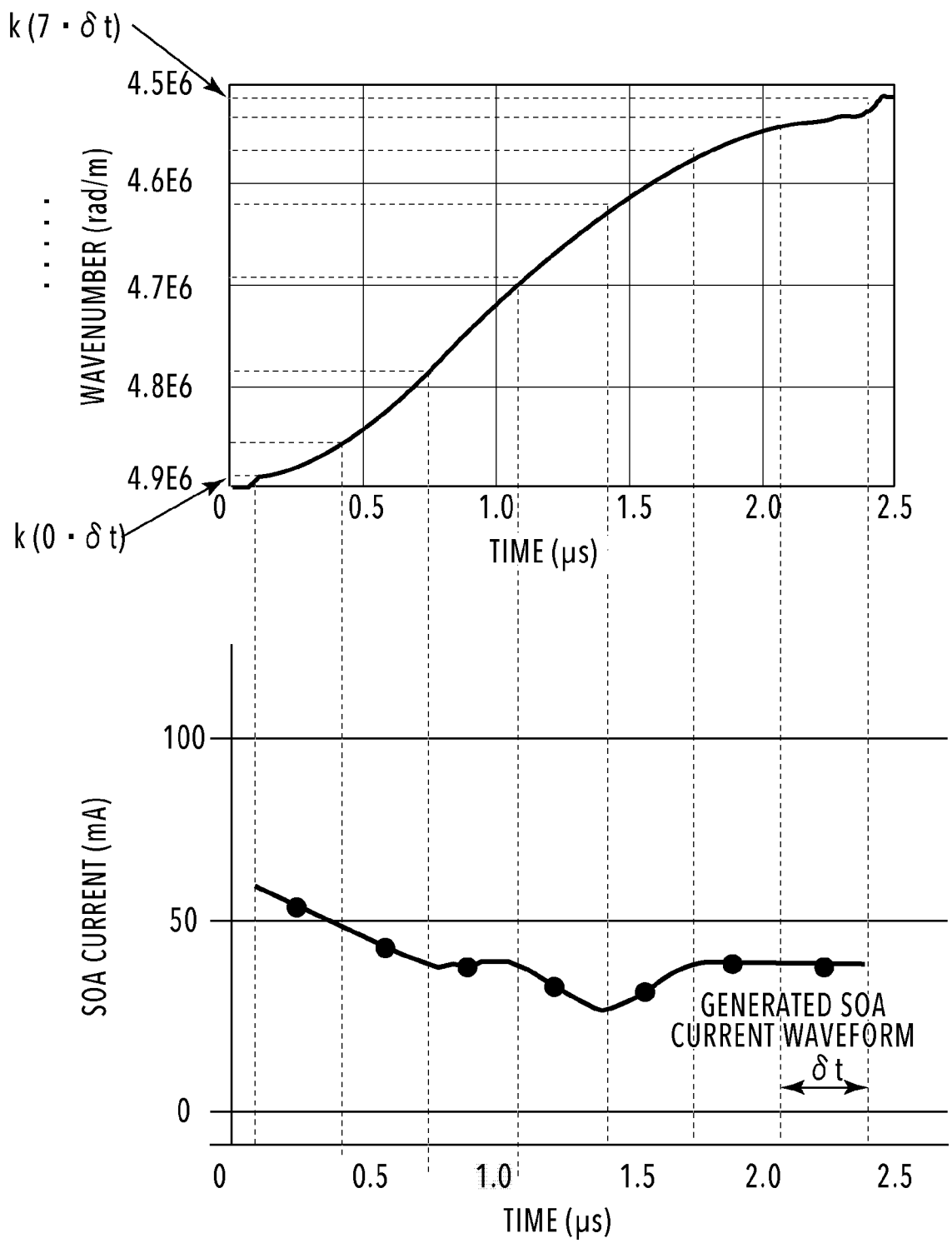
FIG. 8 is an explanatory diagram of an SOA current acquired at regular time intervals by the swept light source of the present invention.

FIG. 8 is a diagram showing motion of an SOA current obtained at regular time intervals by the swept light source of the present invention. FIG. 8 shows an SOA current waveform obtained in the procedure of obtaining the SOA current waveform data of Example 2 based on the coherence lengths Lc obtained in Example 3 described above. As described above with reference to FIG. 2, coherence lengths are calculated at regular wavenumber intervals and an SOA current with the maximum coherence length is determined in FIG. 2. In the case of FIG. 2, when viewed from the time axis, the intervals between the determined SOA currents are irregular. Although the coherence lengths can be calculated at regular frequency intervals, the time intervals between the determined SOA currents are irregular also in this case.

In contrast to this, in the SOA current waveform of FIG. 8, calculation times are determined so that the time intervals are regular, that is, the intervals ($\delta t$) between times of coherence length calculation are uniform as described in Example 3. Accordingly, the SOA current can be interpolated more conveniently and quickly by the Fourier transform of zero-padded data.

Although FIG. 2 and FIG. 8 only show eight points of wavenumber k at which the coherent lengths are calculated, it is preferable to calculate coherence lengths corresponding to 5,000 to 10,000 points at most according to the wavelength sweep speed in actuality. In addition, although the SOA current is obtained by a current variable step of 10 mA in the table of FIG. 5, it is needless to say that it can be obtained by a finer step.

Figure 9A:
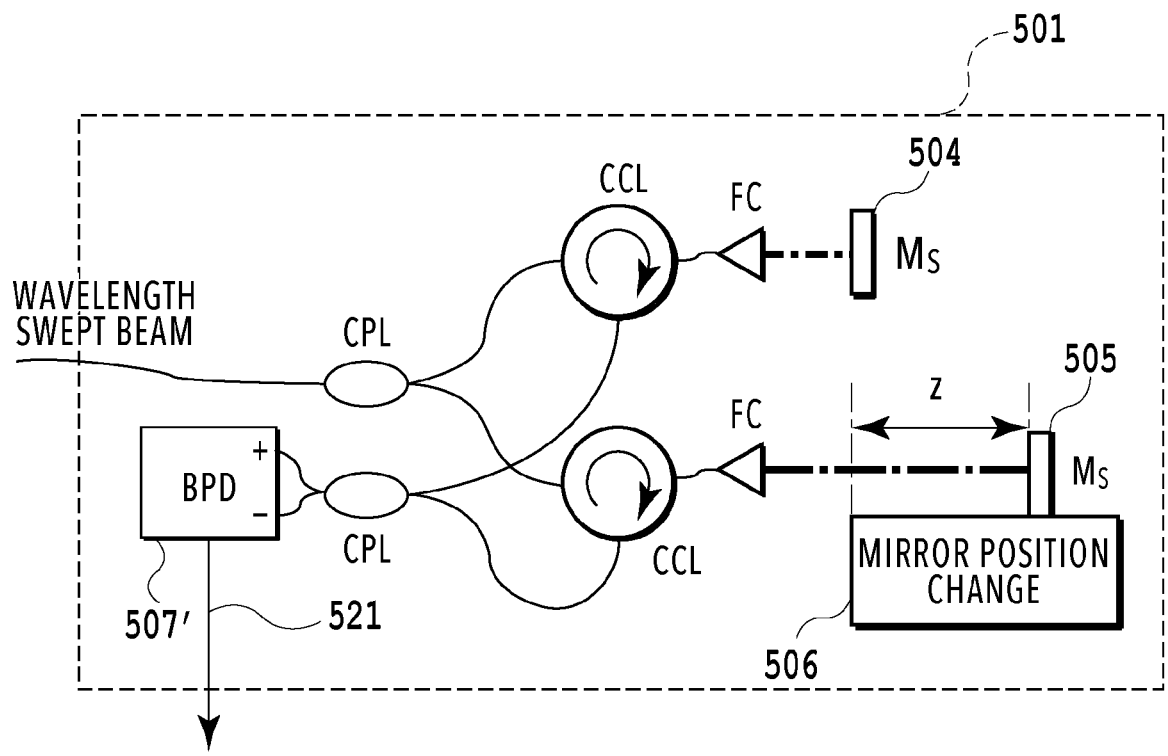
FIG. 9A is a diagram showing a specific configuration example of an interferometer shown in FIG. 6.
Figure 9B:
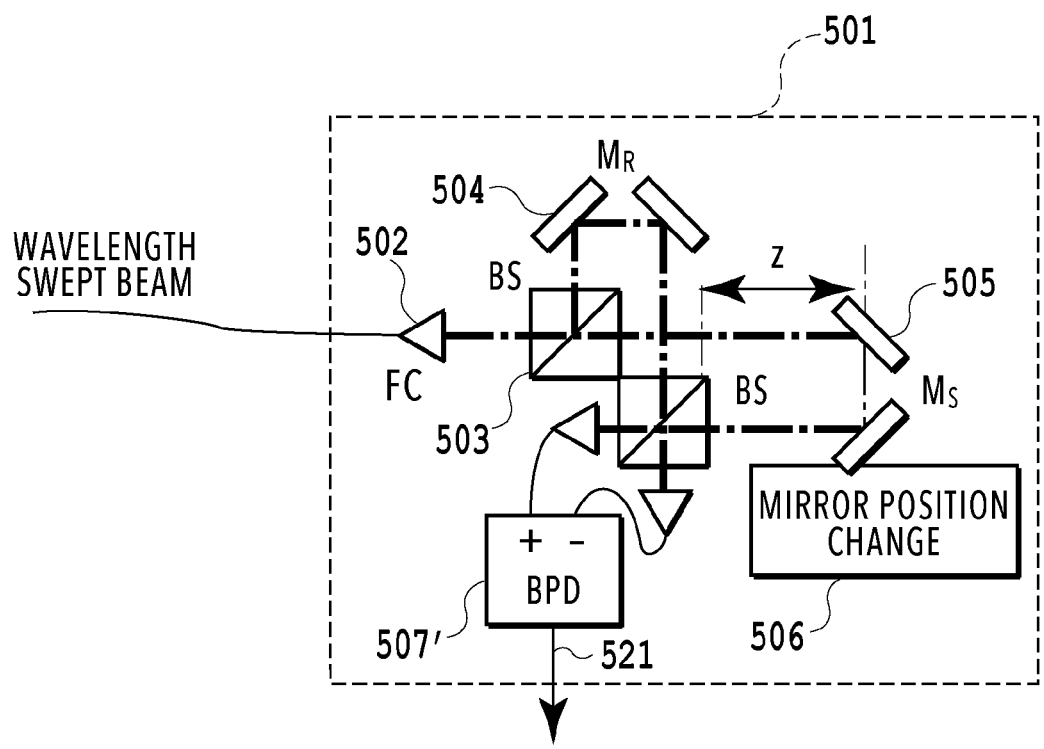
FIG. 9B is a diagram showing another specific configuration example of the interferometer shown in FIG. 6.
Figure 9C:
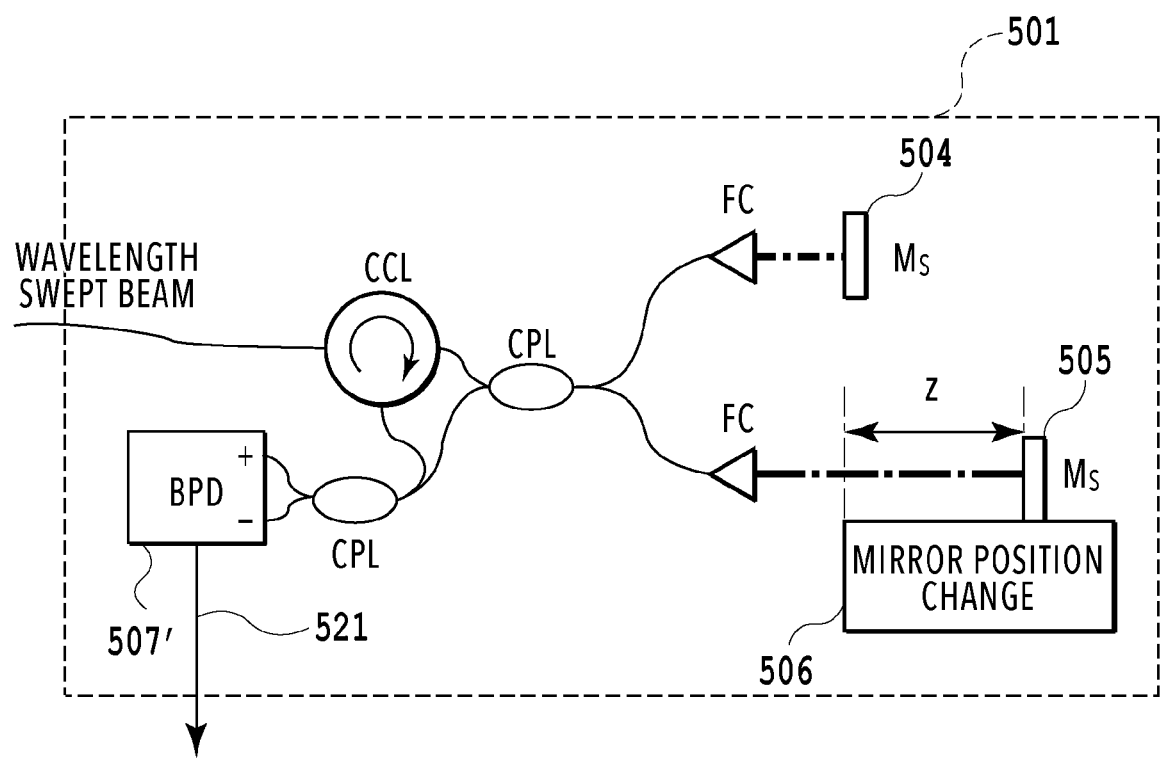
FIG. 9C is a diagram showing another specific configuration example of the interferometer shown in FIG. 6.
Figure 9D:
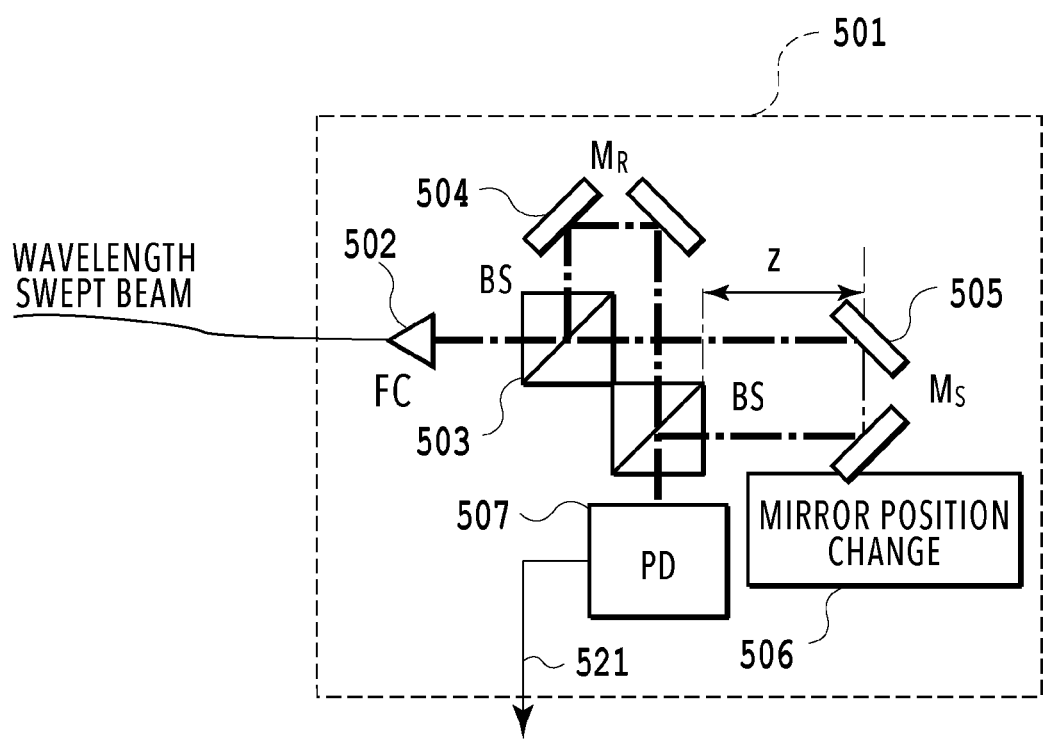
FIG. 9D is a diagram showing another specific configuration example of the interferometer shown in FIG. 6.

FIG. 9A to FIG. 9D are diagrams showing a specific configuration example of the interferometer in the time-coherence length correspondence data acquisition means shown in FIG. 6. Although FIG. 6 shows a configuration example of the Michelson interferometer 501, it can be implemented by various Mach-Zehnder mechanisms as shown in FIG. 9A to FIG. 9D. FIG. 9A shows a Mach-Zehnder type (a difference output type, a fiber interferometer type), FIG. 9B shows a Mach-Zehnder type (a difference output type), FIG. 9C shows a Mach-Zehnder type (a difference output type, a fiber interferometer type), and FIG. 9D shows a Mach-Zehnder configuration. In FIG. 9A to FIG. 9D, abbreviations are used as follows: FC is a fiber collimator, CPL is a coupler, CCL is a circulator, BPD is a balanced detector, $M_S$ is a sample arm mirror, and $M_R$ is a reference arm mirror.

As an example of improvement in the coherence length Lc in the swept light source of the present invention, in a laser resonator using a galvano scanner and capable of varying the SOA current in a range between 0 to 600 mA, a coherence length Lc was able to increase 1.7 times over an entire sweep wavelength range when a wavelength is swept repeatedly at 20 kHz in a wavelength sweep range with a center wavelength of 1310 nm±40 nm and a wavelength sweep period is 25 µs.

As described above in detail, the coherence length of the wavelength swept output beam in the wavelength sweep period can be constantly kept long by the swept light source of the present invention and the method of generating drive data for the swept light source. This can increase the PSF strength in the SS-OCT device and improve the image detection sensitivity of the SS-OCT device.

In the swept light source of the first embodiment described above, the means for changing an optical gain (SOA) is controlled so that the optical gain in the laser resonator has an optical gain value slightly higher than the optical gain in a state of the lasing threshold over the entire wavelength range of a wavelength sweep. However, depending on the configuration and type of laser resonator, the coherence length may become maximum at an optical gain value far higher than that close to the lasing threshold. Even in this case, the coherence length of an output beam can be kept long over the entire sweep wavelength range by calculating the SOA current waveform providing the maximum coherence length like the swept light source of the present embodiment.

Second Embodiment

In the first embodiment described above, SOA current waveform data on an SOA used for the swept light source is acquired in advance and the swept light source is operated based on the acquired data. Accordingly, the step of acquiring the SOA current waveform data is necessary before the normal operation of the swept light source. In addition, the procedure of calculating coherence lengths for acquiring the SOA current waveform data described in Example 3 requires the interferometer 501 in the processing block diagrams of FIG. 6 and FIG. 9A to FIG. 9D, that is, requires a constituent element originally unnecessary for an apparatus of the swept light source.

The present embodiment shows an example of keeping the coherence length of a wavelength swept output beam in a wavelength sweep period constantly long like the first embodiment by using simpler constituent elements and processing based on output levels of the light source without calculating a coherence length at each swept wavelength.

As described above as to the conventional technique, in an SS-OCT system, an image becomes unclear in the case of observing a layer deeper than ¼ of the coherence length. Accordingly, a swept light source having a long coherence length is required. In other words, in the swept light source, an instantaneous laser linewidth should be kept narrow. The inverse of the instantaneous linewidth is a coherence length.

Here, the operation of the SOA is considered again. The SOA is characterized by its wide range and short carrier life and is excellent also in practicality because it can be driven directly by current injection by using an electric signal without the need for optical pumping. On the other hand, it is known that a laser linewidth increases with an increase in injected current not only in the swept light source but also in a general continuous-wave semiconductor laser.

Figure 10:
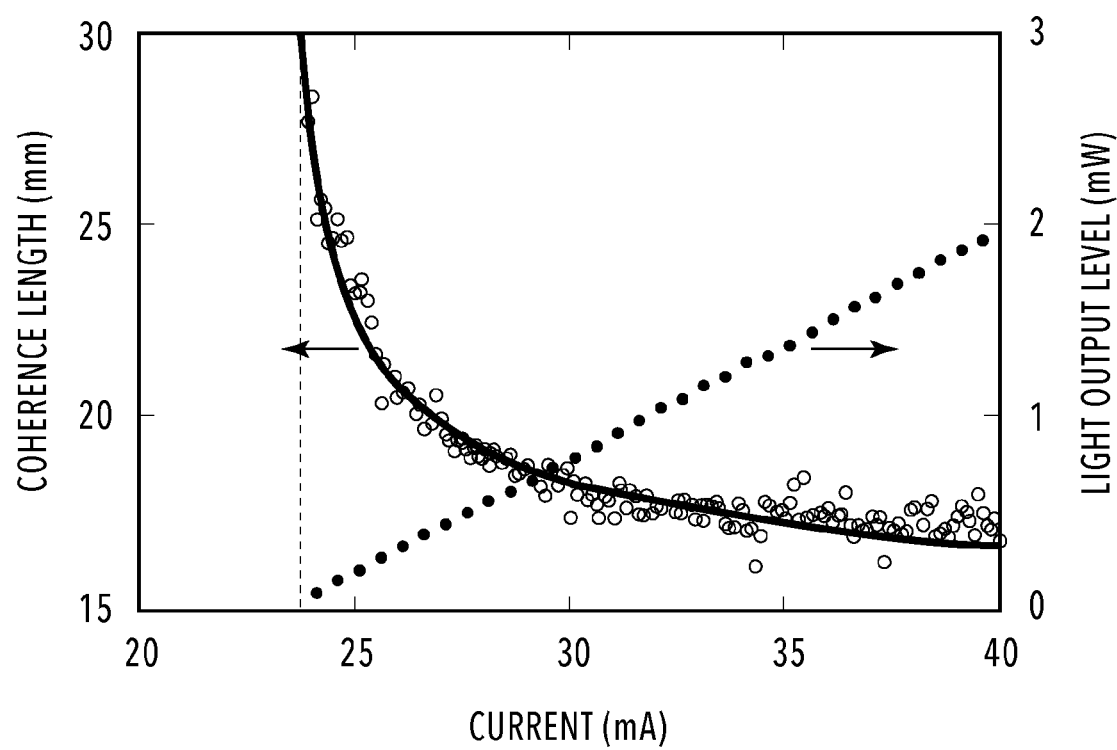
FIG. 10 is a diagram showing a relationship among an SOA injected current, light output power, and coherence length.

FIG. 10 is a diagram showing a relationship among an injected current into the SOA, light output power, and a coherence length in the swept light source. The horizontal axis represents an injected current into the SOA and the vertical axis represents a coherence length and an output light level at a particular wavelength. As is clear from FIG. 10, the output light level increases but the coherence length decreases with an increase in the injected current into the SOA. More specifically, in FIG. 10, the coherence length rises rapidly when the SOA injected current is equal to or lower than 25 mA and close to the lasing threshold at a particular wavelength. That is, it is shown that in the swept light source, a longer coherence length can be obtained by driving the SOA near the lasing threshold at which the output light level increases. However, since the gain spectrum of the SOA depends on a wavelength, there is a problem that such a drive condition that the coherence length is elongated near the lasing threshold cannot be realized over the entire wavelength range in the case of SOA driving by using a normal constant current. In the swept light source of the first embodiment, this problem is solved by acquiring the time-SOA current waveform data for maximizing the coherence length in advance.

The swept light source of the present embodiment operates so as to keep a long coherence length over the entire sweep wavelength range by a simpler control method by monitoring the output light level in real time during the normal operation of the swept light source. The injected current into the SOA is controlled based on the output light level in conjunction with the operation of the means (wavelength selection element) for changing a lasing wavelength in the swept light source. In this manner, the instantaneous linewidth of the light source is narrowed and the coherence length is maximized by driving the SOA near the lasing threshold at each wavelength in the sweep wavelength range. In the swept light source of the present embodiment, only repeating a control step in conjunction with a wavelength sweep to be described later several times or more enables the coherence length to immediately approach a state of extending to at least a certain extent and saves the need to measure the coherence length during the wavelength sweep operation, which is the normal operation of the light source. A target value of light output power to be described later can be determined only by a manufacture adjustment stage of the swept light source apparatus without the need for the interferometer, which is necessary for calculating the coherence length in the swept light source of the first embodiment.

Figure 11:
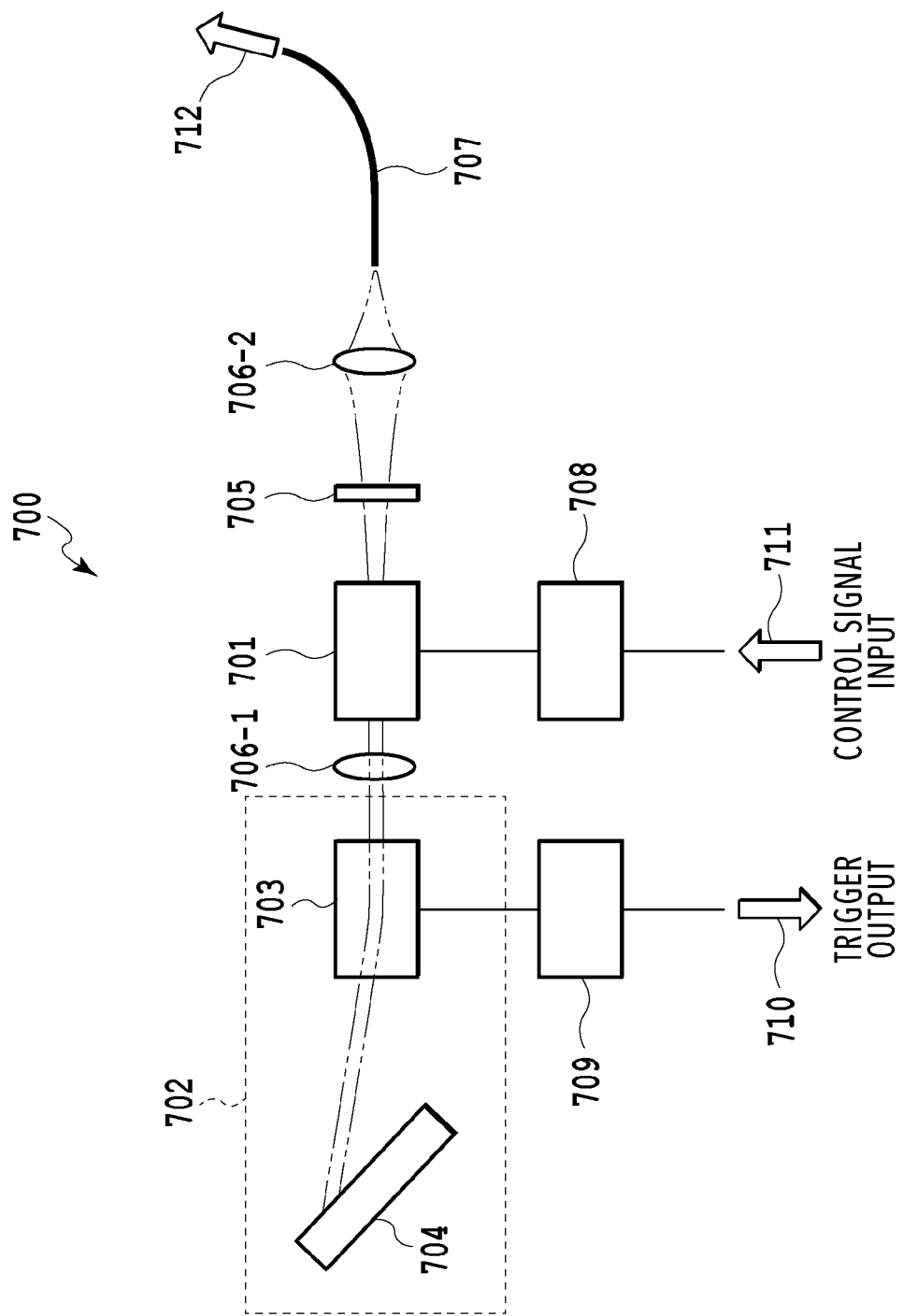
FIG. 11 is a diagram showing a configuration of a swept light source of a second embodiment of the present invention.

FIG. 11 is a diagram showing a configuration of a swept light source of a second embodiment of the present invention. As constituent elements, a swept light source 700 includes an optical amplifier (SOA) 701 configured to amplify a beam, means for changing a lasing wavelength (wavelength selection element) 702 configured to selectively filter a beam of a particular wavelength range, an optical feedback element 705 such as a half mirror configured to branch part of a beam and return it to the light source, a driver device 709 configured to drive the means for changing a lasing wavelength 702, and a driver device 708 configured to drive the optical amplifier (SOA) 701. A plurality of optical elements included in the means for changing a lasing wavelength (wavelength selection element) 702 are configured as optical resonators capable of optically forming a round-trip optical path so that a beam can repeatedly go and return between the elements as will be described later.

One beam output from the optical amplifier (hereinafter referred to as an SOA) 701 is incident on the means for changing a lasing wavelength (hereinafter referred to as a wavelength selection element) 702. The wavelength selection element 702 here includes an optical deflector 703 and a diffraction grating 704. In the first embodiment, the diffraction grating is in Littman configuration. In contrast, in the swept light source of the present embodiment, the diffraction grating 704 is configured under a Littrow condition in which a diffraction beam is diffracted in the opposite direction of an incident beam in the same axis. As the wavelength selection element 702, it is also possible to use an element based on another wavelength selection principle such as a Fabry-Perot filter.

As the optical deflector 703, it is possible to use a galvano mirror, MEMS mirror, KTN optical deflector or the like. The other output beam from the SOA 701 is partly reflected on the optical feedback element 105 and returned to a resonator configured between the diffraction grating 704 and the optical feedback element 705. The beam that has passed through the optical feedback element 705 is directly concentrated as an output beam by a lens 706, is combined with an optical fiber 707, and becomes an output beam 712 of the light source. The resonator in the swept light source of FIG. 11 has a linear configuration, but this is an example and it is also possible to use a ring resonator in which optical elements are connected via an optical fiber.

The operation of narrowing a linewidth of an output beam in the resonator of the swept light source is described as follows. A beam output from the SOA 701 has a wide optical spectrum. The spectrum filtered in the wavelength selection element 702 and cut by the shape of the filter of the wavelength selection element 702 is incident on the SOA 701 again. At this time, the beam is amplified by the SOA 710 and output from the opposite end face of the SOA 701. Part of the beam is returned to the SOA 701 by the optical feedback element 705. In this manner, the beam loops in the optical resonator multiple times during a certain period. Since a selected wavelength of the wavelength selection element 702 is changed in the swept light source, the certain period is determined by a time when a filter spectrum crosses over a particular wavelength. A beam passes through the wavelength selection element 102 multiple times during the crossing time, with the result that a linewidth of the output beam is narrowed by the cumulative effect of filtering.

As described above with reference to FIG. 10, in the swept light source, the threshold of lasing has dependence on a wavelength under the influence of a gain spectrum of the SOA 701 to be used, dependence of a resonator loss on a wavelength and the like. Accordingly, an optimum SOA driving current value for keeping the coherence length long differs according to a wavelength. In the swept light source of the present embodiment, light output power from the light source is monitored and controlled in order to set the SOA at an optimum SOA driving current value different according to a wavelength.

The light output power from the swept light source depends on the number of amplifications in the SOA 701. On the other hand, as described above, the coherence length depends on the number of passes through the wavelength selection element 702. Thus, each of the light output power and the coherence length is associated with the number of loops of the laser beam in the resonator. On the assumption that the transmission characteristics of the wavelength selection element 702 have a spectrum in the Gaussian shape, the shape function $F(\lambda)$ is expressed by the following formula.

$$F(\lambda) \approx \eta \exp\left(-\frac{(\lambda - \lambda_c)^2}{\Delta\lambda_F^2 / 4\ln 2}\right) \quad \text{Formula (1)}$$

Here, $\eta$ represents a maximum transmittance of the wavelength selection element 702, $\lambda_C$ represents a center wavelength, and $\Delta\lambda_F$ represents a full width at half maximum of the spectrum. A state where a net gain $G_{net}$ made in a portion other than the wavelength selection element 702 when the beam loops one time in the optical resonator balances with a loss made in the wavelength selection element 702 is a state of a lasing threshold. Since a loss in the optical resonator is determined by the characteristics of each constituent element, the net gain $G_{net}$ changes mainly according to a gain of the SOA 701.

A loss L in the wavelength selection element 702 is expressed by the following formula using dB.

$$L = 10 \log \{F(\lambda)\} \quad \text{Formula (2)}$$

From the condition of the lasing threshold, a relationship of the following formula is calculated between the net gain $G_{net}$ and the loss L.

$$G_{net} + L = 0 \quad \text{Formula (3)}$$

In addition, the following relational formulas are acquired by substituting Formula (1) and Formula (2) into Formula (3).

$$\lambda - \lambda_c = \frac{\Delta\lambda_F}{2}\sqrt{\frac{\ln(\eta/q)}{\ln 2}} \quad \text{Formula (4)}$$

$$q = 10^{-G_{net}/10} \quad \text{Formula (5)}$$

Here, the left side ($\lambda - \lambda_C$) of Formula (4) represents a half width of the wavelength range above the lasing threshold when the net gain $G_{net}$ is larger than the loss L. Thus, a full width $\Delta\lambda_{\text{eff}}$ of the wavelength region above the lasing threshold is calculated by doubling the half width of Formula (4) and combining Formula (5) as follows.

$$\Delta\lambda_{\text{eff}} = \Delta\lambda_F \cdot \sqrt{\log_2\left(\frac{\eta}{q}\right)} \quad \text{Formula (6)}$$

$\Delta\lambda_{\text{eff}}$ in Formula (6) represents an effective wavelength selection width related to lasing and is also referred to as an effective wavelength selection width. It should be noted that when the spectrum width $\Delta\lambda_F$ of the wavelength selection element 702 can be regarded as being unchanged irrespective of a wavelength (condition 1), the effective wavelength selection width $\Delta\lambda_{\text{eff}}$ related to lasing is determined by the net gain $G_{net}$, that is, a drive current of the SOA 701. This means that the effective wavelength selection width $\Delta\lambda_{\text{eff}}$ can be kept constant by keeping the net gain $G_{net}$ constant at each wavelength. In addition, on the assumption that the selected wavelength of the wavelength selection element 702 changes with a uniform speed in the sweep wavelength range (condition 2), the number of beam loops in the resonator becomes constant at each wavelength if the effective wavelength selection width $\Delta\lambda_{\text{eff}}$ is constant.

If the above two conditions are satisfied, the number of beam loops in the resonator, net gain $G_{net}$, and effective wavelength selection width $\Delta\lambda_{\text{eff}}$ become constant at each wavelength. That is, the light output power and the coherence length of the swept light source become constant irrespective of a wavelength in the swept range. Accordingly, the coherence length can be constant at each wavelength in the sweep wavelength range by controlling the SOA drive current so that the net gain $G_{net}$ becomes constant while monitoring the light output power as a supervisory signal beam. For this reason, it is preferable that a control voltage of the optical deflector 703 has such a waveform that the selected wavelength changes with a uniform speed in the sweep wavelength range.

However, in actuality, the wavelength selection element 102 may be driven by a sinusoidal wave as a control signal (wavelength sweep signal). In this case, the sweep speed differs according to a wavelength. The number of beam loops in the resonator differs according to a wavelength even if the effective wavelength selection width $\Delta\lambda_{\text{eff}}$ is constant. Accordingly, the coherence length is not necessarily constant even if the light output power becomes constant. However, a rate of change at the selected wavelength of the wavelength selection element 702 near the center of the sweep wavelength range is approximately constant. Even in the case of driving by a sinusoidal wave, the coherence length is close to constant to some extent near the center of the sweep wavelength range. Although the above discussions are expressed by wavelength space, the advantageous result of the present invention can be similarly produced even if they are replaced with frequency space.

As described above, the net gain $G_{net}$ is brought close to the lasing threshold and the light output power is controlled to be constant, thereby further narrowing the effective wavelength selection width $\Delta\lambda_{\text{eff}}$ and maximizing the coherence length near the lasing threshold state as shown in FIG. 10 at each wavelength. Although the graph of FIG. 10 shows that the coherence length exponentially increases as it becomes close to the state of the lasing threshold (dashed line), the lasing state actually becomes unstable as it becomes close to the lasing threshold. Thus, the coherence length is contrarily degraded by a mode competition between laser vertical modes. In consideration of this instability, optimum values of the net gain $G_{net}$ and SOA drive current value are slightly higher than the lasing threshold (the right side of the dashed line in FIG. 10).

In order to make the light output power constant, it is necessary to control the SOA drive current value to temporally increase and decrease with time (in synchronization with a corresponding wavelength) in conjunction with a wavelength sweep, which is an actual operation of the light source. The swept light source of the present embodiment can be implemented as a swept light source apparatus including the control circuit.

Figure 12:
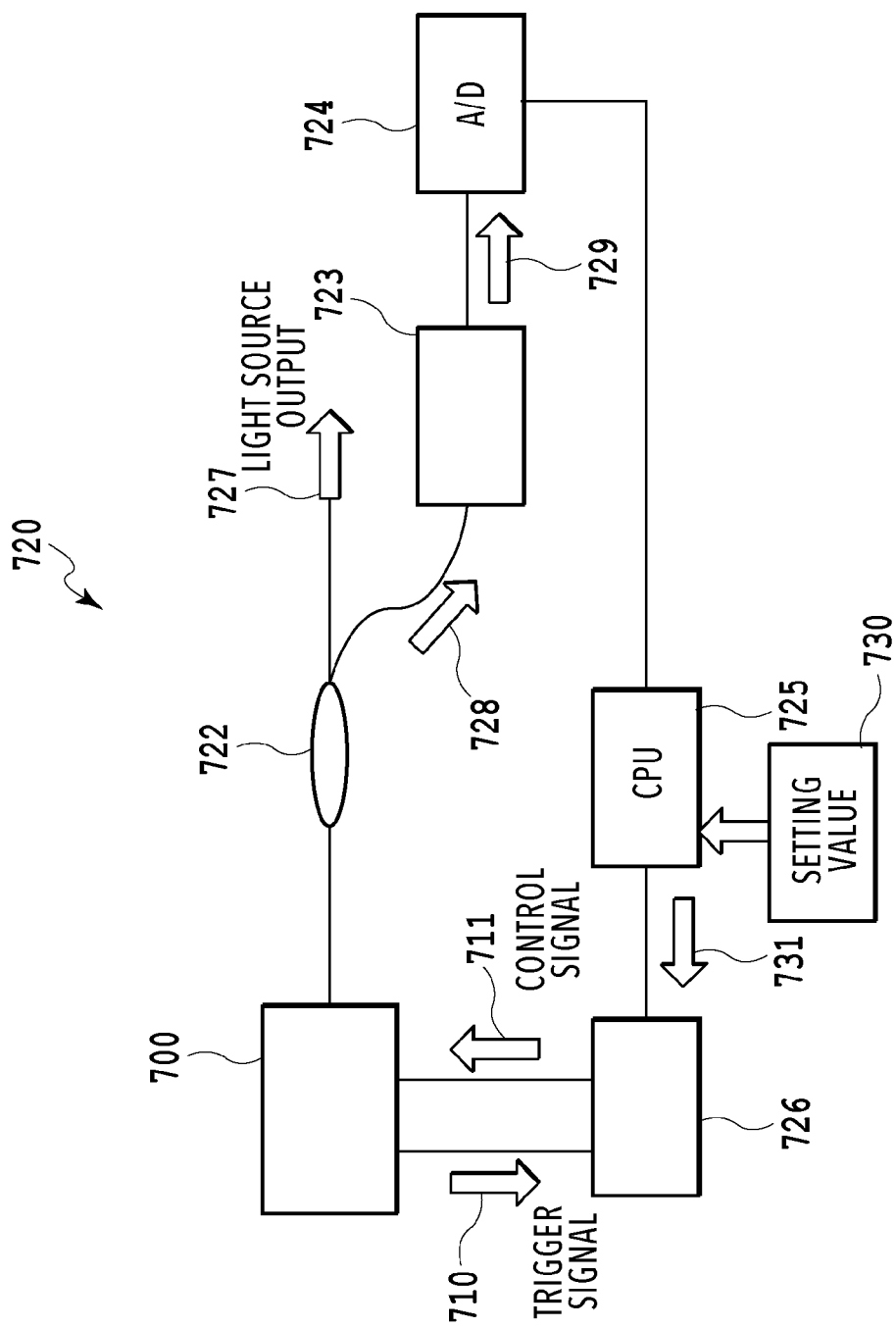
FIG. 12 is a diagram showing a configuration of a swept light source apparatus including a control circuit.

FIG. 12 shows a configuration of a swept light source apparatus including the swept light source and a control circuit that controls the injected current of the SOA and constantly keeps the coherence length of the swept output beam long. A swept light source apparatus 720 includes the swept light source 700 shown in FIG. 11 and further includes an optical branching element 722 configured to branch and extract part of the output beam from the swept light source 700, a photodetector 723 configured to measure light output power of one branched beam 728, an A/D converter 724 configured to convert an output signal of the photodetector 723 into a digital signal, an operation unit (such as a CPU) 725 configured to process the digital signal and generate control waveform data to be a control signal for the driver device 708 of the SOA, and an arbitrary waveform generator 726 configured to output a waveform signal 711 generated by the operation unit.

An output beam from the swept light source 700 is partly extracted by the optical branching element 722. One branched beam is detected as a light source output beam 727 and the other branched beam 728 is detected as a supervisory signal beam by the photodetector 723. In the photodetector 723, the supervisory signal beam is converted into a voltage signal 729 and sampled by the A/D converter 724. The sampled signal is input to the operation unit 725. In the operation unit 725, the input signal is compared with a setting value 730 to be described later, an error signal is generated, and a control waveform 731 according to the error signal is generated. The setting value 730 includes a threshold current for each wavelength, an initial current, a tolerance D, a target light output power value $V_t$ and the like to be described later, and may be read from an unshown memory or storage device. The control waveform 731 is input to the arbitrary waveform generator 726. The arbitrary waveform generator 726 outputs the data stream of the input waveform as a control signal 711 in the form of a voltage waveform in which data points are smoothly interpolated. A current driver 708 in the swept light source 700 has the function of converting the voltage waveform input from the arbitrary waveform generator 726 into an SOA drive current waveform and injects an SOA drive current corresponding to the input voltage waveform into the SOA 701. The driver device 709 configured to drive the means for changing a lasing wavelength (such as an optical deflector) 702 supplies a trigger signal 710 synchronized with a wavelength sweep to the arbitrary waveform generator 726.

In the above description, the operation unit 725 is described as one that has the D/A conversion function and outputs the control waveform 731. However, waveform data may be output from the operation unit 725 and the control waveform 731 may be acquired by a separately provided D/A converter. The configuration from the A/D converter 724 to the arbitrary waveform generator 726 is not limited to that shown in FIG. 12 and can be variously modified. Next, a method of generating a time-SOA drive current waveform by a bisection method performed by the operation unit 725 will be described in detail. The procedure of the method of generating a time-SOA drive current waveform to be described later shows a process that can be implemented by software operational processing by the operation unit 725, a CPU or the like. In the configuration of FIG. 12, if the characteristics of the optical resonator and the SOA have been determined and a target value $V_t$ of the light output power to be described later has already been known, it can be implemented as software operational processing without the need for any special hardware like the interferometer in the first embodiment.

Figure 13:
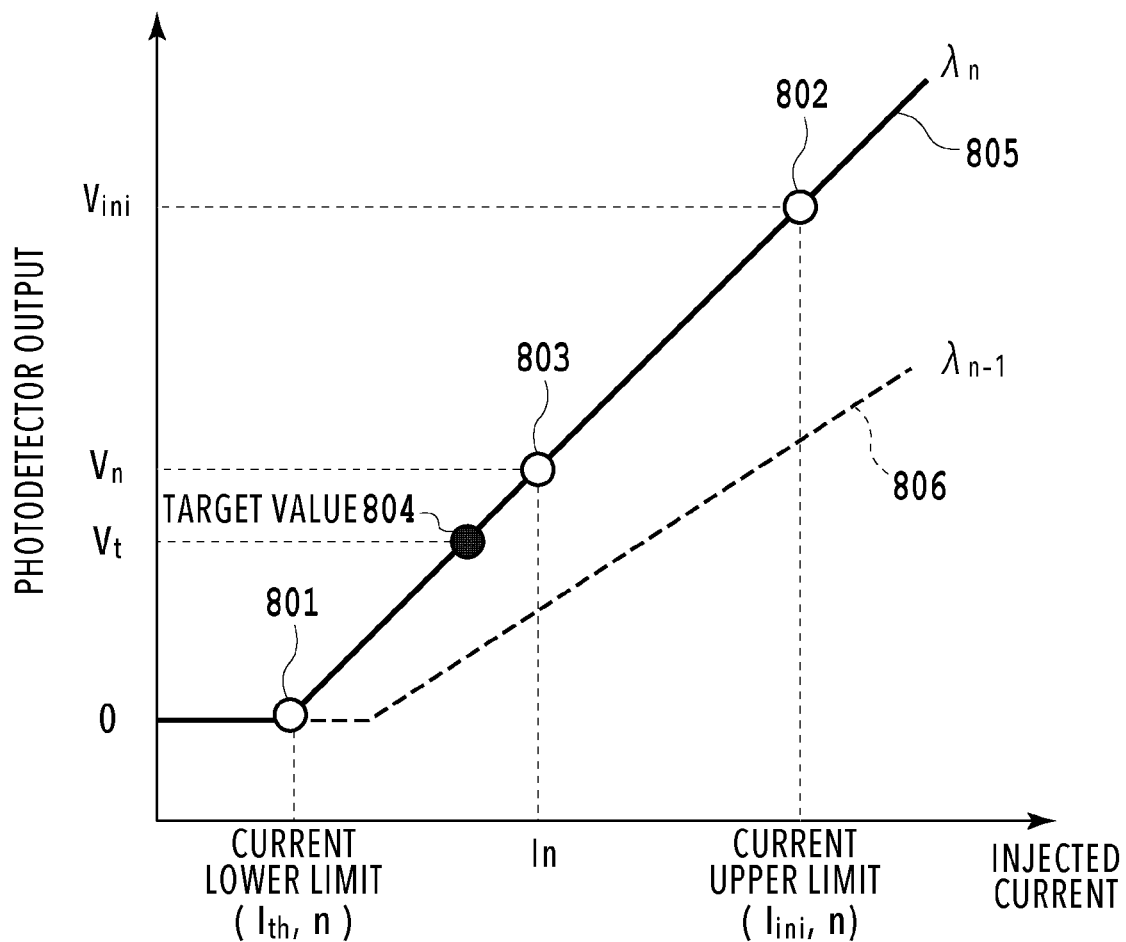
FIG. 13 is a diagram showing a relationship between an SOA injected current and a light output level.

FIG. 13 is a diagram showing a relationship between an injected current into the SOA and a light output level in the swept light source of the present embodiment. In the graph of FIG. 13, the horizontal axis represents an injected current into the SOA, that is, an SOA drive current, and the vertical axis represents a photodetector output voltage obtained from the photodetector 723 of FIG. 12. The photodetector output voltage corresponds to a light output level from the swept light source 700. Control for optimizing the SOA drive current while performing the wavelength sweep operation unique to the swept light source of the second embodiment is described as follows.

Here, N items of light output power data $V_0, V_1, \ldots, V_{N-1}$ that can be acquired by sampling by the A/D converter 724 in one wavelength sweep operation are considered. The N data points correspond to the items of light output power data of wavelengths $\lambda_0, \lambda_1, \ldots, \lambda_{N-1}$ included in the entire sweep wavelength range, respectively. The items of light output power data correspond to voltage signals 729 of the supervisory signal beam in FIG. 12 one by one and correspond to the voltage of the photodetector output represented by the vertical axis of FIG. 13. Here, an attention is focused on the n-th data point 803 at the N wavelengths, that is, the item of light output power data $V_n$ at the wavelength $\lambda_n$.

In FIG. 13, a solid line 805 indicates SOA injected current-light output power characteristics (I-P characteristics) at the wavelength $\lambda_n$. A dashed line 806 indicates SOA injected current-light output power characteristics (I-P characteristics) at the wavelength $\lambda_{n-1}$ as another example of the light output power data. A target light output power value 804 is $V_t$ and an injected current value when $V_n$ 803 is obtained is $I_n$. A difference between the present light output power $V_n$ and the target light output power value $V_t$ is defined as an error signal $E_n$ by the following formula.

$$E_n = V_t - V_n \quad \text{Formula (7)}$$

The target light output power value $V_t$ can be arbitrarily set as a numerical value used for light output power control. An optimum value of the target light output power value $V_t$ should exist for each light source because it is determined by gain characteristics and loss characteristics of each constituent element of the swept light source 700. In the case of calculating the optimum value of the target light output power value $V_t$, before an actual operation as the swept light source, $V_t$ is preset to a certain value by using a control flow described below, control is performed to make the light output power constant, and this control is repeatedly performed while changing the value of $V_t$ to search for the optimum value. At this time, the search can be made by measuring the coherence length by, for example, the method described in the first embodiment.

The optimum target light output power value $V_t$ thus determined is considered to be unchanged unless the output characteristics of the swept light source 700 largely change. Accordingly, once the target light output power value $V_t$ is determined before an actual operation as the swept light source, the same value can be used thereafter. Thus, for example, it is sufficient that an optical interferometer or the like is provided as external adjustment equipment for manufacture adjustment of a swept light source apparatus at the time of manufacturing the swept light source so as to measure coherence lengths for determining the $V_t$ value. If the target light output power value $V_t$ is determined in the step of manufacture/adjustment of the apparatus and the $V_t$ value is stored in each apparatus, the swept light source apparatus itself does not need to comprise the optical interferometer unlike the first embodiment.

In theory, it is only necessary to acquire I-P characteristics shown in FIG. 13 at each wavelength and determine an SOA injected current at which desired light output power for maximizing a coherence length at each wavelength can be acquired from the acquired I-P characteristics and target light output power value $V_t$. In actuality, however, light output power corresponding to an SOA drive current value at a certain time also changes according to an SOA drive current value injected at a temporally prior or subsequent moment in a wavelength sweep. Therefore, feedback control is necessary for generating an SOA drive current waveform corresponding to a wavelength sweep. Since light output power cannot be acquired when an injected current into the SOA is equal to or less than an lasing threshold current, a lower limit 801 of an injected current value is an lasing threshold current $I_{th,n}$. In an optimization process of the SOA drive current, an initially injected current value $I_{ini,n}$ is set as a value obtained by multiplying the lasing threshold current by a coefficient a as follows.

$$I_{ini,n} = a I_{th,n} \quad \text{Formula (8)}$$

In the above formula, a value of the coefficient a is set so that the error signal $E_n$ has a negative value when an initial current is injected at each wavelength. That is, at all data points of the N items of light output power data $V_0, V_1, \ldots, V_{N-1}$, the first light output power data is larger than the target light output power value $V_t$, that is, $V_n > V_t$ when the initial current is injected. Next, a control step $\Delta I_n$ when the SOA drive current is subjected to feedback control is defined as follows.

$$\Delta I_n = \frac{I_{ini,n} - I_{th,n}}{2} = \frac{(a-1)}{2} I_{th,n} \quad \text{Formula (9)}$$

A tolerance between a light output power value $V_n$ monitored by the photodetector 723 and the target light output power value $V_t$ is defined as D. When the first feedback control is performed in the optimization process of the SOA drive current, an SOA current value $I_n$ at the wavelength $\lambda_n$ is an initial current value $I_{ini,n}$ defined by Formula (8). When the SOA drive current $I_n$ is set and an absolute value of the error signal $E_n$ calculated from the light output power $V_n$ monitored at a certain time point in a wavelength sweep is larger than the determined tolerance D, the optimization process requires such control as to update the value of $I_n$ for the next wavelength sweep. Since the detected output power is smaller than a target value, that is, $V_n > V_t$ (including zero), when $E_n < 0$ (including zero), the injected current $I_n$ should be reduced and the value of $I_n$ is updated as follows.

$$I_n := I_n + \frac{1}{2^M} \Delta I_n \qquad \text{Formula (10)}$$

In the above formula, M indicates that feedback control is an M-th one. ":=" indicates that the numerical value on the right side is substituted in the variable on the left side. In the above description, the case where $E_n < 0$ (including zero) is indicated. When $E_n > 0$ (including zero), the sign of $\Delta I_n / 2^M$ in Formula (10) is positive. In a control loop, the current value $I_n$ is not updated when $|E_n| < D$. If the size of the error signal $E_n$ is equal to or less than the tolerance D at all the wavelengths, the control of the optimization process of the SOA drive current is stopped.

Accordingly, in the swept light source of the present embodiment, the optical gain control means (723 to 726) detects an output light level from the laser resonator, generates such an optical gain control signal that the output light level has a predetermined output light level value based on the detected output light level, and controls the means for changing an optical gain 710 by using the optical gain control signal.

Although the process of controlling the SOA drive current based on the light output power $V_n$ described above is described as a series of control at a certain wavelength $\lambda_n$, in the swept light source apparatus 720 of the present embodiment, the N items of light output power data $V_0, V_1, \ldots, V_{N-1}$ can be acquired in one wavelength sweep period. Until the condition that $|E_n| < D$ is satisfied, the SOA drive current value $I_n$ is updated at a wavelength not satisfying the condition. That is, each time the wavelength sweep operation is repeated, update control of the SOA current value $I_n$ for acquiring a target light output power value $V_t$ at each wavelength is repeated by the optimization process of the SOA drive current shown in FIG. 13.

Figure 14:
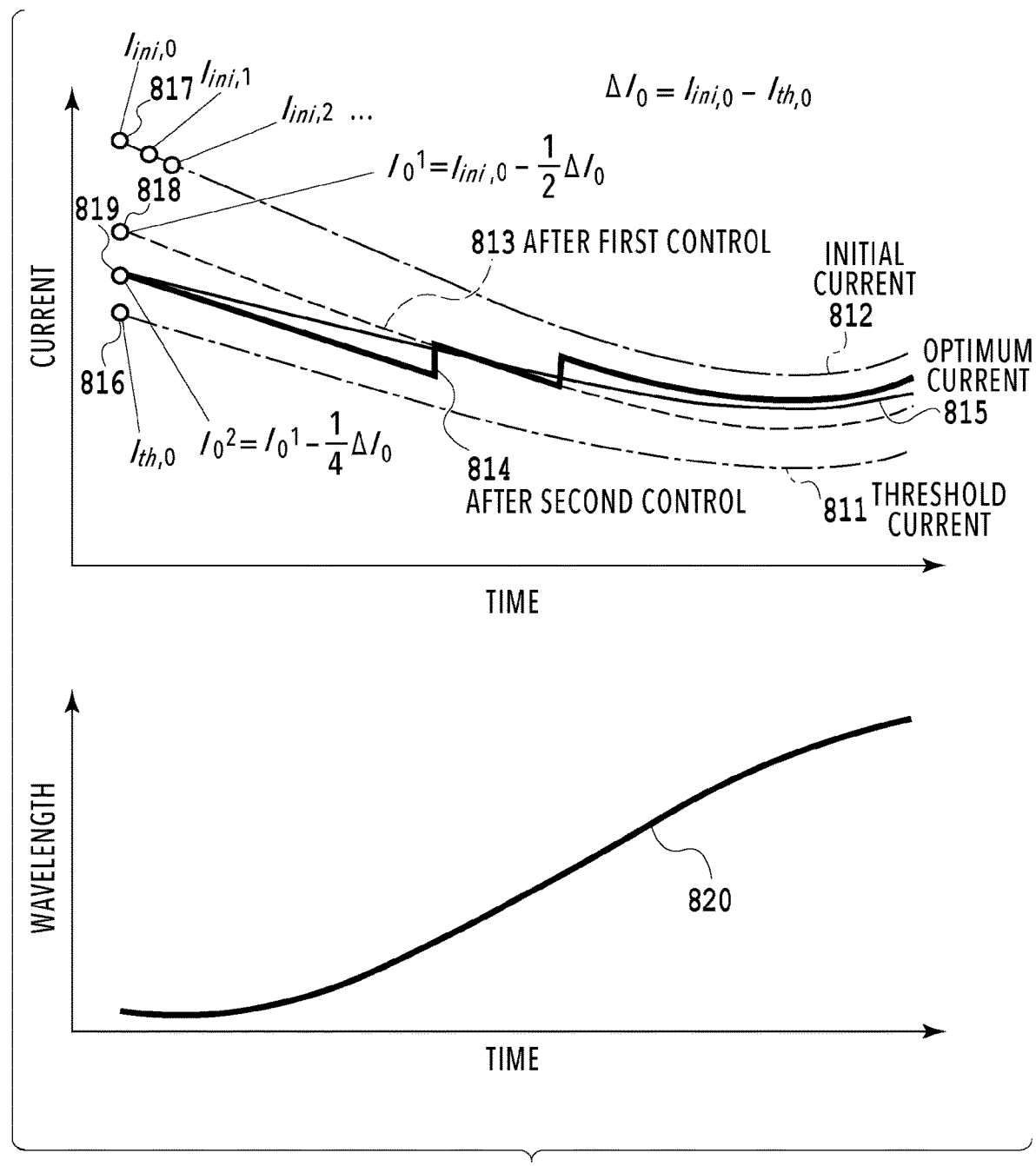
FIG. 14 is a diagram showing SOA injected current optimization including a wavelength sweep.

FIG. 14 is a diagram conceptually showing the optimization process of the SOA drive current in the swept light source apparatus 720 of the present embodiment including a time of a wavelength sweep. The upper part of FIG. 14 shows a series of progress of the optimization process of the SOA drive current as temporal waveforms 812, 813, and 814 of time-SOA drive current. The lower part of FIG. 14 shows a time-wavelength waveform 820 of the output beam from the swept light source in line with the wavelength sweep time and in conjunction with the temporal waveforms of the time-SOA drive current. Among the temporal waveforms of the time-SOA drive current, the lowermost dot-and-dash line 811 represents a temporal change in the lasing threshold current of the SOA. Since the times indicated by the horizontal axis of the lower graph in FIG. 14 correspond to the wavelengths of the light source output beam one by one, the lasing threshold currents also correspond to the wavelengths one by one. The uppermost dot-and-dash line 812 represents the time-initial current value $I_{ini,n}$ defined by Formula (8). On the initial current value $I_{ini,n}$ 812, a plurality of sample points corresponding to the initial current value $I_{ini,n}$ initially set at the start of the optimization process are shown at certain wavelength intervals. The wavelength intervals for acquiring these sample points may be regular intervals or irregular intervals.

Among the temporal waveforms of the time-SOA drive current, an optimum SOA drive current waveform 815 of the target value corresponding to the light output level for maximizing the coherence length is shown by a solid line. After the setting of the initial current value $I_{ini,n}$, if the first feedback control is performed at each wavelength, a new time-SOA drive current waveform 813 (first update) is obtained. That is, the SOA drive current value is updated by Formula (4) at all the wavelengths and the second wavelength sweep is performed while the SOA is driven by the temporal waveform of the time-SOA drive current 813. During the second wavelength sweep, light output power data on the second new wavelengths $\lambda_0, \lambda_1, \ldots, \lambda_{N-1}$ can be acquired from the photodetector 723. After the light output power data on all the wavelengths is newly acquired and the second control is finished, a temporal waveform of the updated time-SOA drive current 814 (second update) is obtained. The updated time-SOA drive current 814 is used for the third wavelength sweep. The time-SOA drive current waveform 814 becomes closer to the time-optimum SOA drive current waveform 815 at each wavelength as compared with the time-SOA drive current waveform 813.

In the example of FIG. 14, the current temporal waveform 813 corresponds to the current temporal waveform 814 in a wavelength range near the center. This means that in the center wavelength range, the condition that $|E_n| < D$ is satisfied after the first update of the SOA drive current value $I_n$ and accordingly the second update of $I_n$ becomes unnecessary. As shown in FIG. 14, the optimization process of the SOA drive current of FIG. 13 is performed and the SOA drive current-temporal waveform moves at each wavelength so as to be closer to the time-optimum SOA drive current waveform 815, for example, like sample points 817, 818, and 819 at the sweep starting wavelength $\lambda_0$. Accordingly, when focusing on a certain wavelength, the process of FIG. 14 of controlling the SOA drive current performs temporally discrete control in conjunction or synchronization with the wavelength sweep.

Figures 15, 15A:
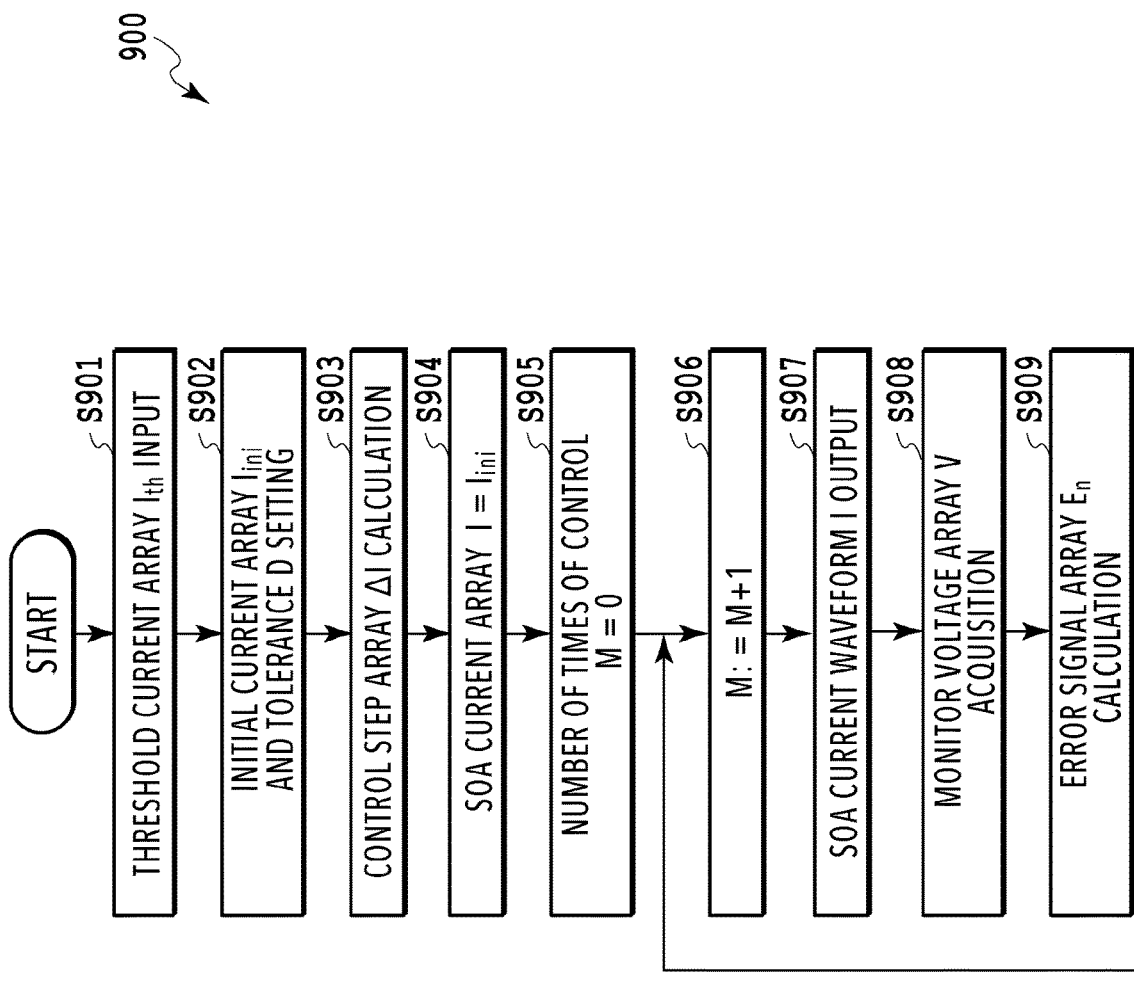
FIG. 15A and FIG. 15B illustrate a flowchart of optimization of an SOA drive current including all wavelengths.
Figure 15B:
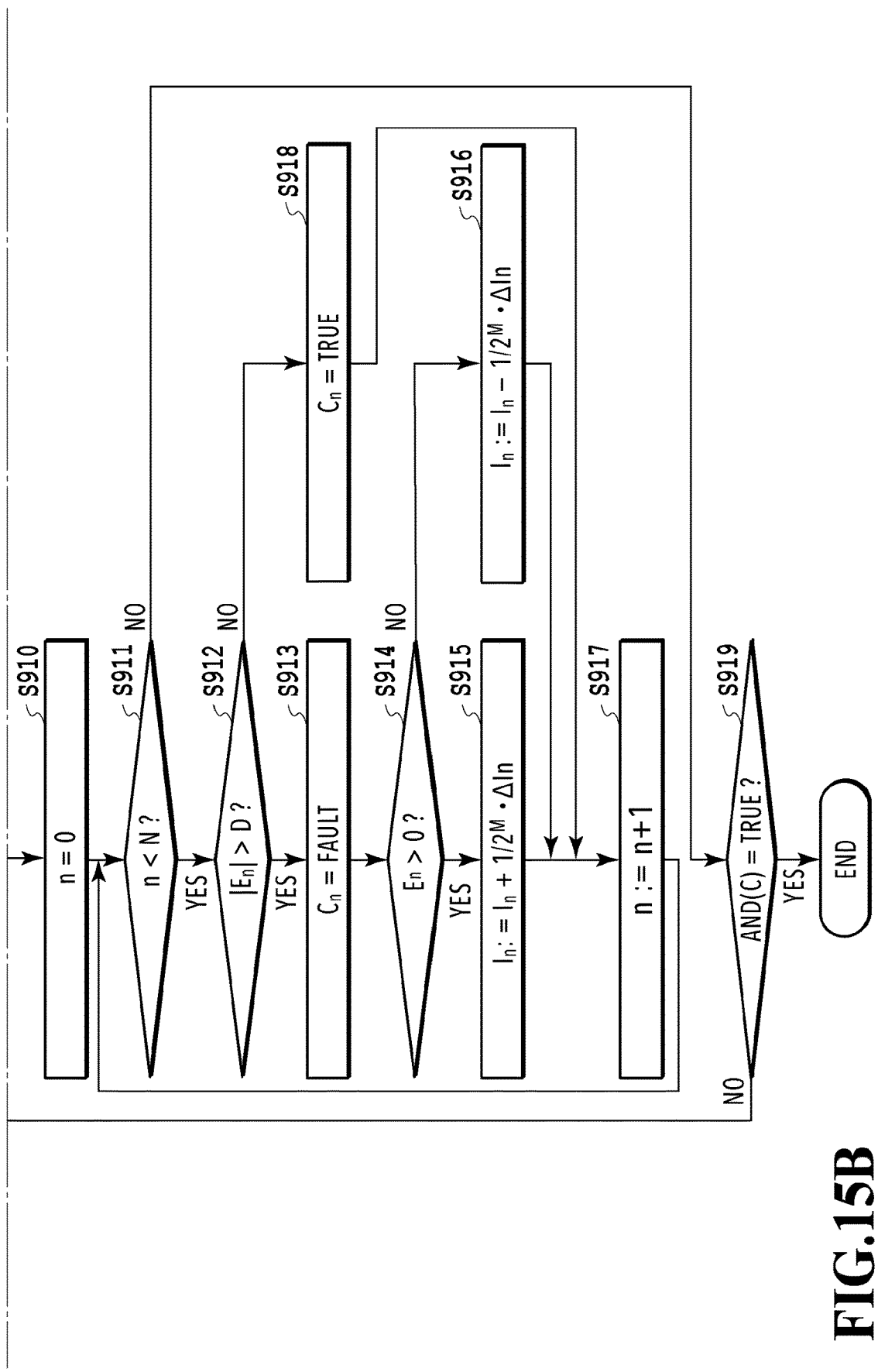

FIG. 15A and FIG. 15B, referred to as FIG. 15 herein, illustrate a control flowchart of the optimization process of the SOA drive current including all the wavelengths. Initial data at each wavelength point is set from S901 to S905 and the SOA current is updated (S907) and a monitor voltage is acquired (S908) at each wavelength from S906 to S919. By repeating the loop from S911 to S917, the operations described above such as comparison between the error signal $E_n$ and the tolerance and determination of the updated value of the SOA current value $I_n$ are sequentially performed for the N wavelengths $\lambda_0, \lambda_1, \ldots, \lambda_{N-1}$.

In the flowchart of FIG. 15, an element Cn of an array C indicates whether it is necessary to update the control current value $I_n$ at the wavelength $\lambda_n$. If control is necessary, Cn=Fault. AND(C) indicates AND of all array elements of the array C. If AND(C)=True, control of the optimization process of the SOA drive current is stopped.

Figure 16:
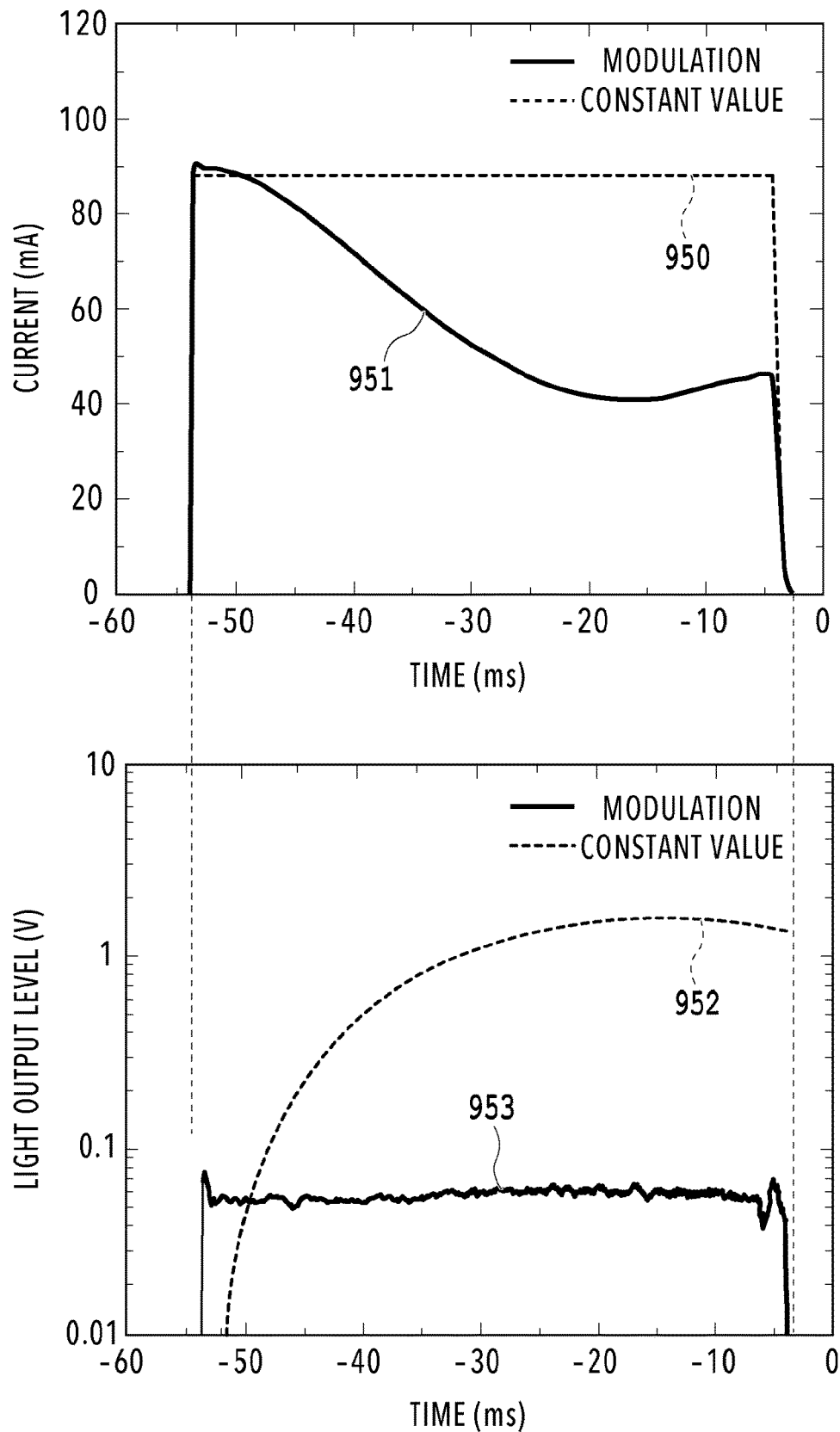
FIG. 16 is a diagram of a time SOA drive current waveform and the like of the swept light source of the second embodiment.

FIG. 16 is a diagram showing a temporal waveform and a light output level of an actual SOA drive current in the swept light source of the second embodiment in comparison with the conventional technique. The upper part of FIG. 16 shows a time-SOA current waveform in each of a conventional case 950 where the SOA drive current is constant and a case 951 after the execution of the optimization process of the SOA drive current by the present invention. The lower part of FIG. 16 shows a time-light output level (an output signal of the photodetector) in each of a corresponding conventional case 952 and a case 953 after the execution of the optimization process of the SOA drive current. The SOA current injection is limited to a sweep section of from a short wavelength to a long wavelength in a wavelength sweep. As can be understood from FIG. 16, in the wavelength sweep section, the light output level is substantially constant with respect to a wavelength change (temporal change).

Figure 17:
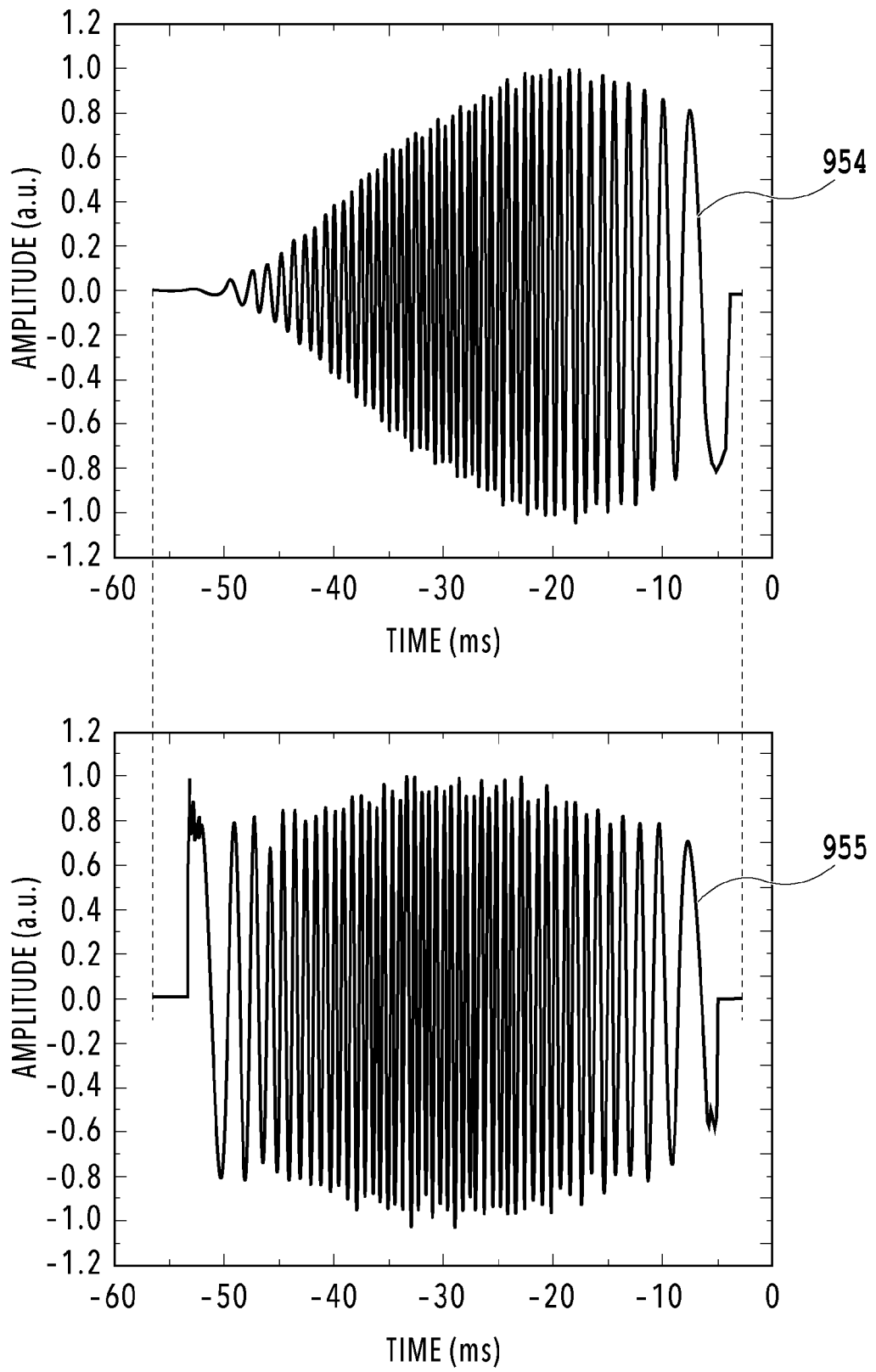
FIG. 17 is a diagram of an interference fringe waveform of the swept light source of the second embodiment.

FIG. 17 is a diagram showing an interference fringe waveform of the wavelength swept beam of the swept light source of the second embodiment in comparison with the conventional technique. An interference fringe waveform acquired by a Michelson interferometer of an optical path length difference of 1 mm with normalized amplitude is shown in each of a conventional case 954 where the SOA drive current is constant and a case 955 after the execution of the optimization process of the SOA drive current by the present invention. The amplitude of a fringe waveform 955 in FIG. 17 is also constant with respect to time as compared with the case 954 where the SOA drive current is constant.

Figure 18:
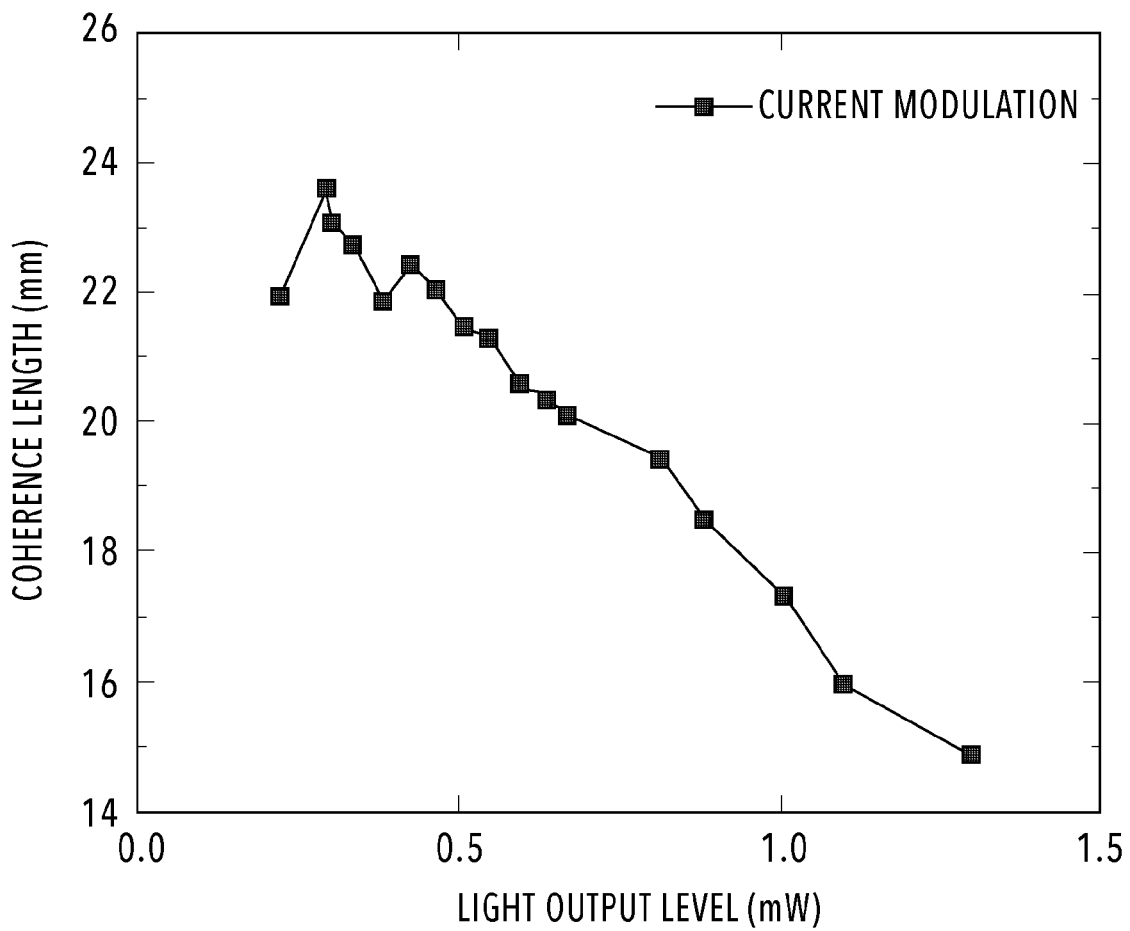
FIG. 18 is a diagram showing a relationship between a light output power value and a coherence length.

FIG. 18 is a diagram showing a relationship between a value of light output power made constant by SOA current control and a coherence length. In the swept light source of the second embodiment, a value of light output power constantly controlled is changed and a coherence length for each case of light output power is calculated. FIG. 18 shows that the coherence length becomes maximum near about 0.35 mW. The coherence length at this time is approximately about 24 mm over the wavelength sweep width of 80 nm, which is about twice the maximum value 12 mm of the coherence length in the conventional case of operating the SOA with the constant SOA drive current. Further, in the conventional case, a wavelength with the maximum coherence length is limited to a narrow range. As is clear from FIG. 18, the swept light source of the present embodiment can acquire twice the coherence length in the conventional case.

In the swept light source of the second embodiment, a bisection method is used as a method of generating the time-SOA drive current waveform in the operation unit 725. In the bisection method, the optical gain control means (723 to 726) performs temporally discrete control in conjunction with a wavelength sweep and gradually reduces by half a control amount of changing the optical gain (SOA drive current control step) with respect to a difference between the output light level and the predetermined output light level. The bisection method is a convenient feedback control method suitable for a case where a control target amount (light output level) is relatively stable with respect to an environmental change of the swept light source.

On the other hand, when the light source characteristics are more sensitive to an environmental change such as a temperature change, there is a case where the light output level cannot converge into the target value. In this case, the operation unit 725 can perform independent PID control of each wavelength λ of the sweep wavelength range instead of the bisection method to solve the problem. According to the PID method, the optical gain control means (723 to 726) performs temporally discrete control in conjunction with a wavelength sweep and performs control for changing the optical gain (SOA drive current operation) with respect to a difference between the output light level and the predetermined output light level by using the difference, the integral of the difference, and the derivative of the difference.

As described above with reference to FIG. 14, in the SOA drive current optimization process of the present embodiment, the N items of light output power data $V_0, V_1, \ldots, V_{N-1}$ at all the wavelengths are acquired during one wavelength sweep period, the SOA drive current $I_n$ is updated, and N items of light output power data of all the wavelengths can be newly acquired in the next wavelength sweep period. In general, a target light output level can be acquired by updating the SOA drive current $I_n$ about 10 to 100 times. However, it is sufficient to perform feedback control per predetermined number of sweeps in consideration of the operational processing capacity/processing time or the like in the operation unit 725.

Since a sweep cyclic frequency in the swept light source may be 200 kHz or more, about 10 to 100 updates of the SOA drive current $I_n$ require very short time in consideration of an actual use of the swept light source. Accordingly, there is no need to perform feedback control continuously each time a wavelength sweep of the light source is started. For example, steps S906 to S919 in the flow of FIG. 15 may be executed at intervals of 100, 1,000, or 10,000 sweeps. The execution intervals may be regular or irregular. For example, it is sufficient to complete the SOA drive current optimization process of FIG. 14 and FIG. 15 within a warm-up time of the swept light source apparatus.

Once the SOA drive current optimization process is completed, the series of flow of FIG. 15 may remain stopped in the case of an environment in which the operation of the swept light source is stable. In contrast, when an environmental change is significant and the state of the light source is easily changeable, it is possible to perform the series of flow of FIG. 15 regularly or irregularly. The SOA drive current optimization process of the present embodiment does not calculate coherence lengths unlike the first embodiment. Since the optimization process just monitors the light output level of the light source, provides direct feedback to the SOA current, and controls the light output level to have the constant target light output power value ($V_t$), the operation of the optimization process is extremely simple as compared with the first embodiment. As the operation unit 725 of the swept light source apparatus 720, an existing CPU or the like may be used. If the constant target light output power value ($V_t$) is predetermined at the stage of manufacture adjustment of the apparatus, there is no need for the interferometer like the first embodiment for a wavelength sweep as a normal operation of the swept light source apparatus. Simpler constituent elements and processing can constantly keep a long coherence length of a wavelength sweep output beam in the wavelength sweep period like the first embodiment.

In the swept light source of the present embodiment, the means for changing an optical gain (SOA) is controlled so that the optical gain value is slightly higher than an optical gain in a state of the lasing threshold on the premise that the relationship between the SOA current and the coherence length as shown in FIG. 10 is established. However, depending on the configuration and type of laser resonator, the coherence length may become maximum in an optical gain value far higher than that near the lasing threshold as an exception. Even in this case, the target light output power value ($V_t$) with the maximum coherence length may be determined based on actual SOA current-coherence length characteristics and there is no need to change the configuration of the swept light source apparatus of FIG. 12 and the control flow of FIG. 15. According to the swept light source of the present embodiment, the PSF strength in the SS-OCT device can be increased, the image detection sensitivity of the SS-OCT device can be heightened, and the image quality can be improved.

Third Embodiment

The above two embodiments show the configurations and control methods of calculating the SOA current for keeping the coherence length maximum, generating the SOA current waveform data, and operating the swept light source. An important element of the swept light source that affects the coherence length of an output beam is the optical deflector 106 shown in FIG. 1 or the optical deflector 703 shown in FIG. 11. An example of an optical deflector suitable for the swept light source is an optical deflector using an electro-optical crystal. The optical deflector using an electro-optical crystal enables high-speed optical deflection because it has no mechanically movable portion and the electro-optic effect responds at high frequency of MHz to GHz. The following description presents various examples of the optical deflector suitably usable as the swept light source of the present invention.

A KTN ($KTa_{1-x}Nb_xO_3$) crystal or KLTN crystal ($K_{1-y}Li_yTa_{1-x}Nb_xO_3$) (hereinafter collectively referred to as a KTN crystal) that is an electro-optical crystal is known as a substance having a great electro-optic effect with a refractive index largely changing at low voltage. In addition, the use of Ti and Cr materials as electrodes enables charge injection into the crystal and an internal electric field produced by the injected charge can be used to implement a high-speed and wide-angle optical deflector. Therefore, in the case of using a general optic such as a lens, prism, or mirror for a purpose that requires high-speed operation, the optic may be replaced with a KTN crystal.

Figure 19:
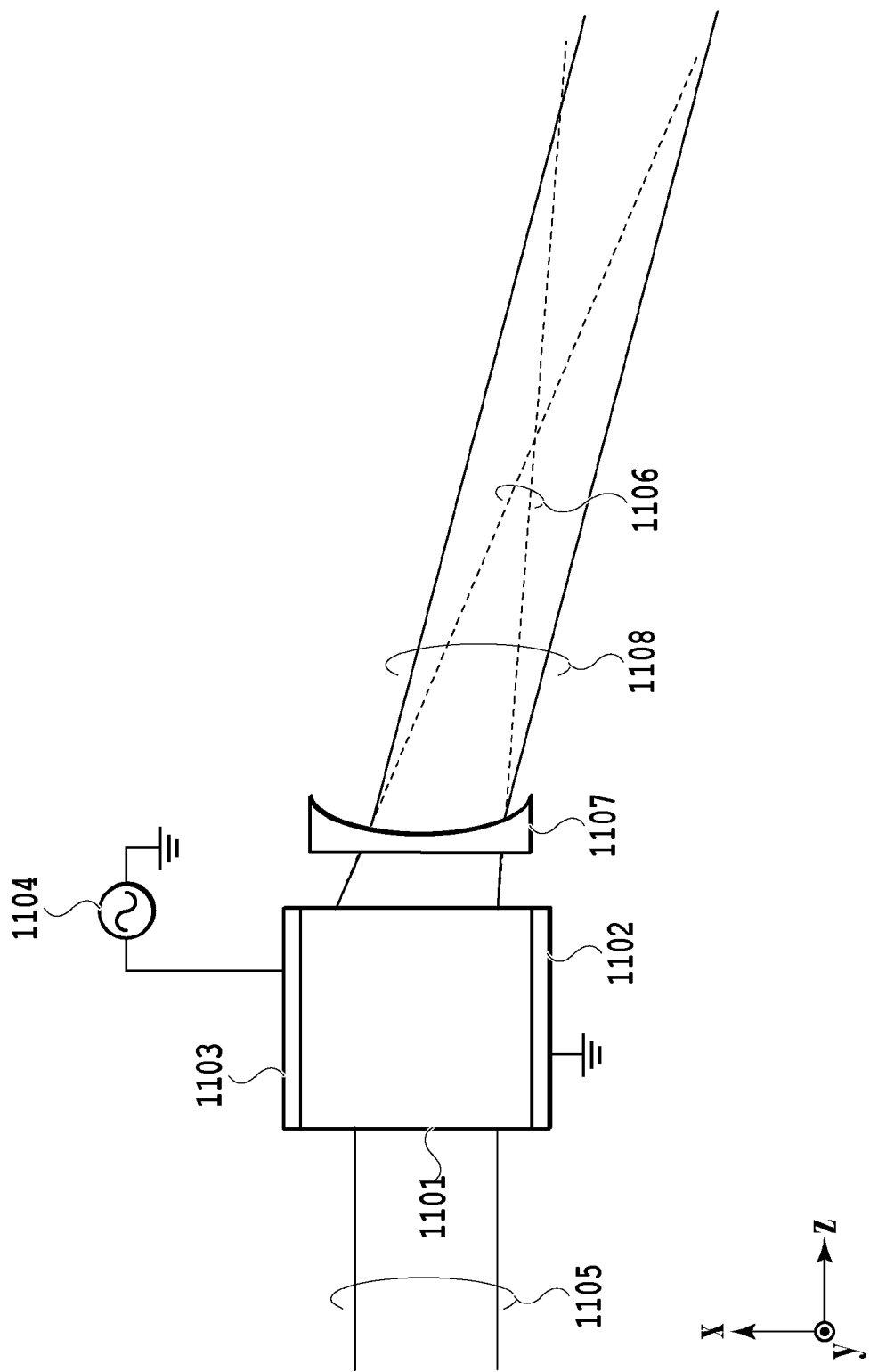
FIG. 19 is a diagram showing a configuration of an optical deflector using a general KTN crystal.

FIG. 19 shows a configuration of an optical deflector using a conventional KTN crystal. Electrodes 1102 and 1103 are formed on two opposite surfaces of a KTN crystal 1101, respectively. A voltage is applied between the two electrodes 1102 and 1103 from a control voltage source 1104. An incident beam 1105 is incident on a surface (xy plane) of the KTN crystal 1101 perpendicular to the surfaces on which the electrodes 1102 and 1103 are formed and propagates in a z axis direction through the KTN crystal 1101. The beam is deflected in the KTN crystal 1101 and an outgoing beam 1106, the traveling direction of which is changed in an x axis direction, is obtained. An angle of deflection according to an applied voltage from the control voltage source 1104 is obtained. A voltage according to the use of the optical deflector is supplied from the control voltage source 1104. For example, a waveform of the applied voltage is a sinusoidal wave, sawtooth wave or the like and is applied according to the use of the optical deflector. A voltage of about several hundred V is applied to the KTN crystal 1101 in order to acquire a suitable maximum angle of deflection.

In a high-frequency operation, since a distance traveled by electrons injected from the electrodes by the applied voltage is shorter than a distance between the electrodes, an ideal space-charge control state is not realized and the angle of deflection is reduced. To solve the problem, a control method of applying a voltage of a burst waveform to the KTN crystal 1101 before applying the applied voltage for causing deflection to inject electrons into the crystal and trapping the electrons in a trapping level in advance is proposed (for example, see PTL 2).

When the voltage is applied for causing deflection, filling a trap in the KTN crystal 1101 with electrons in advance makes it possible to generate distribution or inclination of an electric field in the KTN crystal 1101 and realize optical deflection. As a method of trapping electrons in a trapping level, a method of superimposing an alternating voltage for optical deflection and scanning on DC bias voltage and applying it to the KTN crystal 1101 is also proposed (for example, see PTL 3).

If the DC bias voltage is continuously applied, electrons are supplied from a negative electrode so as to make up for electrons ejected from the trapping level again by thermal excitation or the like and accordingly a certain amount of electrons are left inside the crystal even after a long time. As a result, a deflector that keeps a constant amount of trapped electrons necessary for a high-frequency operation so that the angle of deflection is not reduced even after a long time can be realized.

A charge density N in the KTN crystal becomes close to uniform spatially when the permittivity of the crystal is high, but is accumulated only near a cathode at the time of voltage application and distributed non-uniformly in the crystal when the permittivity is low. When the charge density N is spatially non-uniform and the distribution depends on the position in the crystal like N (x, y, z), the effect of the electro-optical crystal as a lens differs according to a position of transmission of a beam deflected in the crystal. That is, the lens effect differs according to an instantaneous value of drive voltage for optical deflection.

In contrast, a method of arranging a variable focus lens, the focal length of which varies in synchronization with the voltage for optical deflection, on the outgoing side of the KTN crystal to acquire a deflected beam having constant light condensing characteristics irrespective of the applied voltage to the KTN crystal is proposed. This method requires an additional variable focus lens that dynamically operates in addition to the primary optical deflector, which produces a problem that configurations of a power source for operating the variable focus lens, an electric circuit for synchronizing the optical deflector with the variable focus lens and the like become complicated.

To solve the problem, the optical deflector suitable for the swept light source of the present embodiment operates so as to compensate for a spatial change in lens effect in the optical deflector having the lens effect. The optical deflector suitable for the swept light source of the present embodiment is an optical deflector having an electro-optical crystal with opposing surfaces on which at least two electrodes are formed, the optical deflector comprising: an optical deflector configured to, when a voltage is applied to the at least two electrodes, bend a path of a beam orthogonal to an electric field formed by the voltage by generating a non-uniform refractive index distribution in the electro-optical crystal due to the electro-optic effect; and an optical element arranged on at least one of the incident side and the outgoing side of the electro-optical crystal, the optical element having light condensing characteristics spatially distributed over a range of deflection of the beam. According to the optical deflector of the present embodiment, it is possible to compensate for a change in lens effect in the deflection direction by arranging, at the latter part of the optical deflector, an optical element having spatially distributed light condensing characteristics and optical path length.

Various configurations of the optical deflector suitable for the swept light source of the third embodiment of the present invention will be described below in detail with reference to the drawings.

Figure 20:
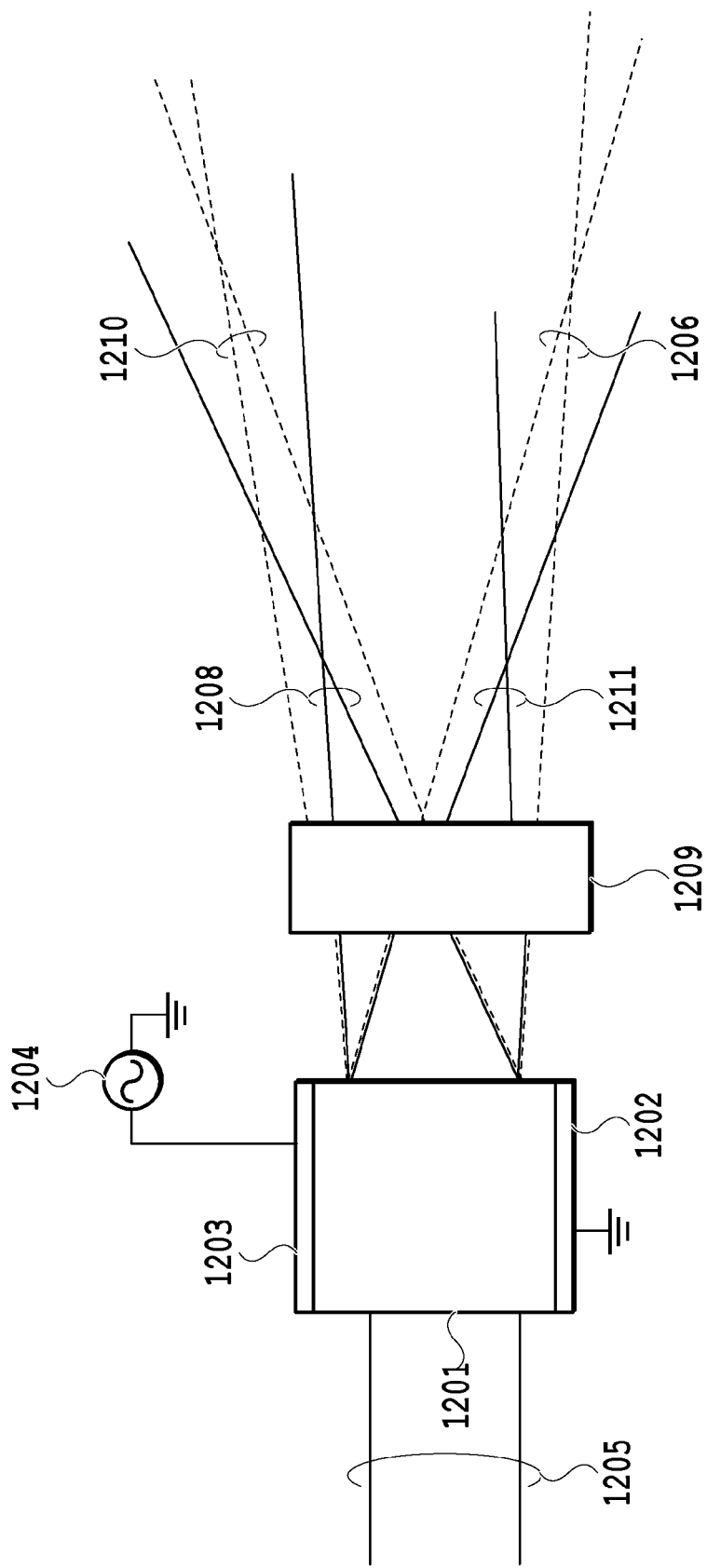
FIG. 20 is a diagram showing a configuration of an optical deflector of a third embodiment of the present invention.

FIG. 20 is a diagram showing a configuration of an optical deflector suitable for a swept light source according to an embodiment of the present invention. The optical deflector using the electro-optic effect has an electro-optical crystal 1201 with two opposing surfaces on which electrodes 1202 and 1203 are formed, respectively. A charge is injected into or a voltage for optical deflection is applied to the electro-optical crystal 1201 from the control voltage source 1204 via the pair of electrodes.

As the electro-optical crystal, for example, potassium tantalate niobate ($KTa_{1-x}Nb_xO_3$ [$0<x<1$]; hereinafter referred to as KTN) or a lithium-doped crystal ($K_{1-y}Li_yTa_{1-x}Nb_xO_3$ [$0<x<1$, $0<y<1$]; hereinafter referred to as KLTN) can be used. A charge is injected into the electro-optical crystal along with an electric field by voltage application. As a result, a spatial charge distribution formed by the injected charge or a trap charge distribution formed by the injected charge being further trapped in the electro-optical crystal occurs in the crystal. This charge distribution forms a non-uniform electric field distribution and a refractive index distribution occurs according to a change in the electric field distribution. This non-uniform electric field distribution expresses a gradient of the refractive index and bents a path of a beam orthogonal to the gradient of the refractive index. At this time, because of a nonlinear refractive index distribution in which the refractive index is high near the center of the electro-optical crystal, an incident beam 1205 that has passed through the electro-optical crystal 1201 is deflected and concentrated at the same time to be an outgoing beam 1206 or an outgoing beam 1208, and is diverged after the focal point.

A trap density N is not always spatially uniform depending on the composition distribution of the electro-optical crystal 1201 used as the optical deflector and the applied voltage for charge filling. In this case, the lens effect of the electro-optical crystal differs according to the position of transmission of a beam deflected in the crystal. That is, a focal position formed by the electro-optical crystal differs according to an instantaneous value of the voltage applied to the electro-optical crystal which is the optical deflector. A deflection operation with a constant focal length can be achieved irrespective of the instantaneous value of the voltage applied to the optical deflector by an optical element 1209 having light condensing characteristics spatially distributed so as to compensate for the variation.

For example, if there is no optical element 1209 having spatially distributed light condensing characteristics, the beam shape of the outgoing beam at the time of deflection is the outgoing beam 1206 or outgoing beam 1208 having a focal position different according to an angle. At this time, the focal position of the outgoing beam 1208 is close to the outgoing surface of the electro-optical crystal 1201 as compared with the outgoing beam 1206. This is converted into an outgoing beam 1210 having the same focal position as the outgoing beam 1206 by using the optical element 1209 arranged at the latter part of the optical deflector 1201 to make such a wavefront change that the outgoing beam is diverged. Alternatively, the outgoing beam 1206 is converted into an outgoing beam 1211 having the same focal position as the outgoing beam 1208 by arranging the optical element 1209 so that the focal position of the outgoing beam 1206 becomes close to the outgoing surface of the electro-optical crystal 1201.

When the light condensing characteristics of the electro-optical crystal 1201 used as the optical deflector are changed by the angle of deflection, the optical characteristics of the optical element 1209 configured to correct the angle of divergence of the outgoing beam are spatially distributed over a range of deflection of the outgoing beam. Such beam correction allows the outgoing beam to have an equal focal position at any angle of deflection. For example, in a laser printer or the like, there arises an advantage that a beam waist can be formed in any position on the surface of a photoreceptor. Further, the outgoing beam can be a parallel beam at any angle of deflection. For example, in the case of application to a spectroscope or the like, spectral characteristics of uniform resolution can be acquired without any degradation in resolution over the entire spectral range.

Next, more specific examples of the optical deflector suitable for the swept light source of the present embodiment described above will be described.

Example 4

Figure 21:
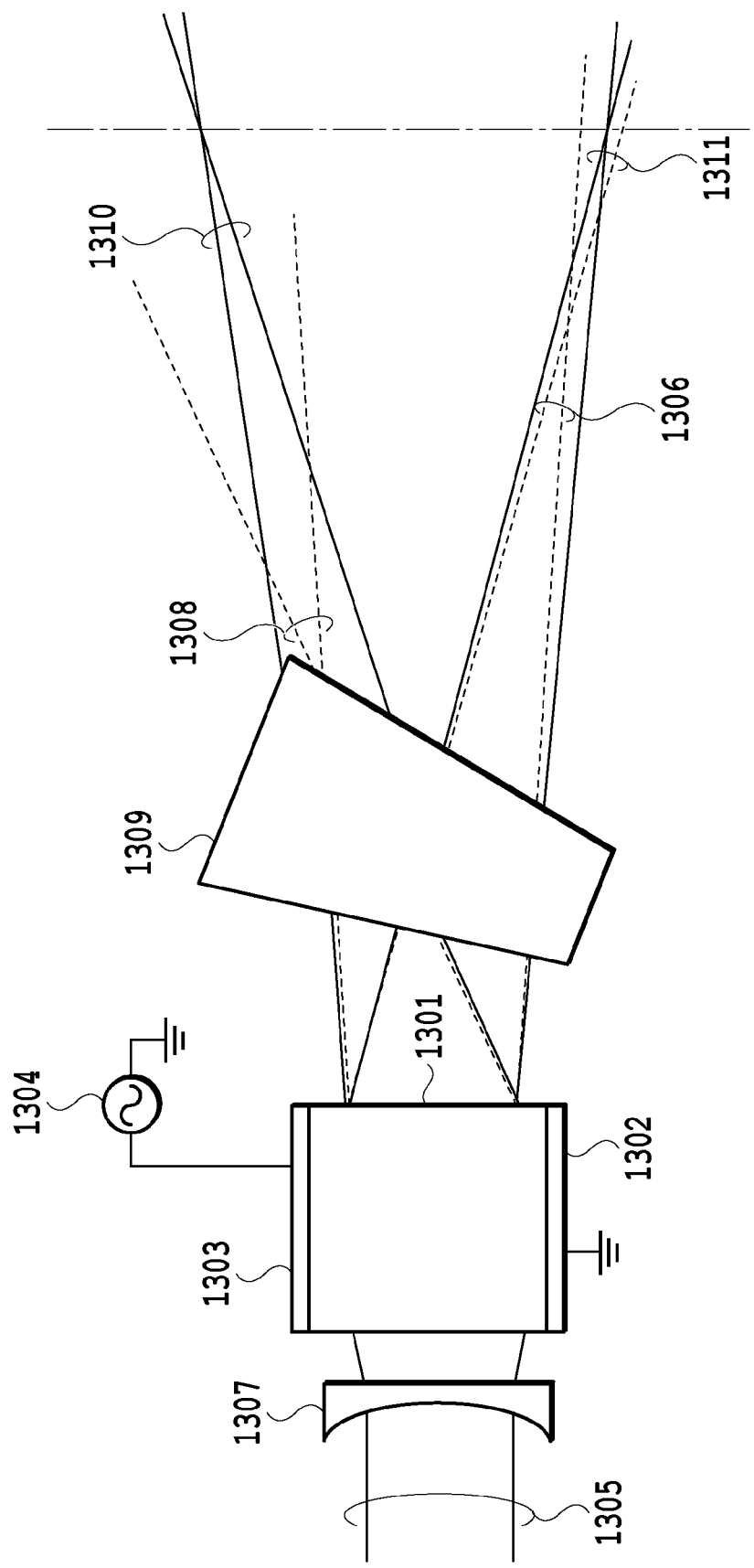
FIG. 21 is a diagram showing a configuration of an optical deflector suitable for a swept light source of Example 4.

FIG. 21 shows a configuration of an optical deflector suitable for the swept light source according to Example 4. The optical deflector comprising an electro-optical crystal 1301 such as KTN or KLTN has electrodes 1302 and 1303 formed on two opposing surfaces of the electro-optical crystal 1301, respectively. An incident beam 1305 to be incident on the electro-optical crystal 1301 passes through a cylindrical concave lens 1307 and is then incident on the electro-optical crystal 1301. The incident beam 1305, which is a parallel beam, is incident on the electro-optical crystal 1301 while being diffused by the cylindrical concave lens 1307. The incident beam 1305 becomes outgoing as an outgoing beam due to the lens effect of the electro-optical crystal 1301.

A KTN crystal of a thickness of 1.2 mm is used as the electro-optical crystal 1301 (an interval between electrodes is also 1.2 mm) and a beam having a beam diameter of 1.0 mm is incident on the crystal in linear polarization parallel to an electric field. The electro-optical crystal 1301 has a length of 4 mm. The incident and outgoing end faces of the electro-optical crystal 1301 have both a reflective film and an antireflective film. A distance of deflection of an incident beam by a round-trip optical path is 12 mm.

The control voltage source 1304 superimposes a sinusoidal AC voltage having an amplitude of ±360 V and a frequency of 200 kHz on a DC bias voltage of −240 V and apply it to the electro-optical crystal 1301. The voltage is applied via electrodes 1302 and 1303 formed of metal evaporated on the crystal surface. At this time, an angle of deflection of 110 mrad (about 6.5°) is obtained. Applying the DC bias voltage makes a trap density spatially non-uniform in the crystal. Since the trap density is non-uniform in the crystal, the lens effect of the electro-optical crystal differs according to the position of transmission of a beam diffracted in the crystal. If a prism 1309 does not exist, the focal position of a beam when the outgoing beam is diffracted differs according to the angle of deflection and the shape of the beam is like the outgoing beam 1306 or 1308.

In Example 4, a prism 1309 made from SF11 glass and forming an angle of 30° between the incident surface and the outgoing surface is arranged at the latter part of the electro-optical crystal 1301. Since the prism 1309 increases the beam diameter of a beam passing therethrough, expansion of the beam after passing through the prism 1309 by diffraction is suppressed as compared with the beam before incidence on the prism 1309. The power of magnifying the beam diameter by the prism 1309 depends on the angle of incidence.

Figure 22:
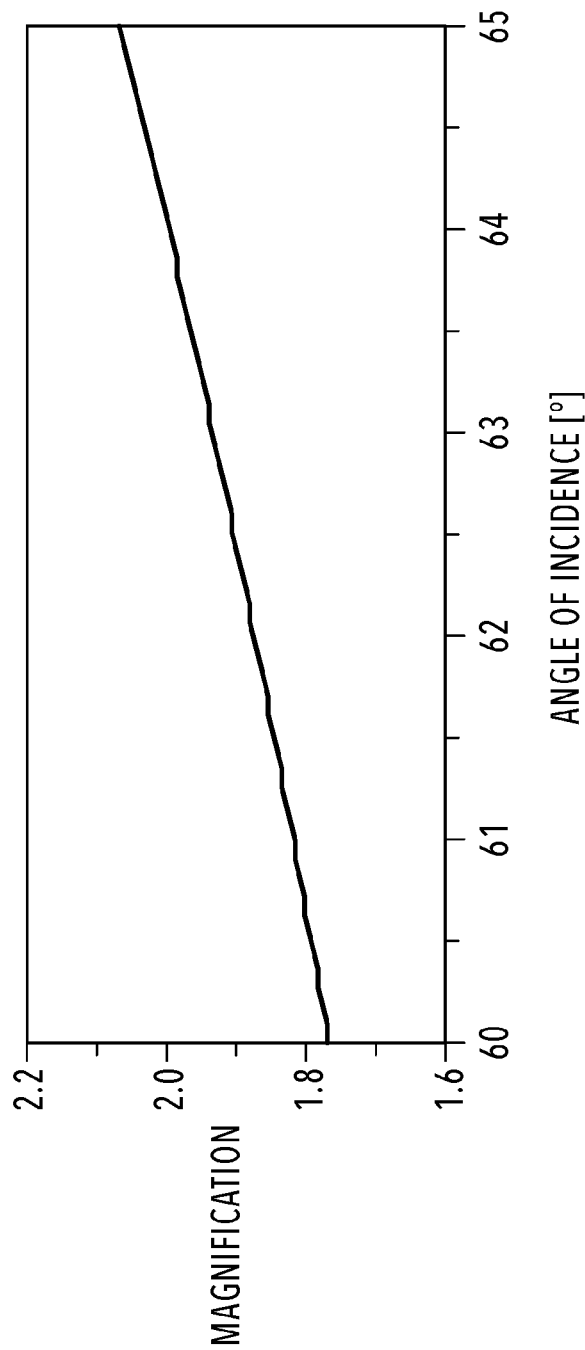
FIG. 22 is a diagram showing the dependence of a beam diameter magnification of a prism on an angle of incidence in Example 4.

FIG. 22 shows the dependence of a beam diameter magnification of the prism on the angle of incidence in Example 4. In Example 4, the arrangement is made so that the angle of incidence on the prism 1309 increases in the case of an angle of deflection (voltage) with a focal position close to the outgoing surface of the electro-optical crystal 1301 (in the case of the outgoing beam 1308 in FIG. 21) and the angle of incidence on the prism decreases in the case of an angle of deflection (voltage) with a distant focal position (in the case of the outgoing beam 1306 in FIG. 21), among deflected states. In addition, the arrangement is made so that the vertex of the prism 1309, that is, the narrow part of the prism is on the side of the angle of deflection with the distant focal position.

This arrangement further magnifies the outgoing beam 1308 at the angle of deflection (voltage) with the close focal position as compared with the outgoing beam 1306 at the angle of deflection (voltage) with the long focal length, whereby the effect of suppressing expansion by diffraction is enhanced and the outgoing beam 1310 is acquired. On the other hand, the outgoing beam 1306 is made into an outgoing beam 1311 by the prism 1309. This prism 1309 having light condensing characteristics spatially distributed over the range of deflection of the outgoing beam makes it possible to suppress the dependence of the focal position on the angle and acquire a deflection operation having a constant focal position irrespective of an instantaneous value of the AC voltage applied from the control voltage source to the optical deflector.

Example 5

Figure 23:
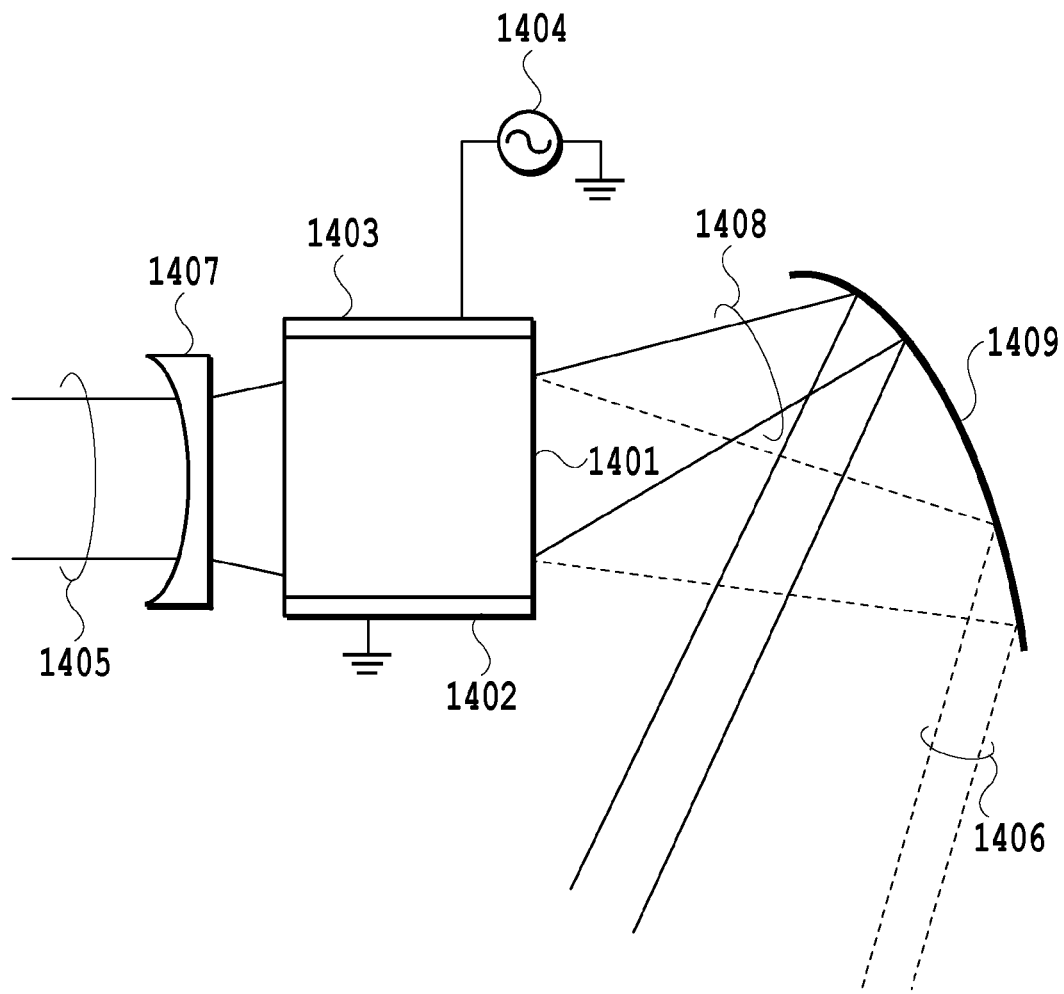
FIG. 23 is a diagram showing a configuration of an optical deflector suitable for a swept light source of Example 5.

FIG. 23 shows a configuration of an optical deflector suitable for the swept light source according to Example 5. The optical deflector comprising an electro-optical crystal 1401 such as KTN or KLTN has electrodes 1402 and 1403 formed on two opposing surfaces of the electro-optical crystal 1401, respectively. An incident beam 1405 to be incident on the electro-optical crystal 1401 passes through a cylindrical concave lens 1407 and is then incident on the electro-optical crystal 1401. The shape and driving condition of the electro-optical crystal 1401 are the same as those in Example 4.

In Example 5, the light condensing effect dependent on the angle of deflection expressed by the optical deflector is corrected by using a free surface mirror 1409 at the latter part of the electro-optical crystal 1401. The free surface mirror 1409 is a concave mirror having a radius of curvature in the direction of deflection varying in the direction of deflection, and the curvature of the mirror decreases from an electrode 1402 on the ground side of the optical deflector to an electrode 1403 on the control voltage source side. That is, regarding the curvature of the free surface mirror 1409, a radius of curvature of a surface irradiated with an outgoing beam in the case of the angle of deflection (voltage) with the focal position close to the outgoing surface of the electro-optical crystal 1401 among the deflected outgoing beams is small and a radius of curvature of a surface irradiated with an outgoing beam in the case of the angle of deflection (voltage) with the distant focal position is large.

Figure 24:
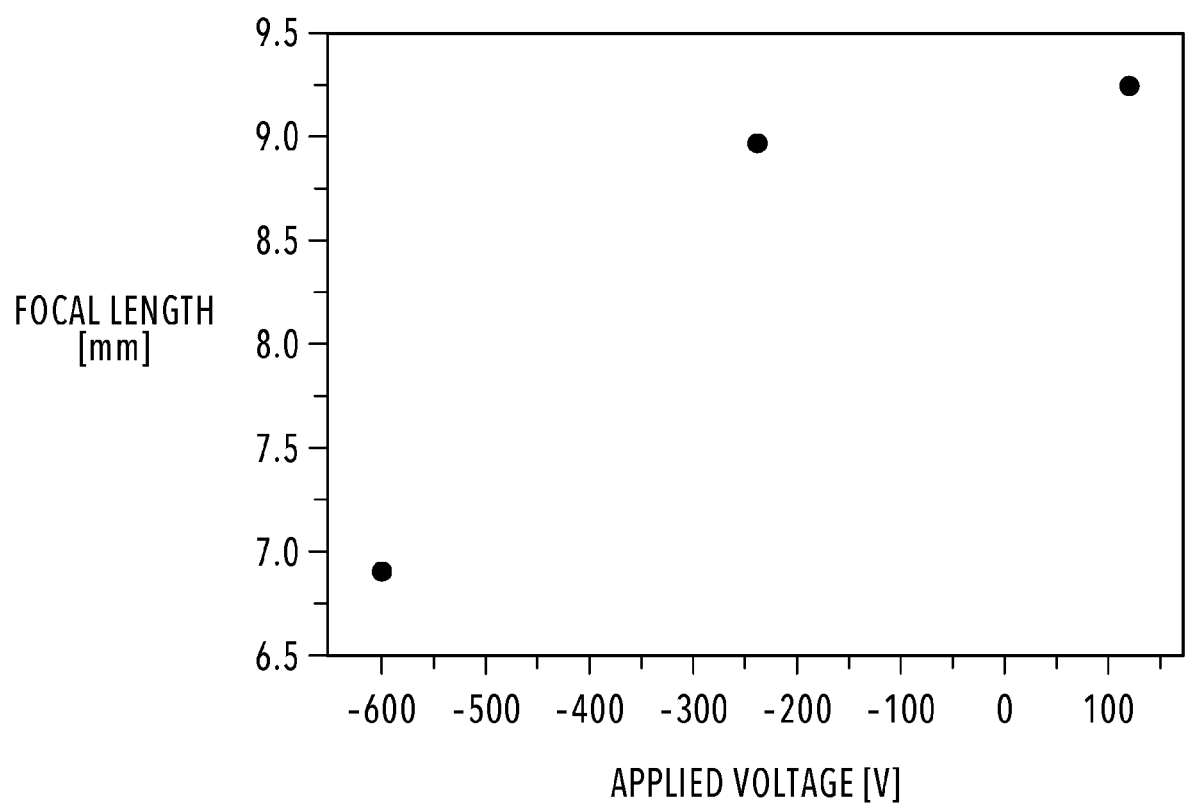
FIG. 24 is a diagram showing the dependence of a focal length on an applied voltage in Example 5.
Figure 25:
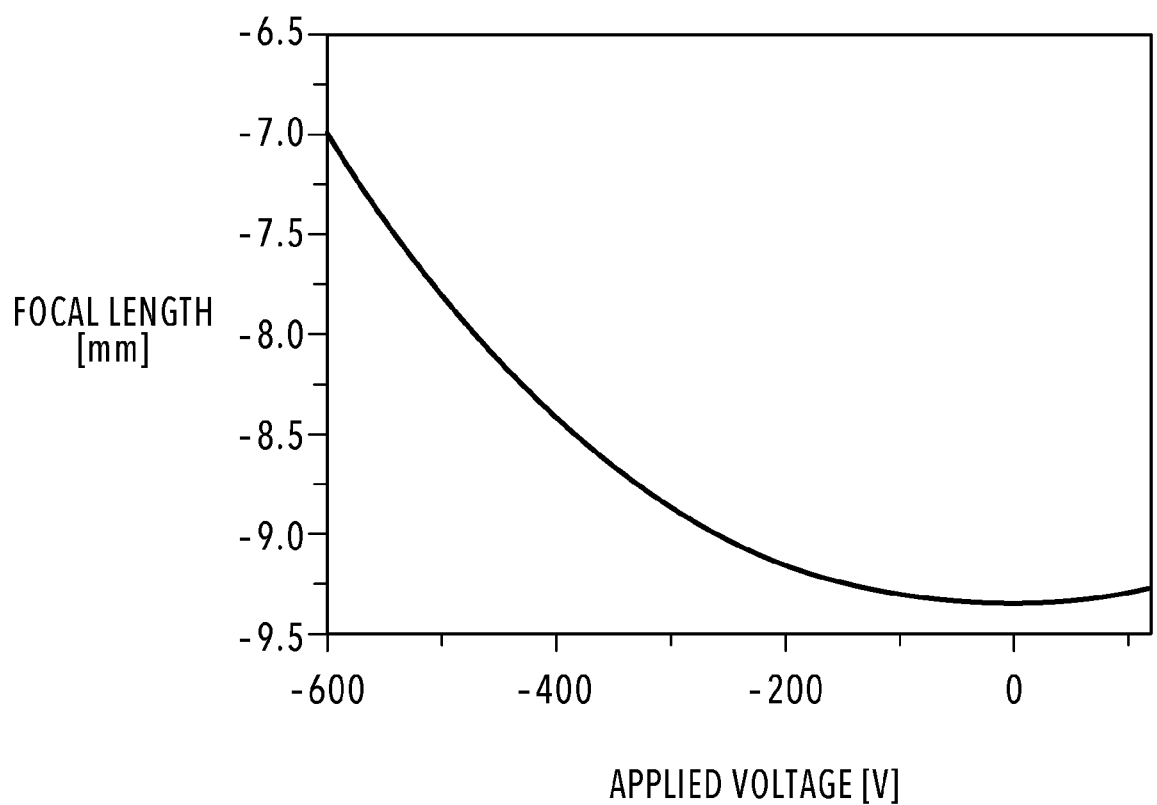
FIG. 25 is a diagram showing a relationship between a free surface mirror focal length and an applied voltage in Example 5.

FIG. 24 shows the dependence of a focal length of only the electro-optical crystal 1401 on an applied voltage in Example 5. FIG. 25 shows a relationship between the focal length of the free surface mirror and the applied voltage in Example 5. The curvature of a concave surface of the electro-optical crystal 1401 irradiated with an outgoing beam in the case of a voltage with a short focal length (a voltage when a focal position is close to the outgoing surface of the electro-optical crystal 1401) is decreased and the focal length of the free surface mirror is increased to compensate for variations in the focal length with respect to the applied voltage. On the other hand, the curvature of a concave surface irradiated with an outgoing beam in the case of a voltage with a long focal length (a voltage when a focal position is distant from the outgoing surface) is increased and the focal length of the free surface mirror is decreased to compensate for variations in the focal length with respect to the applied voltage. In this manner, the curvature of the free surface mirror 1409 is set so as to compensate for variations in the focal length with respect to the applied voltage.

When the focal length of the free surface mirror 1409 is expressed by f(x) as a positional function, a free surface is formed so that a distance from the focal position of a beam incident on the free surface mirror 1409 in each incident position to the free surface mirror 1409 is constantly f(x). Accordingly, a beam reflected on the free surface mirror 1409 is a parallel beam at any angle of deflection. Although the parallel beam is generated in Example 5, the parallel beam is not necessarily important. The essence of Example 5 is keeping a constant angle of diffusion of a beam at each moment within the range of deflection of the outgoing beam.

In Example 5, since a negative DC bias voltage is applied as the applied voltage from the control voltage source 1404 and a charge density in the electro-optical crystal 1401 increases near the electrode 403 on the control voltage source side, the relationship between the change in curvature of the free surface mirror 1409 and the electrodes is as described above. In the case of applying a positive DC bias voltage as the applied voltage, a charge density near the electrode 1402 on the ground side in the electro-optical crystal 1401 increases. Accordingly, the arrangement may be made so that the curvature of the free surface mirror 1409 decreases on the electrode 1402 side.

Example 6

Figure 26:
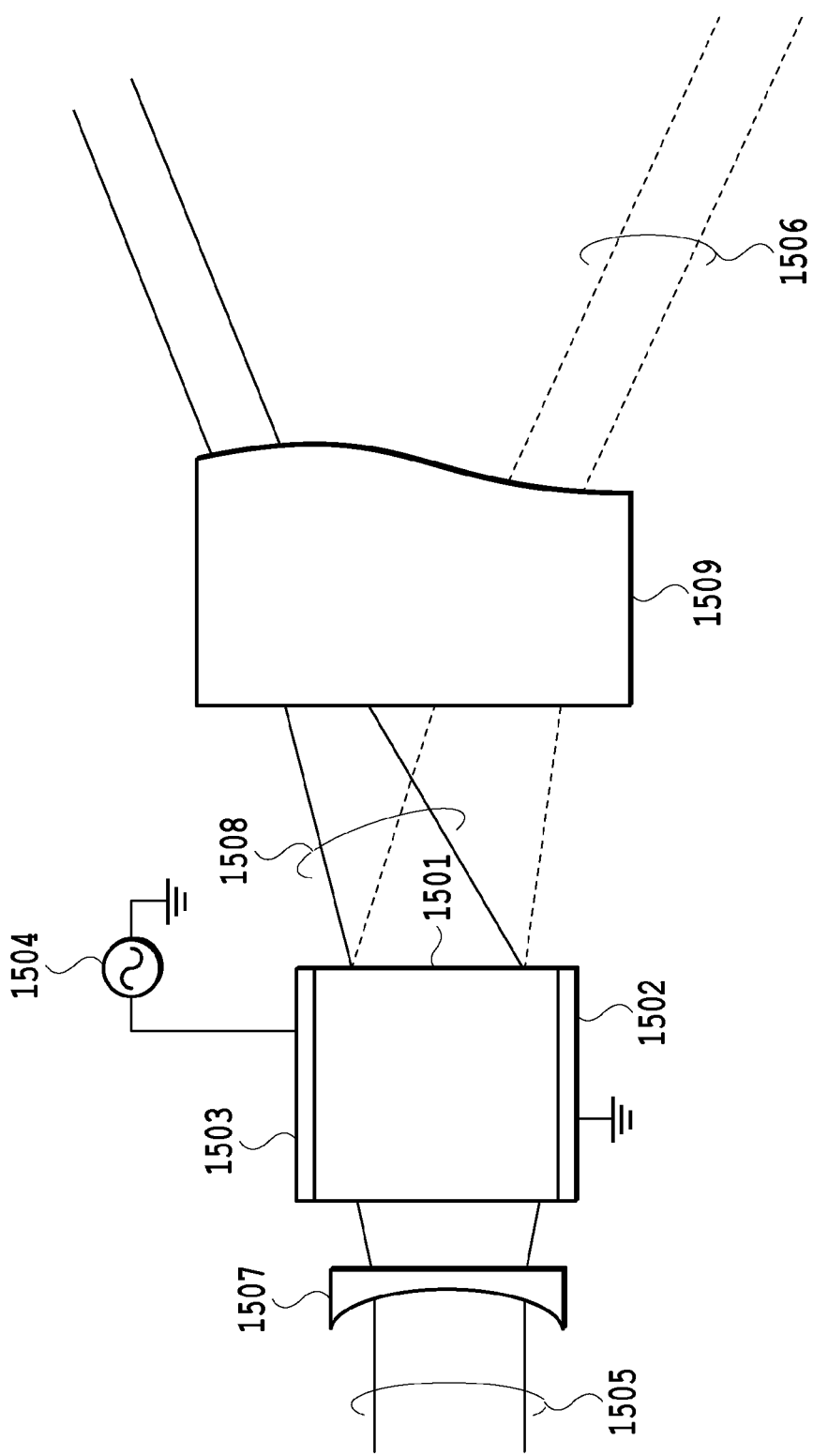
FIG. 26 is a diagram showing a configuration of an optical deflector suitable for a swept light source of Example 6.

FIG. 26 shows a configuration of an optical deflector suitable for the swept light source according to Example 6. The optical deflector comprising an electro-optical crystal 1501 such as KTN or KLTN has electrodes 1502 and 1503 formed on two opposing surfaces of the electro-optical crystal 1501, respectively. An incident beam 1505 to be incident on the electro-optical crystal 1501 passes through a cylindrical concave lens 1507 and is then incident on the electro-optical crystal 1501. The shape and driving condition of the electro-optical crystal 1501 are the same as those in Example 4.

In Example 6, the light condensing effect dependent on the angle of deflection expressed by the optical deflector is corrected by using an optical transmission element 1509 at the latter part of the electro-optical crystal 1501. The optical element 1509 is made from SF11 glass. A free surface is formed on an outgoing surface, the curvature of the outgoing surface changes according to the angle of deflection of an outgoing beam, and the light condensing characteristics are spatially distributed over the range of deflection of the outgoing beam.

Although the optical transmission element 1509 is used in Example 6, an optical element having a refractive index distribution may be used inside the element to produce the same light condensing effect. In this case, since the optical element has a shape with a planar surface, it is easy to shape the optical element. This optical element can provide light condensing characteristics with a spatially high resolution as compared with the optical element 1509 providing light condensing characteristics by the shape of the outgoing surface, by adjusting the internal refractive index distribution.

According to Example 5 and Example 6, the angle of diffusion of the beam can be kept constant within the range of deflection of an outgoing beam of the optical deflector by arranging an optical element such as a mirror with a free surface on the outgoing side of the electro-optical crystal. If this optical deflector is used as a spectroscope in combination with a dispersion element such as a diffraction grating, spectral characteristics of uniform resolution can be acquired without any degradation in resolution over the entire spectral range.

Example 7

Figure 27:
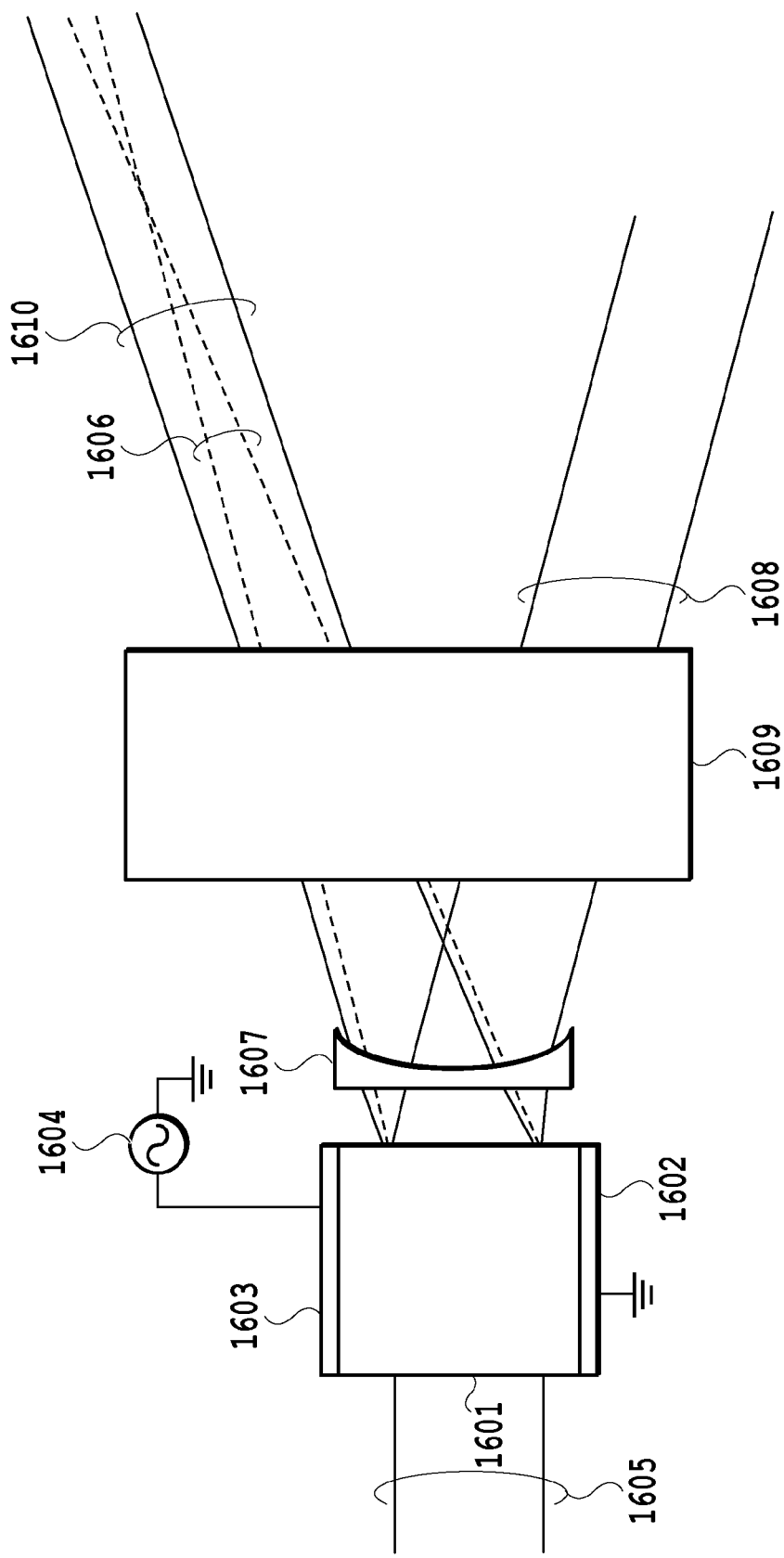
FIG. 27 is a diagram showing a configuration of an optical deflector suitable for a swept light source of Example 7.

FIG. 27 is a diagram showing a configuration of an optical deflector suitable for the swept light source according to Example 7. The optical deflector comprising an electro-optical crystal 1601 such as KTN or KLTN has electrodes 1602 and 1603 formed on two opposing surfaces of the electro-optical crystal 1601, respectively. A cylindrical concave lens 1607 is arranged on the outgoing side of the electro-optical crystal 1601 so that an outgoing beam 1608 is a parallel beam. That is, the focal length of the cylindrical concave lens 1607 is selected so that a beam in the case of an angle of deflection (a voltage when a focal position is distant from the outgoing surface of the electro-optical crystal 1601) with the long focal length within the range of deflection of the outgoing beam by the optical deflector is a parallel beam. The light condensing effect of a beam expressed by the optical deflector depends on the applied voltage and the angle of deflection corresponding to the applied voltage. Accordingly, although the light condensing characteristics of a beam are excellently counteracted at some angles of deflection, the light condensing characteristics cannot sufficiently be counteracted at other angles of deflection.

Therefore, a spatial phase modulator 1609 is further arranged on the outgoing side of the cylindrical concave lens 1607. The spatial phase modulator 1609 is an optical element configured to modulate a phase in each place independently in the cross section of a transmission beam or reflected beam. A beam deflected in the electro-optical crystal 1601 is incident on the spatial phase modulator 1609. In the spatial phase modulator 1609, a phase modulation amount is continuously controlled so as to largely delay a phase from the center to the periphery. The phase modulation amount is large on a surface irradiated with an outgoing beam in the case of an angle of deflection (voltage) with a focal position close to the outgoing surface of the electro-optical crystal 1601 among the deflected outgoing beams and is small on a surface irradiated with an outgoing beam in the case of an angle of deflection (voltage) with a distant focal position.

In this manner, the spatial phase modulator 1609 does not make a phase change in the outgoing beam 1610 at the angle of deflection made into a parallel beam by the cylindrical concave lens 1607 and provides a phase modulation of such a spatial distribution as to counteract the light condensing effect of the outgoing beam 1606 at the angle of deflection, the light condensing effect of which was not counteracted by the cylindrical concave lens 1607. The angle of diffusion of the beam can be kept constant over the entire range of deflection of the outgoing beam by extending the focal length of each outgoing beam according to the focal length before the spatial phase modulator 1609 is inserted.

As the spatial phase modulator, a holographic optical element or diffraction optical element having a spatial phase modulation distribution may be used.

Example 8

When a Gaussian beam is incident on an optical element having a lens effect, on the assumption that a position from the optical element of the beam waist on the incident side is s and a position of the beam waist on the outgoing side is s", the relationship of the following Self's formula is established.

$$\frac{1}{s + z_R^2/(s-f)} + \frac{1}{s''} = \frac{1}{f} \quad \text{Formula (11)}$$

Figure 28:
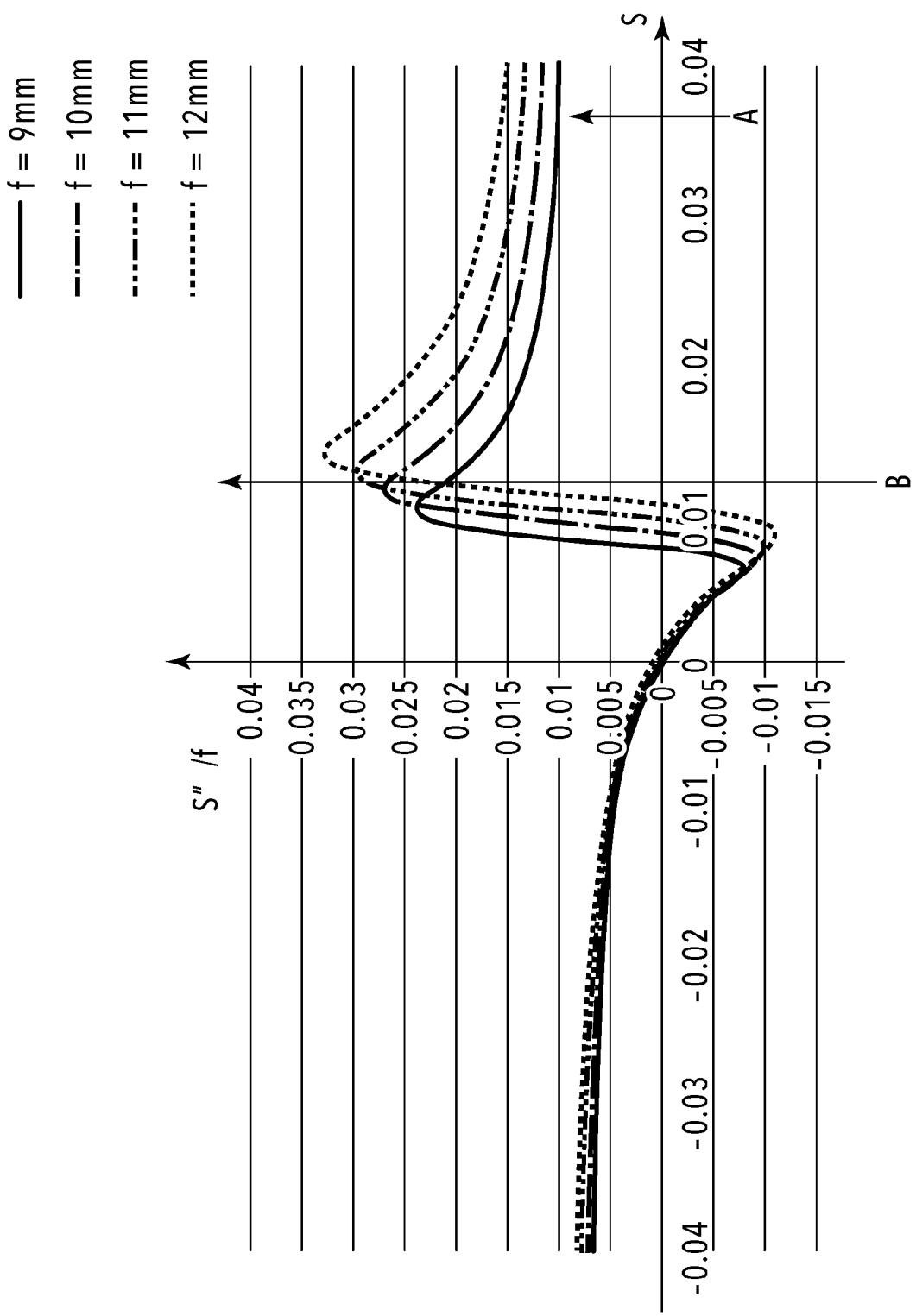
FIG. 28 is a diagram showing a relationship between a focal length of an optical element and a beam waist position at the time of incidence of a Gaussian beam.

$z_R$ is the Rayleigh length and f is the focal length of the optical element. FIG. 28 shows a result of calculating the relationship between s and s" when the focal length is changed by this formula.

In Example 4 to Example 7, an incident beam to the optical deflector (electro-optical crystal) is assumed to be a substantially parallel beam. The position of the beam waist on the incident side is distant from the optical deflector. At this time, as shown by arrow A in FIG. 28, the position of the beam waist on the outgoing side monotonously increases and decreases according to a lens power of the optical deflector (=the reciprocal of the focal length). However, since the position of the beam waist on the incident side of the optical deflector varies greatly, the incident side beam waist position does not necessarily increase and decrease monotonously in some cases as shown by arrow B in FIG. 28. In order to correct the lens power of the optical deflector in such cases, it is effective to determine the lens effect of the externally arranged optical element in consideration of the relationship of the Self's formula.

Further, not only the beam waist position but also the beam waist diameter changes depending on the angle of deflection and requires correction. According to the Self's formula, the ratio between the beam waist diameters of the incident beam and outgoing beam, that is, magnification m is expressed by the following formula.

$$m = \frac{w_0'}{w_0} = \frac{1}{\left[\left(\frac{s}{f} - 1\right)^2 + \left(\frac{z_R}{f}\right)^2\right]^{0.5}} \quad \text{Formula (12)}$$

Figure 29:
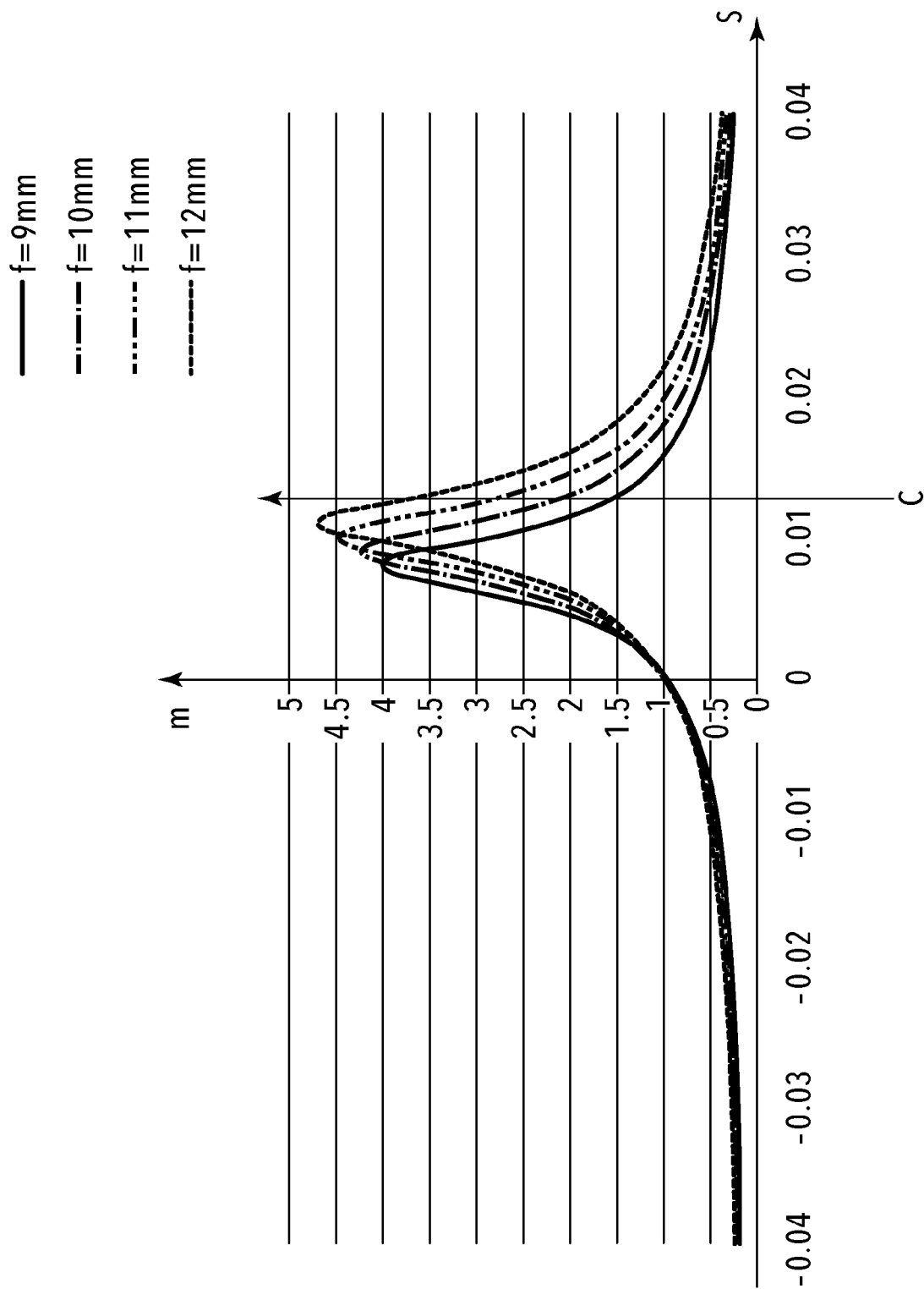
FIG. 29 is a diagram showing a relationship between a beam waist position and a beam diameter magnification at the time of a change in a focal length.

FIG. 29 shows a relationship between the beam waist position and the beam diameter magnification when the focal length is changed. As shown by arrow C in FIG. 29, the beam waist diameter changes together with the focal length. In this manner, the light condensing characteristics (focal length) of the optical deflector change according to the angle of deflection and the beam waist position and the beam waist diameter of the outgoing beam change according to the angle of deflection as described above. At this time, it is preferable that the characteristics of the optical element for compensation shown in Example 4 to Example 7 are also changed according to the angle of deflection so as to suppress variations in the beam waist position and the beam diameter.

A compensation method in the case where the beam waist position is on the outgoing side of the optical deflector will be described. Compensation can be provided in the same method even in the case where the beam waist position is on the incident side of the optical deflector.

For example, a case where the configuration is the same as that of the optical deflector in Example 4 (FIG. 21) and a prism is used as a compensation optical element will be described. When a beam passes through the prism, the optical path length becomes longer than that in air. Accordingly, a distance between the optical deflector and the beam waist position of the outgoing beam can be adjusted by the prism. That is, according to a change in the beam waist position by the angle of deflection, the optical path length in the prism may be set to be long when the beam waist position is distant from the optical deflector and set to be short when the beam waist position is close to the optical deflector.

When the beam waist position monotonously increases and decreases according to the angle of deflection, the vertex of the prism is arranged on the side of the angle of deflection with a close beam waist position so that the width of the prism is large in the case of the angle of deflection with a distant beam waist position and the width of the prism is small in the case of the angle of deflection with a close beam waist position. Since the magnification of the beam diameter changes according to the incident and outgoing angles with respect to the prism, it is possible to compensate for the beam waist diameter. It is also possible to compensate for the beam waist position and the beam waist diameter at the same time by suitably determining the vertex of the prism and the angle of incidence on the prism.

If the prism is further added to the configuration of Example 4 (FIG. 21), the optical path length and the magnification of the beam diameter can be set independently to some extent and accordingly the accuracy of compensation can be improved.

Next, a case where the configuration is the same as that of the optical deflector in Example 5 (FIG. 23) and a free surface mirror is used as a compensation optical element will be described. In the case of the free surface mirror, the beam waist position and the beam waist diameter of the outgoing beam can be changed by controlling the optical path length and the lens power until incidence on the mirror. The shape of the free surface mirror may be determined so as to compensate for a change in either the beam waist position or the beam waist diameter, or compensate for a change in both of them. For example, the focal length of the free surface mirror may be shortened for the angle of deflection with a beam waist position distant from the optical deflector and may be lengthened for the angle of deflection with a beam waist position close to the optical deflector.

Similarly, in the case of using a spatial phase modulator or a medium having a refractive index distribution, the beam waist position and the beam waist diameter of the outgoing beam can be adjusted and a change according to the angle of deflection can be suppressed by changing the phase modulation amount and the refractive index distribution according to the angle of deflection.

If the free surface mirror is further added to the configuration of Example 5 (FIG. 23), the optical path length and the beam waist diameter can be set independently to some extent and accordingly the accuracy of compensation can be improved.

Similarly, in the case where the beam waist position is on the incident side, the optical element having spatially distributed optical characteristics may be arranged on the incident side of the optical deflector and compensation may be provided according to a distance between the beam waist position and the optical deflector.

According to Example 8, variations in either or both of the beam waist position and the beam waist diameter of the outgoing beam can be suppressed within the range of deflection of the outgoing beam of the optical deflector. Further, a compensation optical system can be optimized according to the beam waist position and the beam waist diameter of the incident beam. If the optical deflector is used as a spectroscope in combination with a dispersion element such as a diffraction grating, spectral characteristics of uniform resolution can be acquired without any degradation in resolution over the entire spectral range.

Although the optical deflector using KTN or KLTN has been described in Example 4 to Example 8, the optical deflector may use other crystals having the electro-optic effect. The optical deflectors from Example 4 to Example 8 can be suitably used for each of the swept light sources of the first embodiment and the second embodiment.

As described above in detail with various embodiments and examples, the present invention can provide the swept light source capable of keeping the coherence length long over the entire wide sweep wavelength range, thereby improving the image quality of the SS-OCT device.

INDUSTRIAL APPLICABILITY

The present invention can be generally used for an imaging apparatus, and can be particularly used as a swept light source of an SS-OCT device.

The invention claimed is:

1. A swept light source configured to output a beam having a continuously changing lasing wavelength, the swept light source comprising:
   a laser resonator including
   a gain medium configured to amplify a beam,
   means for changing a lasing wavelength, and
   means for changing an optical gain of the gain medium;
   wavelength control means configured to control the means for changing a lasing wavelength by using a wavelength control signal and sweep the lasing wavelength; and
   optical gain control means configured to set the means for changing an optical gain so that the optical gain in the laser resonator has an optical gain value slightly higher than an optical gain in a state of a lasing threshold over an entire wavelength range of a wavelength sweep and to control the means for changing an optical gain by using an optical gain control signal based on optical gain control data including a plurality of time points from a start of a sweep and optical gains at which a coherence length of a wavelength sweat beam becomes the longest at each of the time points;
   a memory associated with the optical gain control means and storing the optical gain control data; and
   a processor operatively coupled to the memory,
   wherein the processor is configured to obtain the optical gain control data by controlling the means for changing an optical gain at a set optical gain value by using the optical gain control signal of a constant value over a wavelength sweep period, measuring a coherence length at each of the time points from the start of the sweep for each of the set optical gain values of different values and generating a data set including the set optical gain value, one of the time points, and the corresponding measured coherence length, selecting a set optical gain value providing a maximum coherence length from among the measured coherence lengths at the one of the time points, and generating the optical gain control data from the plurality of time points and corresponding selected set optical gain values.

2. The swept light source according to claim 1, wherein the optical gain control data includes the coherence length which is obtained by generating a plurality of interference signals corresponding to respective different interference conditions, for a wavelength swept beam output from the laser resonator set at the set optical gain value, from one wavelength sweep in the wavelength sweep period, from the wavelength swept beam on the different interference conditions, and calculating the coherence length based on the interference signals corresponding to the respective interference conditions.

3. The swept light source according to claim 1, wherein the means for changing an optical gain of the gain medium is a semiconductor optical amplifier (SOA), the optical gain control signal is an SOA current for driving the SOA, and the optical gain control data is SOA current waveform data indicating an SOA current selected for each of the time points.

4. The swept light source according to claim 1, wherein the means for changing a lasing wavelength includes:

a diffraction grating;

a mirror on which a laser beam from the diffraction grating is incident and the incident laser beam is perpendicularly reflected; and an optical deflector configured to change an angle of incidence of the laser beam on the diffraction grating.

* * * * *